US011342325B2

(12) United States Patent
Chou et al.

(10) Patent No.: US 11,342,325 B2
(45) Date of Patent: May 24, 2022

(54) INTEGRATION OF MULTIPLE FIN STRUCTURES ON A SINGLE SUBSTRATE

(71) Applicant: Taiwan Semiconductor Manufacturing Co., Ltd., Hsin-Chu (TW)

(72) Inventors: Chih-Chao Chou, Hsinchu (TW); Chih-Hao Wang, Baoshan Township (TW); Shi Ning Ju, Hsinchu (TW); Kuo-Cheng Chiang, Zhubei (TW); Wen-Ting Lan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/823,581

(22) Filed: Mar. 19, 2020

(65) Prior Publication Data

US 2021/0296312 A1 Sep. 23, 2021

(51) Int. Cl.

| | |
|---|---|
| ***H01L 27/088*** | (2006.01) |
| ***H01L 21/8234*** | (2006.01) |
| ***H01L 29/66*** | (2006.01) |
| ***H01L 29/06*** | (2006.01) |
| ***H01L 29/423*** | (2006.01) |

(52) U.S. Cl.
CPC .. *H01L 27/0886* (2013.01); *H01L 21/823431* (2013.01); *H01L 29/0665* (2013.01); *H01L 29/42392* (2013.01); *H01L 29/66545* (2013.01)

(58) Field of Classification Search
CPC ................................................ H01L 29/42392
See application file for complete search history.

(56) References Cited

U.S. PATENT DOCUMENTS

| | | | | |
|---|---|---|---|---|
| 10,332,803 B1 * | 6/2019 | Xie | ..................... | H01L 27/0924 |
| 2019/0355724 A1 * | 11/2019 | Chiang | ................. | H01L 21/324 |

* cited by examiner

*Primary Examiner* — Yu-Hsi D Sun
(74) *Attorney, Agent, or Firm* — Eschweiler & Potashnik, LLC

(57) ABSTRACT

Various embodiments of the present disclosure are directed towards an integrated chip (IC) including a first fin structure and a second fin structure vertically extending from a semiconductor substrate, respectively. The first fin structure laterally extends along a first direction and has a first width. The second fin structure laterally extends along the first direction and has a second width that is less than the first width. A first plurality of nanostructures directly overlies the first fin structure and is vertically spaced from the first fin structure by a non-zero distance. A gate electrode continuously laterally extends along a second direction that is substantially perpendicular to the first direction. The gate electrode directly overlies the first and second fin structures, and wraps around the nanostructures.

20 Claims, 38 Drawing Sheets

600b

INTEGRATION OF MULTIPLE FIN STRUCTURES ON A SINGLE SUBSTRATE

BACKGROUND

The integrated circuit (IC) manufacturing industry has experienced exponential growth over the last few decades. As ICs have evolved, sizes of semiconductor devices (e.g., an area of a complementary metal-oxide-semiconductor (CMOS) inverter) have been scaled down by, for example, reducing minimum feature sizes and/or reducing spacing between components of the semiconductor devices, which has increased device density (e.g., a number of semiconductor devices integrated in a given area). However, as the sizes of semiconductor devices continue to be scaled down, it is becoming increase difficult to improve device performance of the semiconductors devices (e.g., increase switching speed, reduce current imbalance, reduce read/write times, etc.) without negatively affecting the device density. Thus, advancements in the IC manufacturing industry that improve the device performance of the semiconductors devices without negatively impacting device density are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7 through 28A-28B illustrate a series of various views of some embodiments of a first method for forming an IC comprising a plurality of fin structures having different widths, where the fin structures are disposed laterally adjacent to one another on a same substrate.

DETAILED DESCRIPTION

Figure 1:
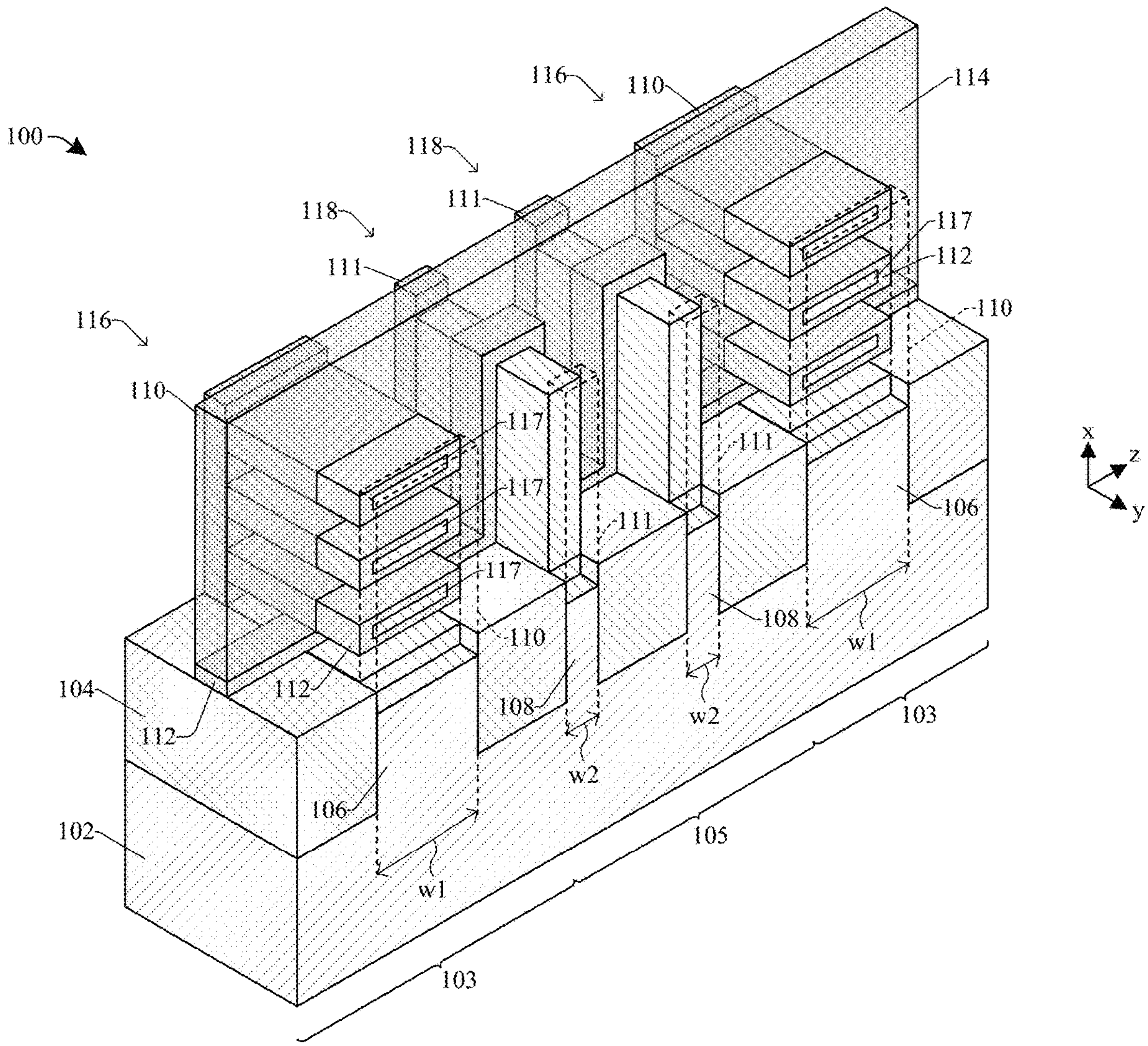
FIG. 1 illustrates an isometric view of some embodiments of an integrated chip (IC) having a first fin structure laterally adjacent to a second fin structure on a same substrate, where the first fin structure has a greater width than the second fin structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A fin field effect transistor (finFET) device may comprise a fin over a substrate, wherein a gate electrode overlies the fin. The gate electrode may directly overlie a selectively conductive channel of the fin, and the selectively conductive channel may be laterally between a source region and a drain region on the fin. A threshold voltage is a voltage that is applied to the gate electrode that turns the finFET device "ON," in some embodiments, such that mobile charge carriers flow through the selectively conductive channel of the fin from the source region to the drain region.

In some embodiments, a plurality of fins may be defined within a substrate extending along a first direction. The plurality of fins are parallel to one another. Further, a plurality of gate electrodes overlie the plurality of fins and extend along a second direction orthogonal to the first direction. The plurality of gate electrodes are parallel to one another. A finFET device may be defined at the intersection of each fin and gate electrode, such that there are a plurality of finFET devices disposed on the substrate. Each finFET device has source/drain regions defined within and/or on a corresponding fin along opposing sides of an overlying gate electrode, and a selectively conductive channel is defined within the corresponding fin laterally between the source/drain regions. Due to fabrication limitations, each fin will have substantially similar design parameters (e.g., similar widths) such that the finFET devices disposed along the single substrate may be designed for a single application and/or function. This may decrease a design complexity of the finFETs overlying the single substrate. However, this results in design limitations, performance tradeoffs, and/or an inability to integrate two or more different field effect transistor devices optimized for different applications on a single substrate.

Accordingly, various embodiments of the present disclosure provide an integrated chip (IC) having a plurality of finFET devices disposed laterally adjacent to a plurality of nanosheet field effect transistor (NSFET) devices. The finFET devices comprise fins defined within a substrate and the NSFET devices comprise nanostructures defined over the substrate, where the nanostructures each have a width different from the fins. The fins may extend along a first direction in parallel with one another. Additionally, a plurality of gate electrodes overlie the plurality of fins and overlie/warp around each of the nanostructures. Further, the gate electrodes extend along a second direction that is orthogonal to the first direction. Thus, the finFET devices are defined at intersections between the gate electrodes and the fins, and the NSFET devices are defined at intersections between the gate electrodes and the nanostructures.

By virtue of the different widths of the fins and the nanostructures, the finFET devices are designed for optimal performance of a first application while the NSFET devices are designed for optimal performance of a second application. For example, the first finFET devices may be designed as a pull-up transistor for a static random access memory (SRAM) device, while the NSFET devices may be designed as an access transistor for an SRAM device. Because the width of the nanostructures are larger than the widths of the fins, the NSFET devices may be configured to operate with higher currents than the finFET devices. Thus, the fins and the nanostructures may be formed in such a manner to maximize performance of finFET and NSFET devices for the first and second applications, respectively while minimizing an area of the substrate the fins and the nanostructures occupy. This, in part, increases a number of different semiconductor devices that may be formed over a single substrate, and increases design flexibility and performance of the semiconductor devices disposed on the substrate.

FIG. 1 illustrates an isometric view of some embodiments of an integrated chip (IC) 100 having a first fin structure laterally adjacent to a second fin structure on a same substrate, where the first fin structure has a greater width than the second fin structure.

As shown in FIG. 1, the IC 100 includes a semiconductor substrate 102. In some embodiments, the semiconductor substrate 102 may, for example, be or comprise any type of semiconductor body, such as monocrystalline silicon, CMOS bulk, silicon-germanium (SiGe), silicon carbide, or another suitable semiconductor material. In some embodiments, the semiconductor substrate 102 comprises a first doping type (e.g., p-type). The semiconductor substrate 102 comprises a center device region 105 and a peripheral device region 103, where the peripheral device region 103 is disposed on opposing sides of the center device region 105. Further, the semiconductor substrate 102 comprises a plurality of first fin structures 106 disposed within the peripheral device region 103, and a plurality of second fin structures 108 disposed within the center device region 105.

Each of the first and second fin structures 106, 108 extend in parallel with one another in a first direction (e.g., along the "y" direction). In some embodiments, the first and second fin structures 106, 108 are referred to as fins of the semiconductor substrate 102, respectively. The first and second fin structures 106, 108 are laterally spaced from one another along a second direction (e.g., along the "z" direction). In some embodiments, the first direction is orthogonal to the second direction. Each of the first and second fin structures 106, 108 comprise at least a portion of an upper region of the semiconductor substrate 102, respectively. The upper region of the semiconductor substrate 102 extends vertically from a lower region of the semiconductor substrate 102 along a third direction (e.g., along the "x" direction). For example, a first fin structure 106 comprises a first portion of the upper region of the semiconductor substrate 102 that extends vertically from the lower region of the semiconductor substrate 102, and a second fin structure 108 comprises a second portion of the upper region of the semiconductor substrate 102 that extends vertically from the lower region of the semiconductor substrate 102. Further, the upper region of the semiconductor substrate 102 extends continuously through an isolation structures 104. The isolation structure 104 is configured to electrically isolate the first and second fin structures 106, 108 from one another. In some embodiments, the isolation structure 104 may, for example, be or comprise silicon dioxide, silicon nitride, an oxy-nitride, some other dielectric material, or any combination of the foregoing. The first and/or second fin structures 106, 108 may, for example, respectively be or comprise silicon, germanium, silicon-germanium, some other semiconductor material, or any combination of the foregoing. In some embodiments, the first and/or second fin structures 106, 108 may be referred to as semiconductor fins.

A plurality of nanostructures 117 are respectively disposed over the first fin structures 106. The nanostructures 117 are vertically stacked over one another (in the "x" direction). Further, in some embodiments, the nanostructures 117 may be vertically spaced from a corresponding underlying first fin structure 106 by a non-zero distance. In some embodiments, the plurality of nanostructures 117 comprise between two and twenty nano structures. For example, the plurality of nanostructures 117 overlying a corresponding first fin structure 106 comprises three nanostructures. The plurality of nanostructures 117 may, for example, respectively be or comprise silicon, germanium, silicon-germanium, some other semiconductor material, or a combination of the foregoing. In further embodiments, the nanostructures 117 may be referred to as semiconductor nanostructures. In yet further embodiments, the nanostructures 117 may each comprise a same material as the semiconductor substrate 102.

Pairs of first source/drain regions 110 are disposed on/over the plurality of first fin structures 106. The first source/drain regions 110 are laterally spaced (in the "y" direction). For example, a pair of the first source/drain regions 110 may be disposed on opposite sides of a corresponding plurality of nanostructures 117, such that the corresponding plurality of nanostructures 117 continuously laterally extend between the pair of first source/drain regions 110. The first source/drain regions 110 may, for example, be or comprise silicon germanium, silicon-germanium, silicon carbide, some other semiconductor material, or any combination of the foregoing and/or may comprise a second doping type (e.g., n-type) opposite the first doping type (e.g., p-type). In further embodiments, the first source/drain regions 110 may, for example, be or comprise an epitaxial semiconductor material (e.g., a semiconductor material formed by an epitaxy, such as epitaxial silicon, epitaxial germanium, epitaxial silicon-germanium, epitaxial silicon carbide, etc.).

A first plurality of selectively-conductive channels (not shown) are disposed within the plurality of nanostructures 117. The first plurality of selectively-conductive channels each extend (in the "y" direction) between each pair of first source/drain regions 110. In some embodiments, each nanostructure 117 comprises a selectively-conductive channel extending between a corresponding pair of first source/drain regions 110.

Pairs of second source/drain regions 111 are disposed on/over the plurality of second fin structures 108. The second source/drain regions 111 are laterally spaced (in the "y" direction). The second source/drain regions 111 may, for example, be or comprise silicon germanium, silicon-germanium, silicon carbide, some other semiconductor material, or any combination of the foregoing and/or may comprise the second doping type (e.g., n-type) opposite the first doping type (e.g., p-type). In further embodiments, the second source/drain regions 111 may, for example, be or comprise an epitaxial semiconductor material (e.g., a semiconductor material formed by an epitaxy, such as epitaxial silicon, epitaxial germanium, epitaxial silicon-germanium, epitaxial silicon carbide, etc.).

A second plurality of selectively-conductive channels (not shown) are disposed within the second fin structures 108. The second plurality of selectively-conductive channels each extend (in the "y" direction) between each pair of second source/drain regions 111.

A gate electrode 114 overlies the first and second fin structures 106, 108 along the second direction (e.g., along the "z" direction). A gate dielectric layer 112 extends along the second direction (e.g., along the "z" direction) and is disposed between the gate electrode 114 and the first fin structures 106, the second fin structures 108, and the nanostructures 117. In further embodiments, the gate dielectric layer 112 continuously wraps around each of the nanostructures 117, such that the gate dielectric layer 112 continuously wraps around an outer perimeter of each nanostructure 117.

A plurality of nanosheet field effect transistors (NSFETs) 116 are defined at intersections between the gate electrode 114 and the first fin structures 106. In some embodiments, the NSFETs 116 respectively comprise a corresponding pair of first source/drain regions 110, segment(s) of the gate dielectric layer 112, a segment of the gate electrode 114, and a stack of nanostructures 117 overlying a corresponding first fin structure 106. In yet further embodiments, the NSFETs 116 are disposed within the peripheral device region 103 of the semiconductor substrate 102. In some embodiments, application of a suitable threshold voltage to the gate electrode 114 may result in the formation of a selectively-conductive channel (not shown) within each nanostructure 117 laterally between a corresponding pair of first source/drain regions 110. Upon application of the suitable threshold voltage, charge carrier (e.g., electrons) may travel through the selectively-conductive channels between the pair of first source/drain regions 110.

Further, it will be appreciated that in some instances, each NSFETs 116 may be also known as and/or referred to as, for example, a gate-all-around FET (GAAFET), a gate-surrounding FET, a multi-bridge channel FET (MBCFET), a nanowire FET, a nanoring FET, or the like.

A plurality of fin field effect transistors (finFETs) 118 are defined at intersections between the gate electrode 114 and the second fin structures 108. In some embodiments, the finFETs 118 comprise a pair of second source/drain regions 111, a segment of a second fin structure 108, a segment of the gate dielectric layer 112, and a segment of the gate electrode 114, respectively. In yet further embodiments, the finFETs 118 are disposed within the center device region 105 of the semiconductor substrate 102. Thus, in some embodiments, the finFETs 118 are spaced laterally between the NSFETs 116. In further embodiments, application of a suitable threshold voltage to the gate electrode 114 may result in the formation of a selectively-conductive channel (not shown) within the second fin structure 108 laterally between the second source/drain regions 111. Upon application of the suitable threshold voltage, charge carrier (e.g., electrons) may travel through the selectively-conductive channel between the second source/drain regions 111.

The first fin structures 106 each comprise a first width w1, and the second fin structures 108 each comprise a second width w2 that is different from the first width w1. In further embodiments, each nanostructure 117 may comprise the first width w1. In some embodiments, the first width w1 is greater than the second width w2. In other embodiments, a width of each nanostructure 117 may be less than the first width w1 and greater than the second width w2. Because the first width w1 is greater than the second width w2, the NSFETs 116 may be configured to operate at higher currents than the finFETs 118. Thus, the first fin structures 106 may be configured for optimal performance of a first application and the second fin structures 108 may be configured for optimal performance of a second application, while minimizing an area of the semiconductor substrate 102 that the NSFETs 116 and the finFETs 118 occupy. In some embodiments, the first application may, for example, include acting as an access transistor for a static random access memory (SRAM) device, and the second application may, for example, include acting as a pull-up transistor for an SRAM device. In such embodiments, the first application may require operating at higher currents than the second application. This, in part, increases a performance of the NSFETs 116 and the finFETs 118 while increasing a number of semiconductor devices (e.g., NSFETs, finFETs, etc.) that may be disposed within and/or over the semiconductor substrate 102.

In addition, during a method for forming the IC 100, the NSFETs 116 and the finFETs 118 may be formed concurrently with one another, where a first masking layer is utilized to define the first fin structures 106 (and/or the nanostructures 117) and a second masking layer is utilized to define the second fin structures 108. The first masking layer is configured such that the first fin structures 106 each comprise the first width w1, and the second masking layer is configured such that the second fin structures 108 each comprise the second width w2 different from the first width w1. By forming the NSFETs 116 and the finFETs 118 concurrently with one another, time and cost associated with forming the IC 100 may be reduced. Additionally, by utilizing the first and second masking layers, the NSFETs 116 and the finFETs 118 may be configured to meet different design parameters. This, in part, increases a design flexibility and performance of the IC 100.

Figure 2A:
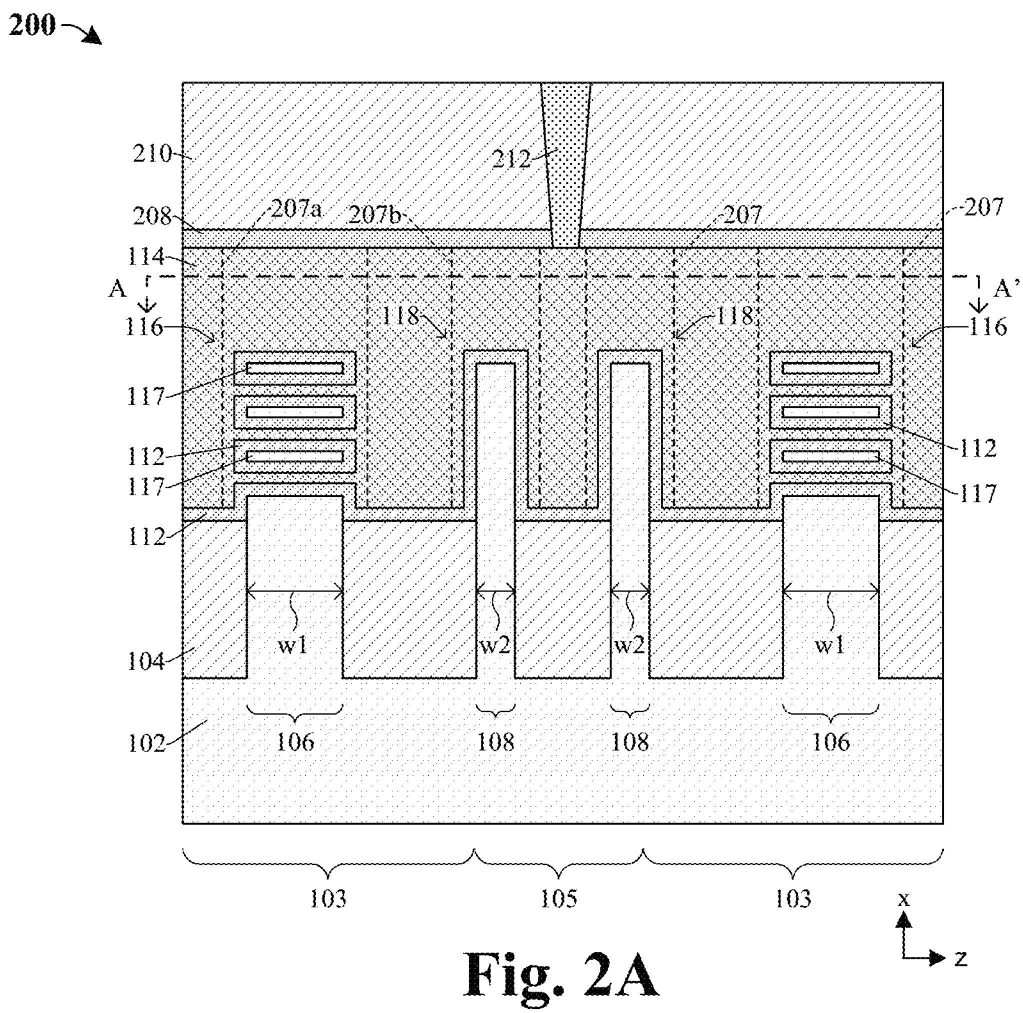
FIGS. 2A-2D illustrate various views of some embodiments of an IC according to alternative embodiments of the IC of FIG. 1.
Figure 2B:
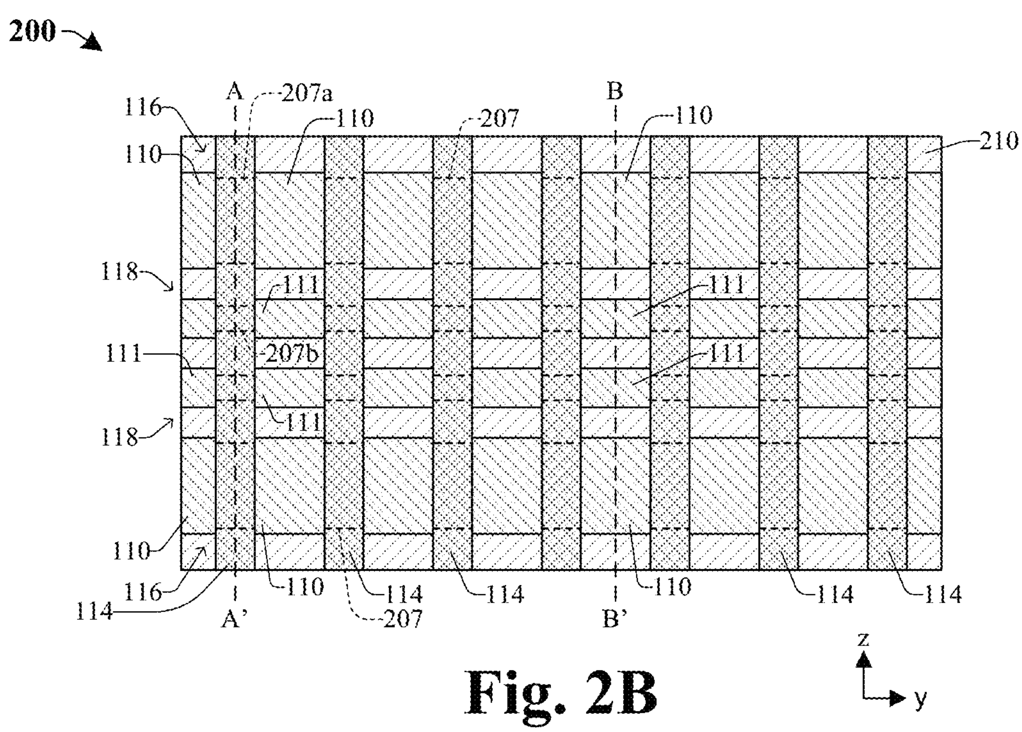
Figure 2C:
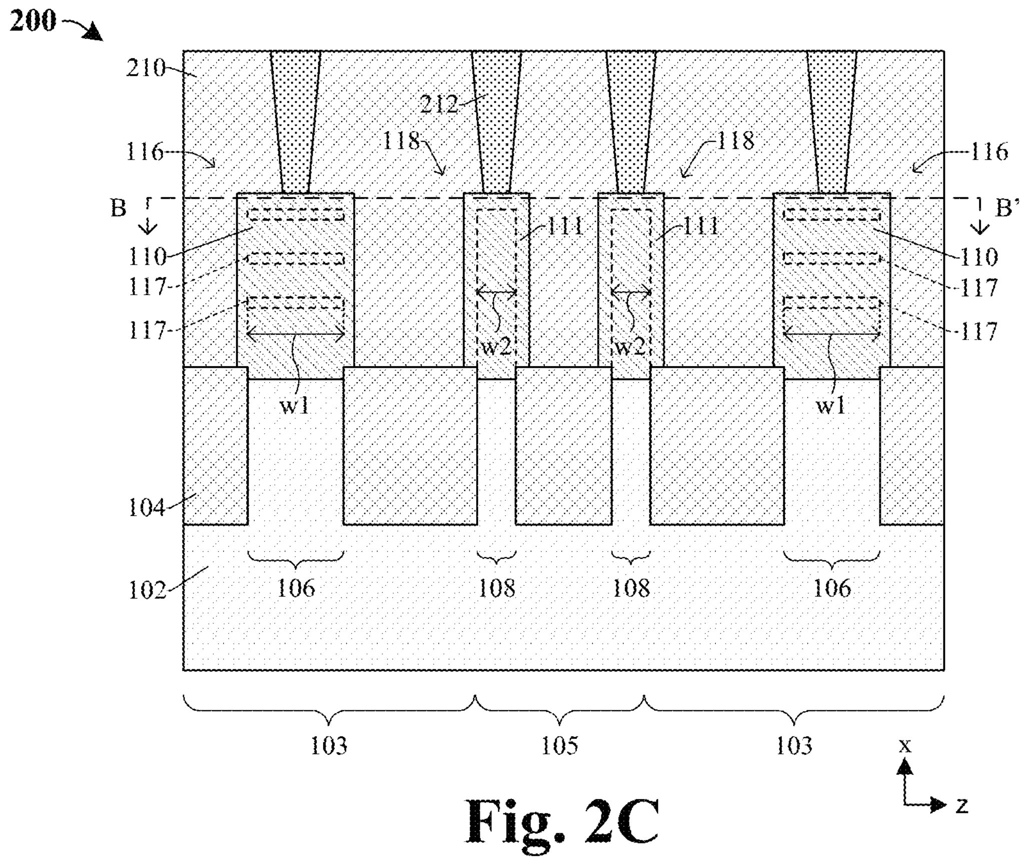
Figure 2D:
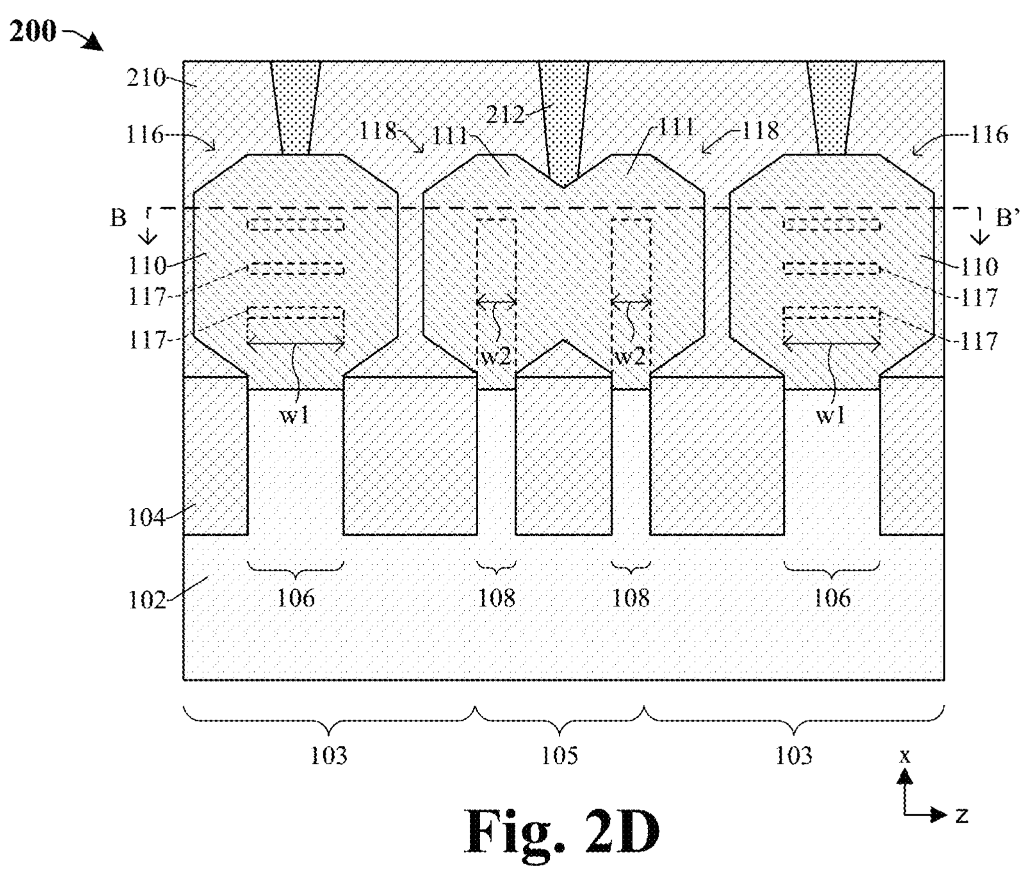

FIGS. 2A-2D illustrate various views of some embodiments of an IC 200 having a first fin structure laterally adjacent to a second fin structure on a same substrate, where the first fin structure has a greater width than the second fin structure. FIGS. 2A, 2C, and 2D illustrate cross-sectional views of some embodiments of the IC 200. FIG. 2B illustrates a top view of some embodiments of the IC 200 of FIG. 2A taken along the line A-A' of FIG. 2A. FIG. 2A illustrates a cross-sectional view of some embodiments of the IC 200 taken along the line A-A' of FIG. 2B. FIGS. 2C and 2D illustrate cross-sectional views of various embodiments of the IC 200 taken along the line B-B' of FIG. 2B.

An isolation structure 104 is disposed over the semiconductor substrate 102 and is spaced laterally between the first and second fin structures 106, 108. The isolation structure 104 is configured to electrically isolate the first fin structures 106 and the second fin structures 108 from one another. In some embodiments, the isolation structure 104 may be configured as a shallow trench isolation (STI) structure, a deep trench isolation (DTI) structure, or another suitable isolation structure. In further embodiments, the isolation structure 104 may, for example, be or comprise silicon dioxide, silicon nitride, silicon carbide, silicon oxy-nitride, silicon oxy-carbide, another suitable dielectric material, or any combination of the foregoing. In further embodiments, the isolation structure 104 may be a multi-layer structure, for example, comprising one or more liner layers. The first and second fin structures 106, 108 continuously laterally extend in parallel with one another along a first direction (e.g., along the "y" direction, see FIG. 2B). In further embodiments, a plurality of nanostructures 117 vertically overlies each of the second fin structures 108.

A gate electrode 114 continuously laterally extends along the first and second fin structures 106, 108, the nanostructures 117, and the isolation structure 104. In some embodiments, the gate electrode 114 may be a part of a plurality of gate electrodes 114 that each extend continuously over the semiconductor substrate 102 (e.g., see the top view of FIG. 2B). A plurality of NSFETs 116 are defined at intersections between the gate electrodes 114 and the first fin structures 106, and a plurality of finFETs 118 are defined at intersections between the gate electrodes 114 and the second fin structures 108. The plurality of gate electrodes 114 are each a continuous structure that are disposed between the first source/drain regions 110 and the second source/drain regions 111 of the NSFETs 116 and the finFETs 118. Further, the plurality of gate electrodes 114 extend along a second direction (e.g., along the "z" direction) that is substantially orthogonal to the first direction. Gate dielectric layers 112 are disposed between the gate electrodes 114 and the first structures 106, the second fin structures 108, and the nanostructures 117. Furthermore, the gate dielectric layers 112 are disposed between the gate electrodes 114 and the isolation structure 104.

In further embodiments, the gate dielectric layer 112 may, for example, be or comprise an oxide, such as silicon dioxide, a high-k dielectric material (e.g., a dielectric material with a dielectric constant greater than 3.9), some other suitable dielectric material, or any combination of the foregoing. The gate dielectric layer 112 may, for example, be a multi-layered structure comprising one or more interfacial layers. In yet further embodiments, the gate electrodes 114 may, for example, respectively be or comprise polysilicon, a metal (e.g., tungsten), some other suitable conductive material, or any combination of the foregoing. For example, the gate electrodes may comprise a work function metal layer and a metal fill layer.

The gate electrodes 114 and the gate dielectric layers 112 comprise a plurality of gate structures 207 that overlie a corresponding selectively-conductive channel (not shown) of each of the NSFETs 116 and the finFETs 118. For example, the selectively-conductive channel of each NSFET 116 is disposed laterally between a pair of the first source/drain regions 110, and the selectively-conductive channel of each finFETs 118 is disposed laterally between a pair of the second source/drain regions 111. In some embodiments, the selectively-conductive channel of the NSFETs 116 and the finFETs 118 comprise undoped regions of the semiconductor substrate 102 and/or the nanostructures 117. Further, as illustrated in the cross-sectional view of FIG. 2A, each of the nanostructures 117 may have a rectangular-like shaped profile. However, other shapes are amendable, for example, the nanostructures 117 may each have an ellipse-like shaped profile, a square-like shaped profile, a stadium-like shaped (e.g., geometric stadium shape) profile, a hexagonal-like shaped profile, a circle-like shaped profile, or another suitable shape.

Each of the gate structures 207 comprise a portion of the gate dielectric layer 112, which may be referred to as a gate dielectric structure, and a portion of the gate electrode 114, which may be referred to as a gate electrode structure. Each of the gate structures 207 disposed along a gate electrode 114 may be electrically coupled together by portions of the gate electrode 114 disposed between each of the gate structures 207. The gate structures 207 are configured to control a conductivity of the selectively-conductive channel (e.g., switch between one or more conducting states and a non-conducting state) of a fin structure and/or nanostructure disposed between each pair of source/drain regions. In some embodiments, the gate structures 207 include a first gate structure 207*a* and a second gate structure 207*b*. For example, a first gate structure 207*a* is configured to control the conductivity of a first selectively-conductive channel(s) of one of the NSFETs 116. In another example, a second gate structure 207*b* is configured to control the conductivity of a second selectively-conductive channel of one of the finFETs 118.

An etch stop layer 208 is disposed along an upper surface of the gate electrodes 114. In some embodiments, the etch stop layer 208 may, for example, be or comprise silicon nitride, silicon carbide, or another suitable dielectric material. Further, an inter-level dielectric (ILD) layer 210 overlies the etch stop layer 208. In further embodiments, the ILD layer 210 may, for example, be or comprise a low-k dielectric material (e.g., a dielectric material having a dielectric constant less than about 3.9), an extreme low-k dielectric material, an oxide, such as silicon dioxide, another suitable dielectric material, or any combination of the foregoing. A conductive via 212 is disposed within the ILD layer 210 and the etch stop layer 208. The conductive via 212 is electrically coupled to the gate electrode 114 and may be configured to facilitate application of a suitable bias voltage to the gate structures 207 of the NSFETs 116 and the finFETs 118. In further embodiments, the conductive via 212 may, for example, be or comprise copper, aluminum, titanium nitride, tantalum nitride, tungsten, another suitable conductive material, or any combination of the foregoing.

In some embodiments, because the first fin structures 106 and/or the nanostructures 117 respectively comprise the first width w1, and the second fin structures 108 comprise the second width w2, the NSFETs 116 may be optimized for a first application while the finFETs 118 are optimized for a second application. A width of the fin structure (and/or nanostructure) may correspond to a maximum current that may travel through the selectively-conductive channel within the fin structure. As the width of the fin structure increases, the maximum current that may travel through the selectively-conductive channel of the fin structure, without damage to the fin structure, increases. In some embodiments, because the first width w1 is greater than the second width w2, the NSFETs 116 are configured to conduct a higher current than the finFETs 118. In such embodiments, the first application of the NSFETs 116 may operate at higher currents than the second application of the finFETs 118. Further, the location and/or dimensions of the first fin structures 106, the second fin structures 108, and/or the nanostructures 117 may be configured to minimize an area of the semiconductor substrate 102 they occupy, respectively. This, in part, increases a number of different fin structures that may be formed over and/or on the semiconductor substrate 102, and increases design flexibility and performance of the different fin structures disposed over and/or on the semiconductor substrate 102.

As illustrated in the top view of FIG. 2B, the first source/drain regions 110 are over and/or on the first fin structures 106 and are spaced laterally between the plurality of gate electrodes 114. Further, the second source/drain regions 111 are disposed over and/or on the second fin structures 108 and are spaced laterally between the plurality of gate electrodes 114.

FIG. 2C illustrates a cross-sectional view of some embodiments of the IC 200 taken along the line B-B' of FIG. 2B. As illustrated in the cross-sectional view of FIG. 2C, the first and second source/drain regions 110, 111 may each have a rectangular-shaped profile. Further, an upper surface of the first and second source/drain regions 110, 111 may be disposed above a top surface of the nanostructures 117 and/or above a top surface of the second fin structures 108. In further embodiments, a width of the first source/drain regions 110 may be greater than the first width w1 of the first fin structures 106 and/or the nanostructures 117, and a width of the second source/drain regions 111 may be greater than the second width w2 of the second fin structures 108.

FIG. 2D illustrates a cross-sectional view of some alternative embodiments of the IC 200 taken along the line B-B' of FIG. 2B. As illustrated in the cross-sectional view of FIG. 2D, the first source/drain regions 110 may each have a hexagon-like shaped profile. In other embodiments, the first source/drain regions 110 each have a diamond-like shaped profile. Further, the second source/drain regions 111 may each have a hexagon-like shaped profile. In other embodiments, the second source/drain regions 111 may each have a diamond-like shaped profile. Further, adjacent second source/drain regions 111 may directly contact one another, such that adjacent finFETs 118 may share one or more common source/drain regions.

Figure 3A:
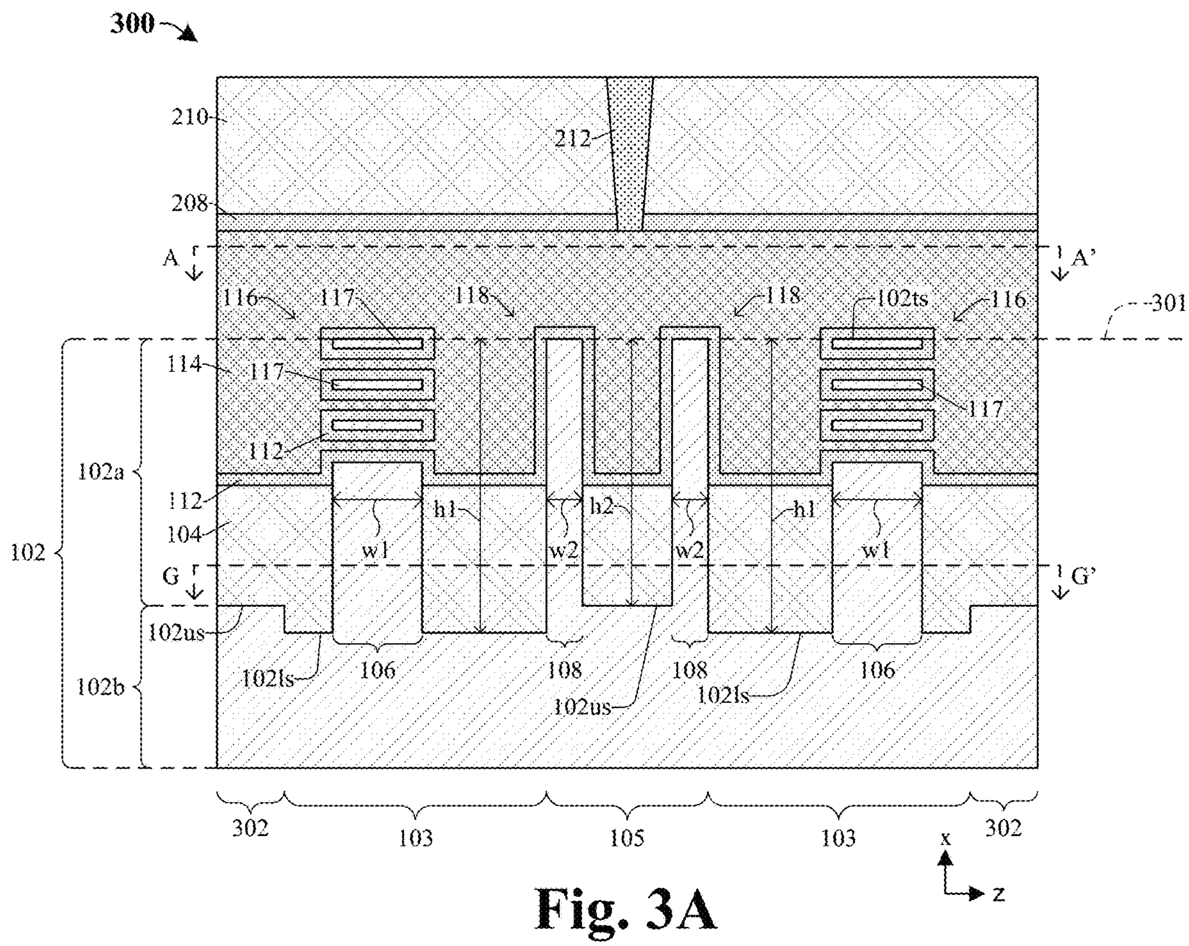
FIGS. 3A-3D illustrate various views of some embodiments of an IC according to alternative embodiments of the IC of FIGS. 2A-2D.
Figure 3B:
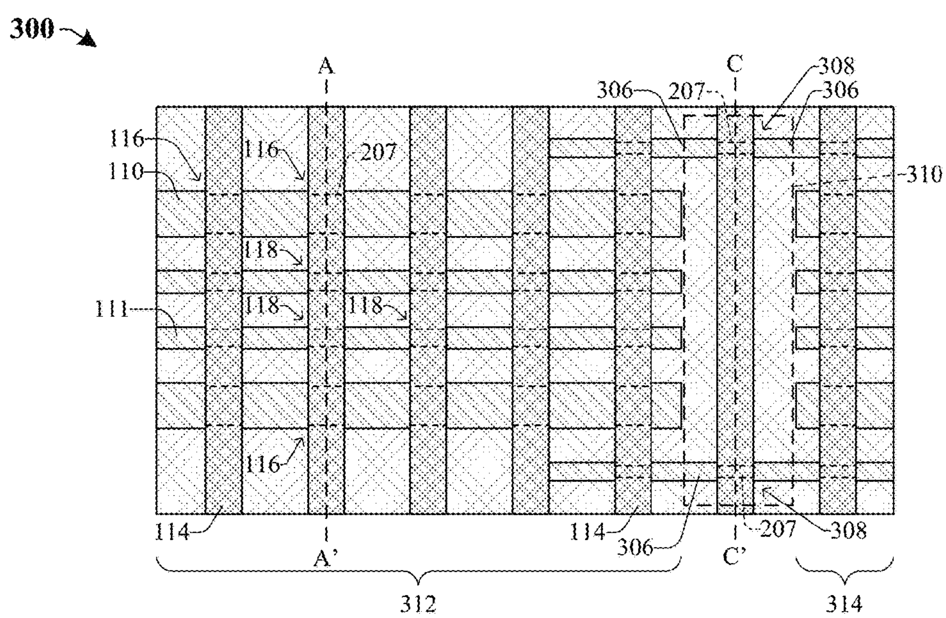
Figure 3C:
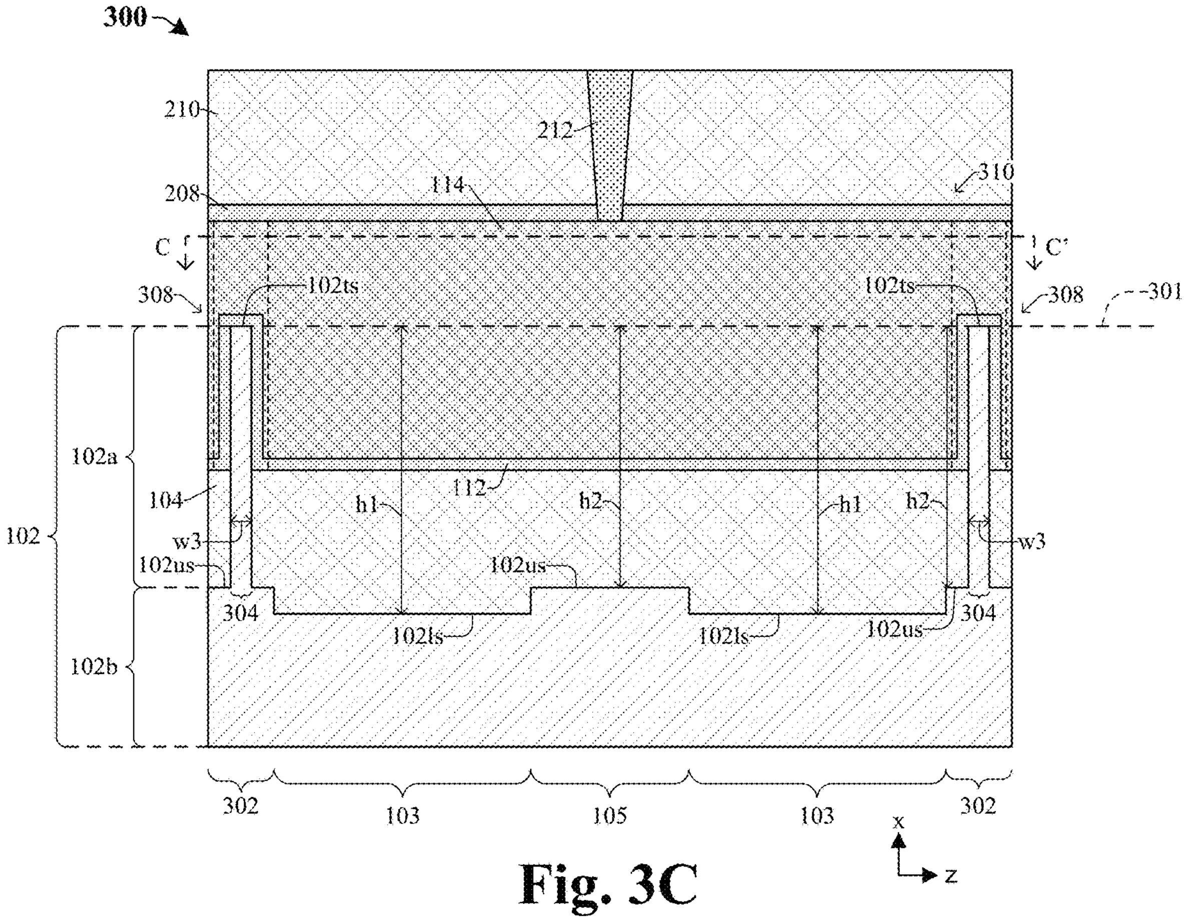

FIGS. 3A-3D illustrate various views of some embodiments of an IC 300 corresponding to some alternative embodiments of the IC 200 of FIGS. 2A-2D. FIGS. 3A and 3C illustrate cross-sectional views of the IC 300, and FIG. 3B illustrates a top view of the IC 300. FIG. 3A illustrates a cross-sectional view of some embodiments of the IC 300 taken along the line A-A' of FIG. 3B. FIG. 3C illustrates a cross-sectional view of some embodiments of the IC 300 taken along the line C-C' of FIG. 3B. In some embodiments, FIG. 3A illustrates a cross-sectional view of some alternative embodiments of the IC 200 of FIG. 2A. In further embodiments, FIG. 3B illustrates a top view of some alternative embodiments of the IC 200 of FIG. 2B.

The semiconductor substrate 102 comprises a top region 102*a* that vertically extends from a bottom region 102*b*. Further, the semiconductor substrate 102 has an upper surface 102*us* that is disposed above a lower surface 1021*s*. In some embodiments, the upper surface 102*us* defines a topmost surface of the bottom region 102*b* of the semiconductor substrate 102. The first fin structures 106 extend continuously from the lower surface 1021*s* of the semiconductor substrate 102 to a first point disposed above the upper surface 102*us* of the semiconductor substrate 102. In some embodiments, the lower surface 1021*s* of the semiconductor substrate 102 contacts outer sidewalls of the first fin structures 106, respectively. In some embodiments, a top surface 102*ts* of the semiconductor substrate 102 defines a topmost surface of the top region 102*a* of the semiconductor substrate 102. In some embodiments, the top surface 102*ts* of the semiconductor substrate 102 is aligned with a substantially straight line 301. Further, top surfaces of the second fin structures 106 are aligned with the substantially straight line 301, respectively. In addition, in some embodiments, a top surface of each topmost nanostructure 117 overlying a corresponding first fin structure 106 is aligned with the substantially straight line 301.

In some embodiments, the upper surface 102*us* of the semiconductor substrate 102 within the center device region 105 contacts at least a sidewall of each of the second fin structures 108. Further, the center device region 105 and the peripheral device regions 103 are spaced laterally between outermost device regions 302. In further embodiments, the upper surface 102*us* of the semiconductor substrate 102 disposed laterally within the outermost device regions 302 is vertically aligned with the upper surface 102*us* of the semiconductor substrate 102 disposed laterally within the center device region 105.

A first height h1 of each of the NSFETs 116 is defined between the substantially straight line 301 and the lower surface 1021*s* of the semiconductor substrate 102. A second height h2 of each of the finFETs 118 is defined between the substantially straight line 301 and the upper surface 102*us* of the semiconductor substrate 102. In some embodiments, the first height h1 is greater than the second height h2. In some embodiments, a difference between the first height h1 and the second height h2 (e.g., h1–h2) may be within a range of about 5 to 30 nanometers. In some embodiments, if the difference between the first height h1 and the second height h2 is relatively high (e.g., greater than about 30 nanometers), then a height of the first fin structures 106 and/or the nanostructures 117 may too small, thereby impeding formation of a selectively-conductive channel in the first fin structures 106 and/or the nanostructures 117. In further embodiments, during fabrication of the IC 300, one or more masking layers may be disposed over the semiconductor substrate 102 while utilizing one or more etch processes to define the first fin structures 106 (and/or nanostructures 117) and the second fin structures 108. For example, the first fin structures 106 (and/or nanostructures 117) and the second fin structures 108 may be defined by a single etch process according to a first masking layer and a second masking layer, such that the first fin structures 106 (and/or nanostructures 117) and the second fin structures 108 are formed concurrently. The first masking layer overlies the first fin structures 106, and the second masking layer overlies the second fin structures 108. In some embodiments, the first masking layer comprises a first material (e.g., amorphous silicon), the second masking layer comprises a second material (e.g., silicon nitride) different from the first material, and a width of the first masking layer is greater than a width of the second masking layer. Due to the difference in widths of the first and second masking layers and/or the difference in materials of the first and second masking layers the peripheral device regions 103 of the semiconductor substrate 102 will be etched more quickly than the center device region 105 and/or the outermost device regions 302 of the semiconductor substrate 102. This, in part, causes the lower surface 1021*s* of the semiconductor substrate 102 to be disposed below the upper surface 102*us* of the semiconductor substrate 102 such that the first height h1 is greater than the second height h2.

As illustrated in the top view of FIG. 3B and the cross-sectional view of FIG. 3C, the first and second fin structures 106, 108 are spaced laterally between a plurality of third fin structures 304. A plurality of third source/drain regions 306 are disposed within and/or on each of the third fin structures 304 on opposing sides of an overlying gate electrode 114. In some embodiments, the third source/drain regions 306 comprise the second doping type (e.g., n-type). Further, a selectively-conductive channel is defined within each of the third fin structures 304 and is spaced laterally between the third source/drain regions 306. The third fin structures 304 respectively have a third width w3 and comprise a single segment of the top region 102*a* of the semiconductor substrate 102 that comprises the first semiconductor material (e.g., silicon). A plurality of second finFETs 308 are defined at intersections between the third fin structures 304 and the gate electrodes 114. In further embodiments, the third width w3 is less than the second width w2 of the second fin structures 108, such that the finFETs 118 are configured for a higher current during operation than the second finFETs 308. In yet further embodiments, the second finFETs 308 are configured for a same application as the finFETs 118 (e.g., as a pull-up transistor for an SRAM device). In other embodiments, the second width w2 is equal to the third width w3.

Further, in some embodiments, the first and second fin structures 106, 108 are each laterally offset from an isolation region 310 by a non-zero distance. Thus, the first and second fin structures 106, 108 may extend continuously in the first direction (e.g., along the "y" direction) across a first region 312 and may extend continuously in the first direction across a second region 314. In such embodiments, the first region 312 is on a first side of the isolation region 310 and the second region 314 is disposed on a second side of the isolation region 310, such that the first and second fin structures 106, 108 are discontinuous across the isolation region 310. This improves isolation between the NSFETs 116 and the finFETs 118 disposed laterally within the first region 312 and the NSFETs 116 and the finFETs 118 disposed laterally within the second region 314, thereby increasing a performance of the IC 300. In further embodiments, the third fin structures 304 extend continuously in the first direction from the first region 312 to the second region 314, such that the third fin structures 304 are not discontinuous across the isolation region 310. At least one of the gate electrodes 114 extends continuously in the second direction (e.g., along the "z" direction) across the isolation region 310.

As illustrated in the cross-sectional view of FIG. 3C, an upper surface of the 102*us* of the semiconductor substrate 102 within the isolation region 310 is vertically disposed above a lower surface 1021*s* of the semiconductor substrate 102 within the isolation region 310. Further, within the isolation region 310, the first height h1 is defined between the substantially straight line 301 and the lower surface 1021*s* of the semiconductor substrate 102, and the second height h2 is defined between the substantially straight line 301 and the upper surface 102*us* of the semiconductor substrate 102. In some embodiments, the first height h1 is greater than the second height h2. In further embodiments, within the isolation region 310, a difference between the first height h1 and the second height h2 (e.g., h1−h2) may be within a range of about 5 to 30 nanometers.

Figure 3D:
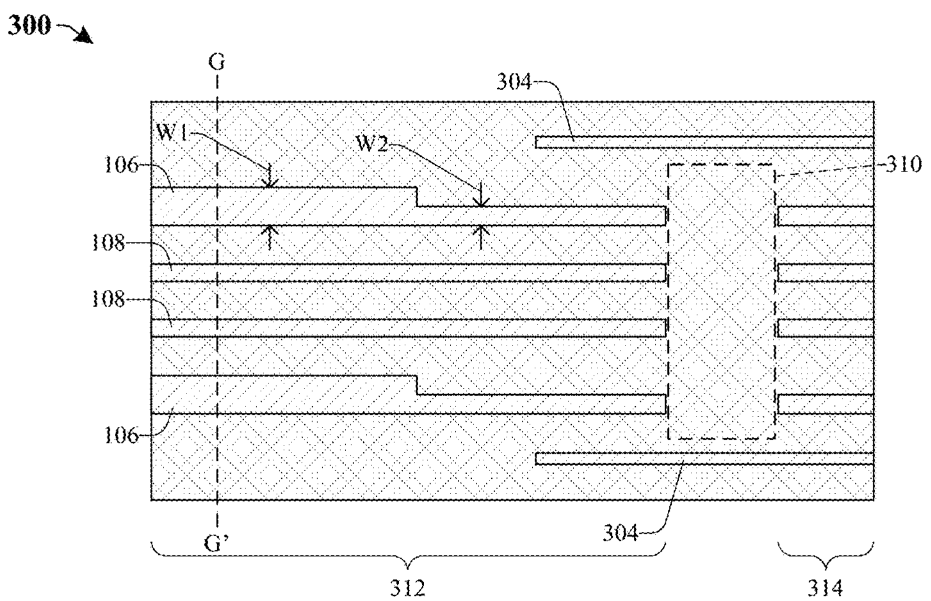

FIG. 3D illustrates a top view of some alternative embodiments of the IC 300 taken along the line G-G' of FIG. 3A. As illustrated in FIG. 3D, a width of each of the first fin structures 106 may discretely decrease. For example, the first fin structures 106 may each have a first width W1 and a second width W2 that is less than the first width W1. Further, nanostructures (117 of FIG. 3A) may have a same layout as the first fin structures 106, such that a width of each nanostructure (117 of FIG. 3A) may discretely decrease (not shown). Further, a width of each of the second and/or third fin structures 108, 304 may discretely decrease (not shown).

Figure 4A:
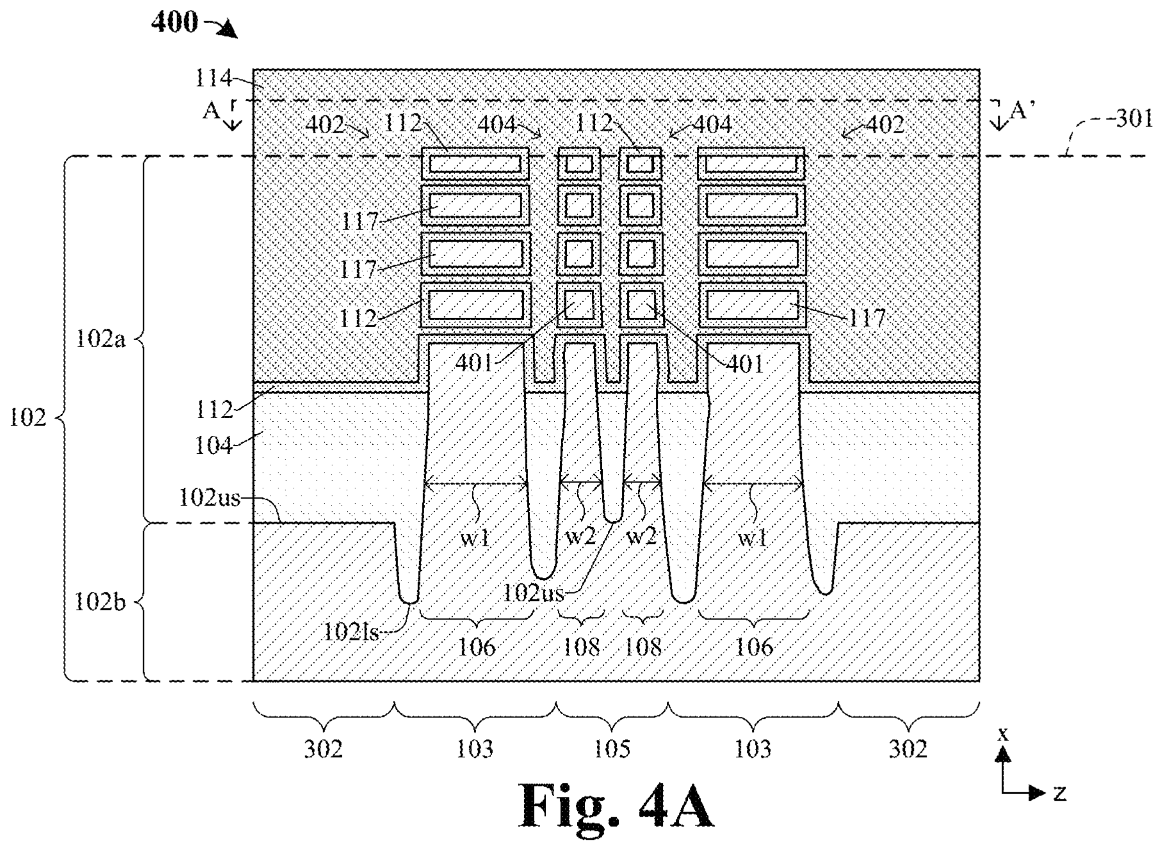
FIGS. 4A-4B illustrate cross-sectional views of some embodiments of an IC according alternative embodiments of the IC of FIGS. 3A-3D.
Figure 4B:
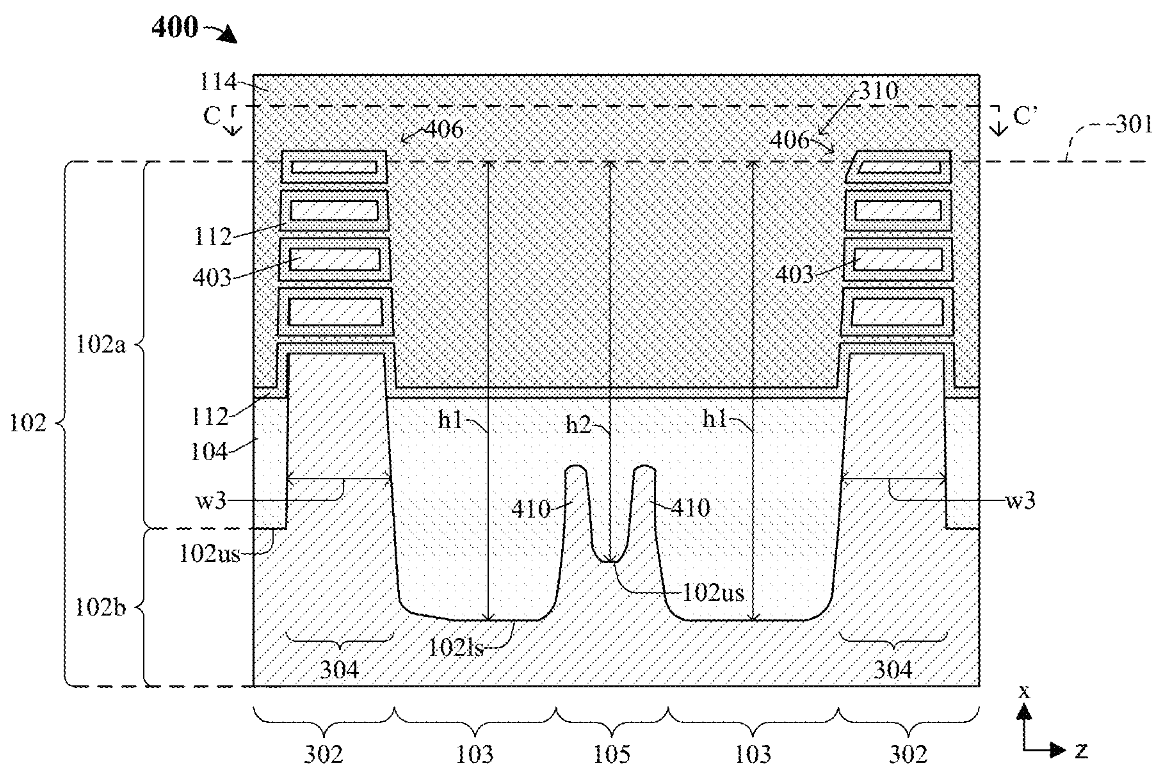

FIGS. 4A-4B illustrate various cross-sectional views of some embodiments of an IC 400 corresponding to some alternative embodiments of the IC 300 of FIGS. 3A-3C. FIG. 4A illustrates a cross-sectional view of some other embodiments of the IC of FIG. 3B taken along the line A-A'. FIG. 4B illustrates a cross-sectional view of some other embodiments of the IC of FIG. 3B taken along the line C-C'.

As illustrated in the cross-sectional views of FIGS. 4A and 4B, a plurality of first nanostructures 117 directly overlie each of the first fin structures 106, a plurality of second nanostructures 401 directly overlie each of the second fin structures 108, and a plurality of third nanostructures 403 directly overlie each of the third fin structures 304. Thus, a plurality of first NSFETs 402 are defined between intersections of the gate electrode 114 and the first fin structures 106, a plurality of second NSFETs 404 are defined between intersections of the gate electrode 114 and the second fin structures 108, and a plurality of third NSFETs 406 are defined between intersections of the gate electrode 114 and the third fin structures 304. The first NSFETs 402 are disposed laterally within the peripheral device region 103, the second NSFETs 404 are disposed laterally within the center device region 105, and the third NSFETs 406 are disposed laterally within the outermost device region 302.

In further embodiments, a first width w1 of the first fin structures 106 and the first nanostructures 117 is greater than a second width w2 of the second fin structures 108 and the second nanostructures 401. In some embodiments, the first width w1 of the first fin structures 106 and the first nanostructures 117 continuously increases from the substantially straight line 301 to the lower surface 1021*s* of the semiconductor substrate 102. In yet further embodiments, the second width w2 of the second fin structures 108 and the second nanostructures 401 continuously increases from the substantially straight line 301 to the upper surface 102*us* of the semiconductor substrate 102. In various embodiments, the upper surface 102*us* and the lower surface 1021*s* of the semiconductor substrate 102 may respectively be curved, concave, and/or U-shaped.

In yet further embodiments, a third width w3 of the third fin structures 304 and the third nanostructures 403 may continuously increase from the substantially straight line 301 to the upper surface 102*us* of the semiconductor substrate 102. In other embodiments, the third width w3 of the third fin structures 304 may be greater than the first width w1 and/or the second width w2. A plurality of protrusions 410 may be disposed within the isolation region 310 and may be spaced laterally between the third fin structures 304. The protrusions 410 are segments of the semiconductor substrate 102 that directly underlie the gate electrode 114. In further embodiments, during fabrication of the IC 400, the protrusions 410 may be remnants of the second fin structures 108 that remain in the center device region 105 after performing an etch process to define the isolation region 310.

Figure 5A:
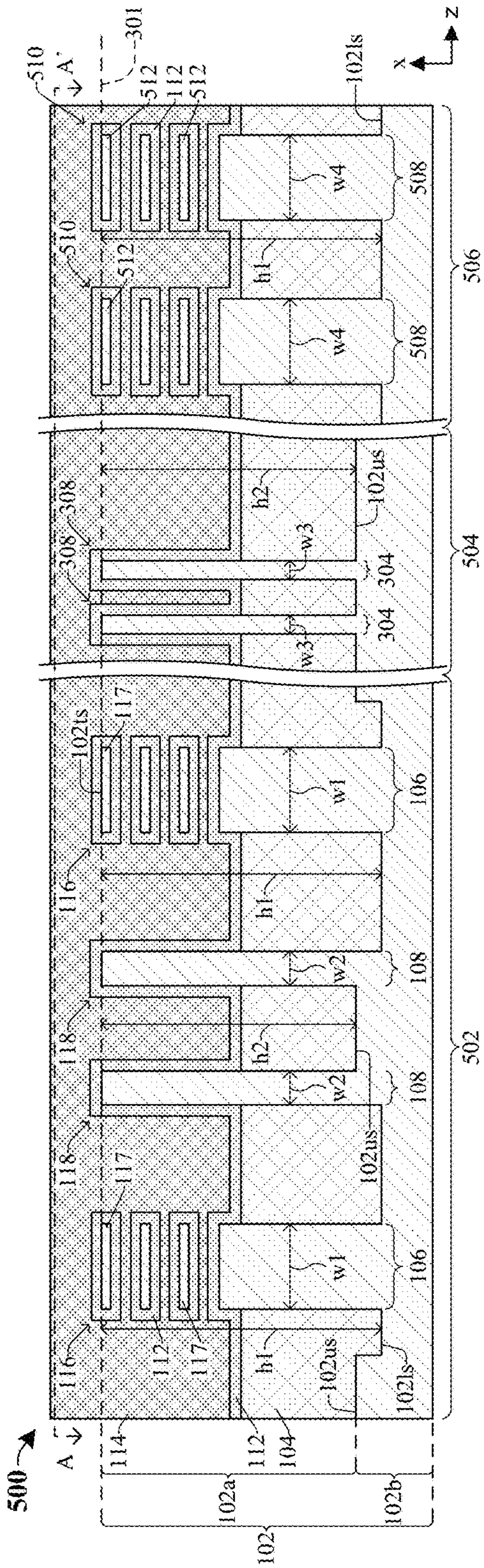
FIGS. 5A-5C illustrate various views of some embodiments of an IC comprising a plurality of fin structures having different widths and/or layers disposed laterally adjacent to one another on a same substrate.
Figure 5B:
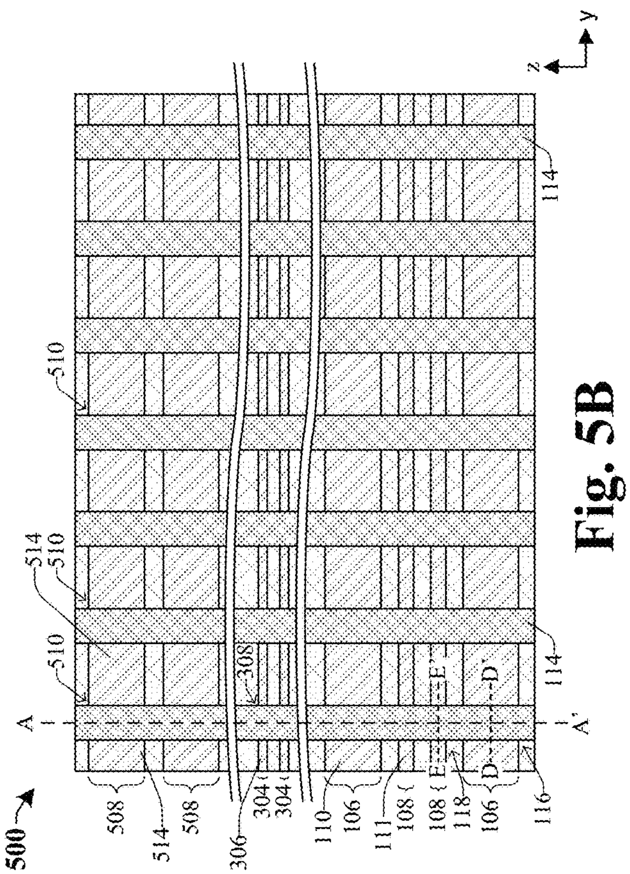
Figure 5C:
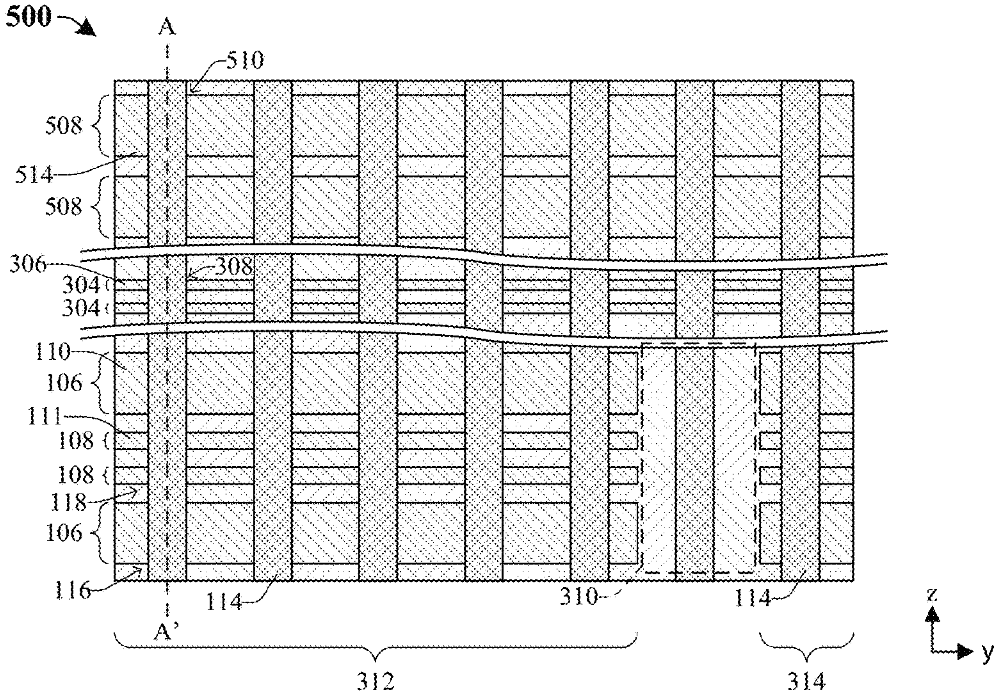

FIGS. 5A-5C illustrated various views of some embodiments of an IC 500 corresponding to some alternative embodiments of the IC 300 of FIGS. 3A-3C. FIG. 5A illustrates a cross-sectional view of some embodiments of the IC 500, and FIGS. 5B-5C illustrate top views of some embodiments of the IC 500. FIG. 5A illustrates a cross-sectional view of some embodiments of the IC 500 taken along the line A-A' of FIG. 5B or FIG. 5C. In some embodiments, the IC 500 includes a first plurality of NSFETs 116, a first plurality of finFETs 118, a second plurality of finFETs 308, and a second plurality of NSFETs 510 disposed laterally adjacent to one another.

The semiconductor substrate 102 comprises a first device region 502 laterally adjacent to a second device region 504, and a third device region 506 laterally adjacent to the second device region 504. In some embodiments, the first and second fin structures 106, 108 are disposed laterally within the first device region 502 and/or may be configured as the first and second fin structures 106, 108 of FIGS. 1, 2A-2D, 3A-3D, and/or 4A-4B. Thus, the first plurality of NSFETs 116 and the first plurality of finFETs 118 are disposed laterally within the first device region 502. In further embodiments, the third fin structures 304 are disposed laterally within the second device region 504 and/or may be configured as the third fin structures 304 of FIGS. 3A-3D and/or 4A-4B. Thus, the second plurality of finFETs 308 are disposed laterally within the second device region 504.

In yet further embodiments, a plurality of fourth fin structures 508 is disposed laterally within the third device region 506. The fourth fin structures 508 may be configured as the first fin structures 106, such that a second plurality of nanostructures 512 is disposed over each of the fourth fin structures 508. In some embodiments, the fourth fin structures 508 and the second plurality of nanostructures 512 each comprise a fourth width w4, where the fourth width w4 may be greater than the first width w1 and/or the first width w1 may be equal to the fourth width w4. In further embodiments, a second plurality of NSFETs 510 are defined between intersections of the fourth fin structures 508 and the gate electrodes 114. In some embodiments, the second plurality of NSFETs 510 may be configured as the first plurality of NSFETs 116 of FIGS. 1, 2A-2D, 3A-3D, and/or 4A-4B.

In some embodiments, the first and second fin structures 106, 108 continuously laterally extend along the first direction (e.g., along the "y" direction) in an unbroken path. In contrast, and as illustrated in the top view of FIG. 5C, in further embodiments, the first and second fin structures 106, 108 are laterally offset from the isolation region 310 as illustrated and described in FIGS. 3B and 3D.

Figure 6A:
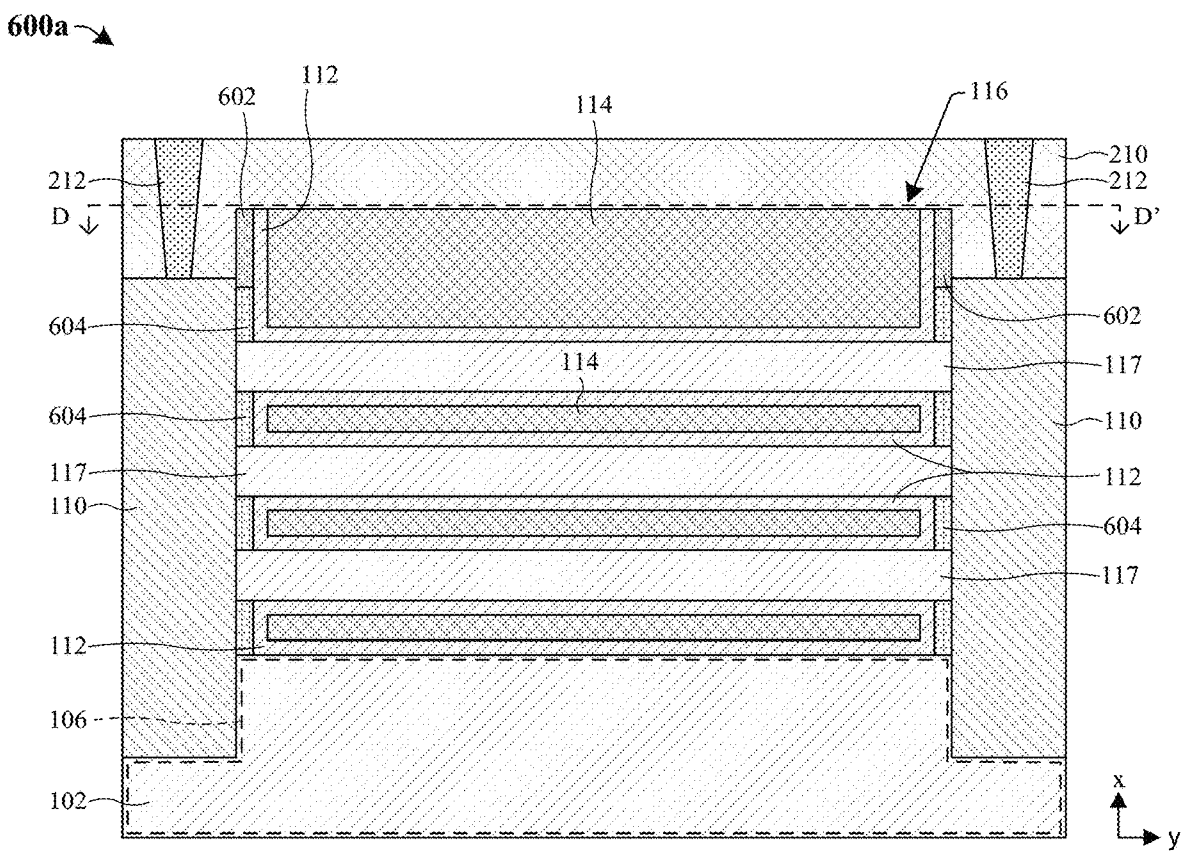
FIGS. 6A-6B illustrate cross-sectional views of some embodiments of the IC of FIGS. 5A-5C.

FIG. 6A illustrates a cross-sectional view 600*a* of some embodiments of a NSFET 116 of FIGS. 5A-5C. In some embodiments, the cross-sectional view 600*a* of FIG. 6A is taken along the line D-D' of the top view of FIG. 5B.

As illustrated in FIG. 6A, the nanostructures 117 are vertically stacked over the first fin structure 106. Further, the nanostructures 117 each laterally extend between a pair of the first source/drain regions 110. Further, the gate electrode 114 is disposed vertically between each of the nanostructures 117. The gate dielectric layer 112 surrounds segments of the gate electrode 114 that are disposed vertically between each of the nanostructures 117. Thus, the gate dielectric layer 112 is configured to separate the gate electrode 114 from the nanostructures 117. A first sidewall spacer structure 602 is disposed on opposing sidewalls of the gate electrode 114 and is disposed between the gate electrode 114 and the first source/drain regions 110. In addition, a plurality of second sidewall spacers 604 are disposed along sidewalls of the gate dielectric layer 112 and are configured to laterally separate the gate electrode 114 from the first source/drain regions 110. In some embodiments, the first sidewall spacer structure 602 may, for example, be or comprise an oxide (e.g., silicon dioxide), silicon nitride, silicon oxynitride, silicon carbide, some other suitable dielectric material, or any combination of the foregoing. In further embodiments, the plurality of second sidewall spacers 604 may, for example, respectively be or comprise an oxide (e.g., silicon dioxide), silicon nitride, silicon carbide, silicon oxynitride, silicon oxycarbide, another suitable dielectric material, or any combination of the foregoing.

Although the cross-sectional view 600*a* of FIG. 6A is described in relation to one of the NSFETs 116 of FIGS. 5A-5C, it will be appreciated that any NSFET (e.g., each of the first and/or second plurality of NSFETs 116, 510) of FIGS. 1, 2A-2D, 3A-3D, 4A-4B, and/or 5A-5C may be illustrated and/or described as the NSFET 116 of FIG. 6A.

Figure 6B:
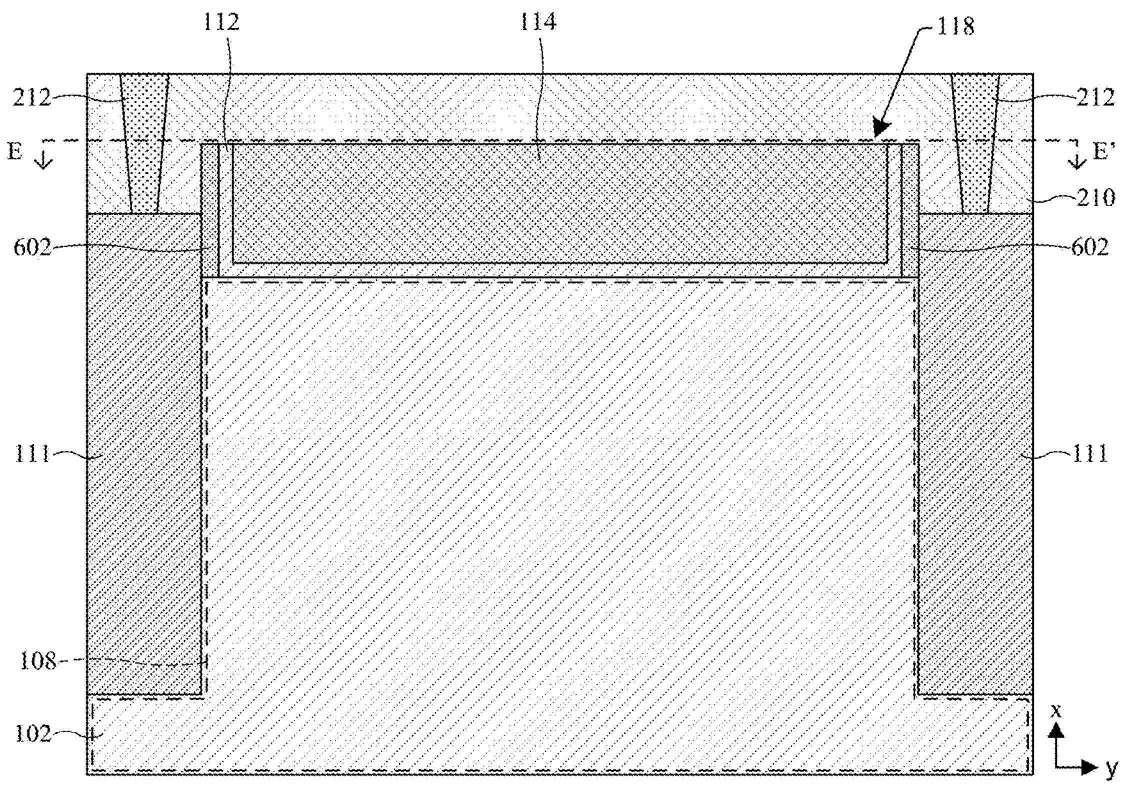

FIG. 6B illustrates a cross-sectional view 600*b* of some embodiments of a finFET 118 of FIGS. 5A-5C. In some embodiments, the cross-sectional view 600*b* of FIG. 6B is taken along the line E-E' of the top view of FIG. 5B.

As illustrated in FIG. 6B, the gate electrode 114 overlies the second fin structure 108. The gate dielectric layer 112 extends along opposing sidewalls and a bottom surface of a segment of the gate electrode 114 that overlies the second fin structure 108. The first sidewall spacer structure 602 is disposed on opposing sides of the gate electrode 114.

Although the cross-sectional view 600*b* of FIG. 6B is described in relation to one of the finFETs 118 of FIGS. 5A-5C, it will be appreciated that any finFET (e.g., each of the first and/or second plurality of finFETs 118, 308) of FIGS. 1, 2A-2D, 3A-3D, 4A-4B, and/or 5A-5C may be illustrated and/or described as the finFET 118 of FIG. 6B.

FIGS. 7 through 28A-28B illustrate various views of some embodiments of a method for forming an IC comprising a plurality of fin structures having different widths that are laterally adjacent to one another on a same substrate according to the present disclosure. Although the various views shown in FIGS. 7 through 28A-28B are described with reference to a method, it will be appreciated that the structures shown in FIGS. 7 through 28A-28B are not limited to the method but rather may stand alone separate of the method. Although FIGS. 7 through 28A-28B are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 7:
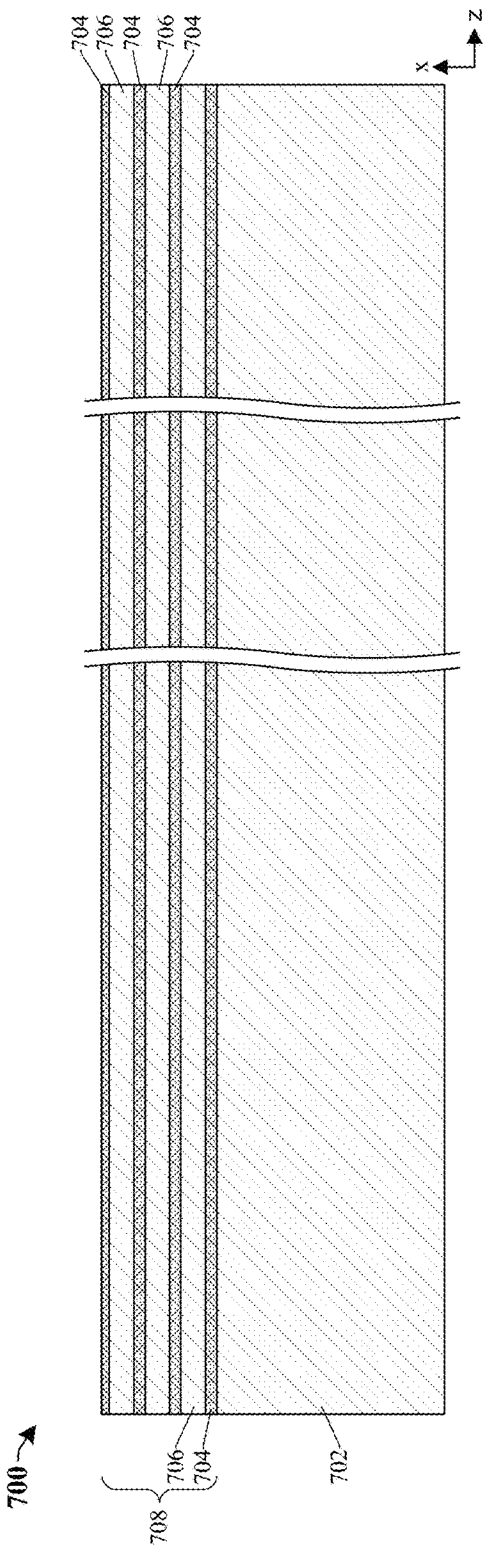

As shown in the cross-sectional view 700 of FIG. 7, a stack of semiconductor layers 708 is formed over a base semiconductor structure 702 (e.g., a semiconductor wafer, semiconductor substrate, etc.). The base semiconductor structure 702 is or comprises silicon, or some other suitable material. The stack of semiconductor layers 708 comprises alternating layers of a first semiconductor layer 704 and a second semiconductor layer 706. In some embodiments, the first semiconductor layer 704 comprises a different material than the second semiconductor layer 706. In further embodiments, the first semiconductor layer 704 comprises silicon-germanium and/or the second semiconductor layer 706 comprises silicon. Thus, in some embodiments, the second semiconductor layers 706 may comprise a same material as the base semiconductor structure 702.

In some embodiments, a process for forming the stack of semiconductor layers 708 comprises epitaxially forming the first semiconductor layers 704 and the second semiconductor layers 706. For example, a first one of the first semiconductor layers 704 is grown on the base semiconductor structure 702 by a first epitaxial process, such as, vapor-phase epitaxy (VPE), liquid-phase epitaxy (LPE), molecular-beam epitaxy (MBE), some other epitaxial process, or a combination of the foregoing. Thereafter, a first one of the second semiconductor layers 706 is grown on the first one of the first semiconductor layers 704 by a second epitaxial process, such as, VPE, LPE, MBE, some other epitaxial process, or a combination of the foregoing. The first epitaxial process and the second epitaxial process are repeated in an alternative manner until the stack of semiconductor layers 708 is formed.

Figure 8:
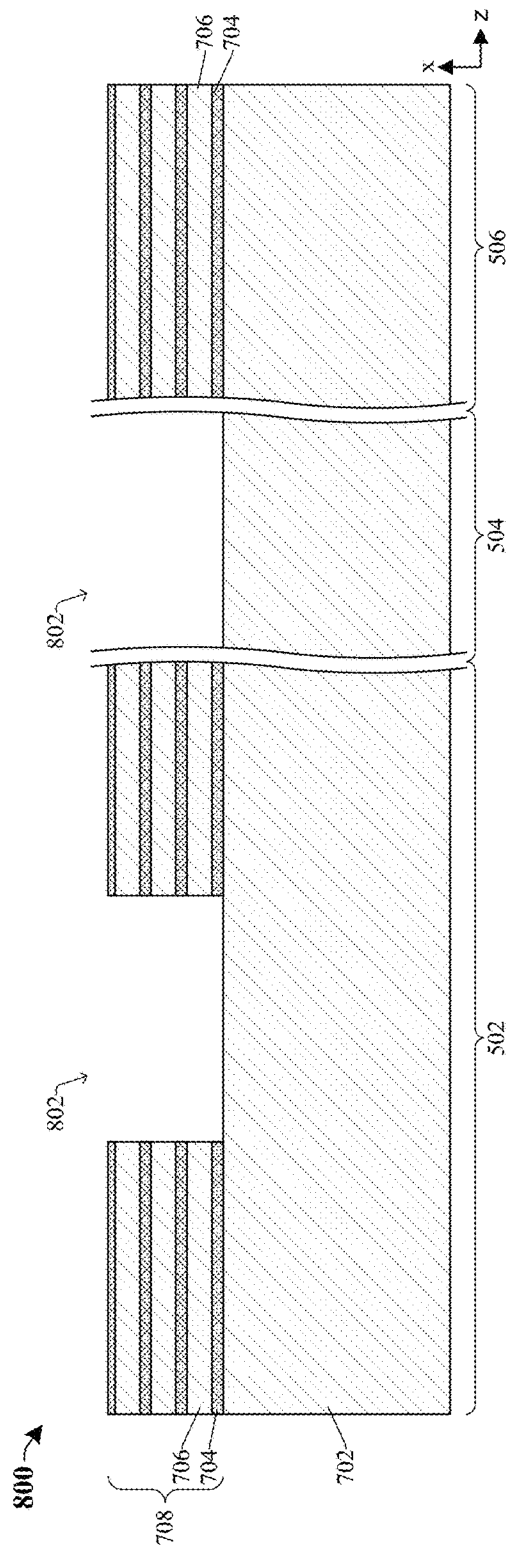

As shown in the cross-sectional view 800 of FIG. 8, a patterning process is performed on the stack of semiconductor layers 708, thereby defining a plurality of openings 802. In some embodiments, the patterning process includes: forming a first patterned masking layer (not shown) (e.g., positive/negative photoresist, hardmask, etc.) over the stack of semiconductor layers 708; performing a first etching process on the stack of semiconductor layers 708 according to the first patterned masking layer, thereby defining the openings 802; and performing a removal process to remove the first patterned masking layer. In further embodiments, the first patterned masking layer may be formed by forming a masking layer (not shown) over the stack of semiconductor layers 708; exposing the masking layer to a pattern (e.g., via a lithography process, such as photolithography, extreme ultraviolet lithography, or the like), and developing the masking layer to form the first patterned masking layer. In some embodiments, the first etching process may be a dry etching process, a wet etching process, a reactive ion etching (RIE) process, some other etching process, or any combination of the foregoing. In yet further embodiments, the first etching process may remove at least a portion of the base semiconductor structure 702, such that an upper surface of the base semiconductor structure 702 is disposed vertically below the stack of semiconductor layers 708 (not shown).

Figure 9:
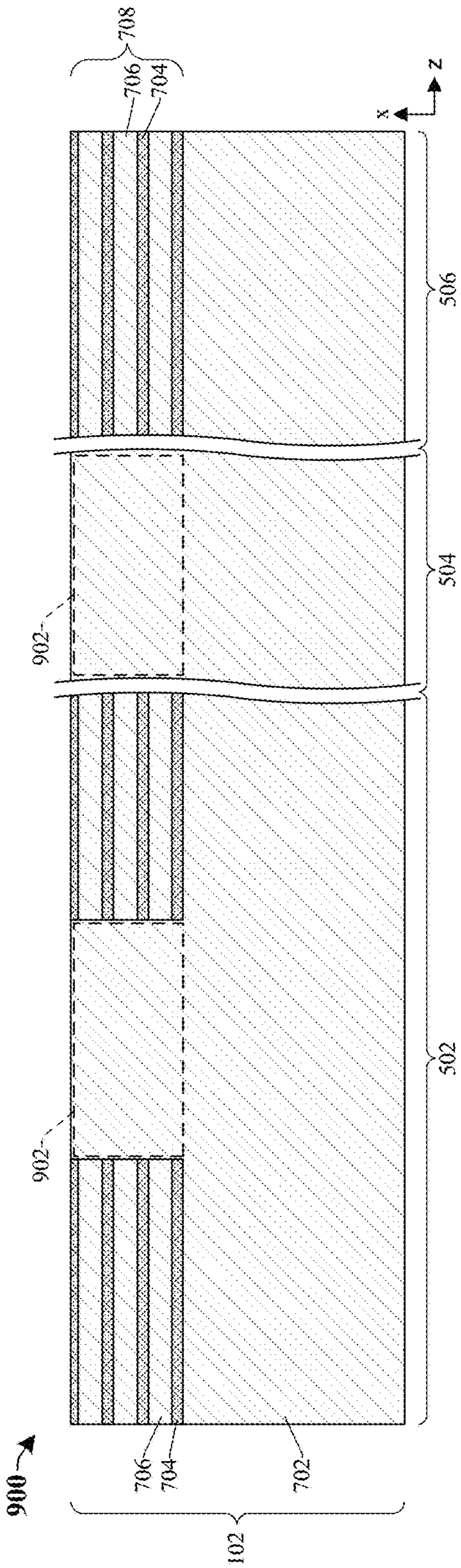

As shown in the cross-sectional view 900 of FIG. 9, epitaxial semiconductor structures 902 are formed in over the base semiconductor structure 702 and on sides of the stack of semiconductor layers 708, thereby defining a semiconductor substrate 102. In some embodiments, the epitaxial semiconductor structures 902 comprise an epitaxial semiconductor material (e.g., a semiconductor material formed by an epitaxial process, such as epitaxial silicon, epitaxial germanium, epitaxial silicon-germanium, etc.). In some embodiments, the epitaxial semiconductor structures 902 each comprise a same material as the base semiconductor structure 702. In further embodiments, the base semiconductor structure 702 has a first lattice orientation (e.g., a first crystal plane of the semiconductor material of the base semiconductor structure 702). In some embodiments, the first lattice orientation may be, for example, (100), (110), or the like. In yet further embodiments, the epitaxial semiconductor structures 902 may have a second lattice orientation (e.g., (100), (110), or the like) that may, for example, be different from the first lattice orientation. In yet further embodiments, the first lattice orientation may be the same as the second lattice orientation. Further, in various embodiments, a bottom surface of the epitaxial semiconductor structures 902 may be disposed below a top surface of the base semiconductor structure 702.

In some embodiments, a process for forming the epitaxial semiconductor structures 902 may, for example, include performing VPE, LPE, MBE, some other epitaxial process, or a combination of the foregoing to define the epitaxial semiconductor structures 902 over the base semiconductor structure 702 and/or on sides of the stack of semiconductor layers 708. Subsequently, in some embodiments, a planarization process (e.g., chemical-mechanical polishing (CMP)) is them performing on the epitaxial semiconductor structures 902 to co-planarize an uppermost surface of the epitaxial semiconductor structures 902 and an uppermost surface of the stack of semiconductor layers 708. In some embodiments, the semiconductor substrate 102 comprises the stack of semiconductor layers 708, the base semiconductor structure 702, and the epitaxial semiconductor structures 902. In further embodiments, a process for forming the semiconductor substrate 102 includes performing the processing steps illustrated and/or described in FIGS. 7-9. Further, the semiconductor substrate 102 comprises a first device region 502 laterally adjacent to a second device region 504, and a third device region 506 laterally adjacent to the second device region 504.

Figure 10:
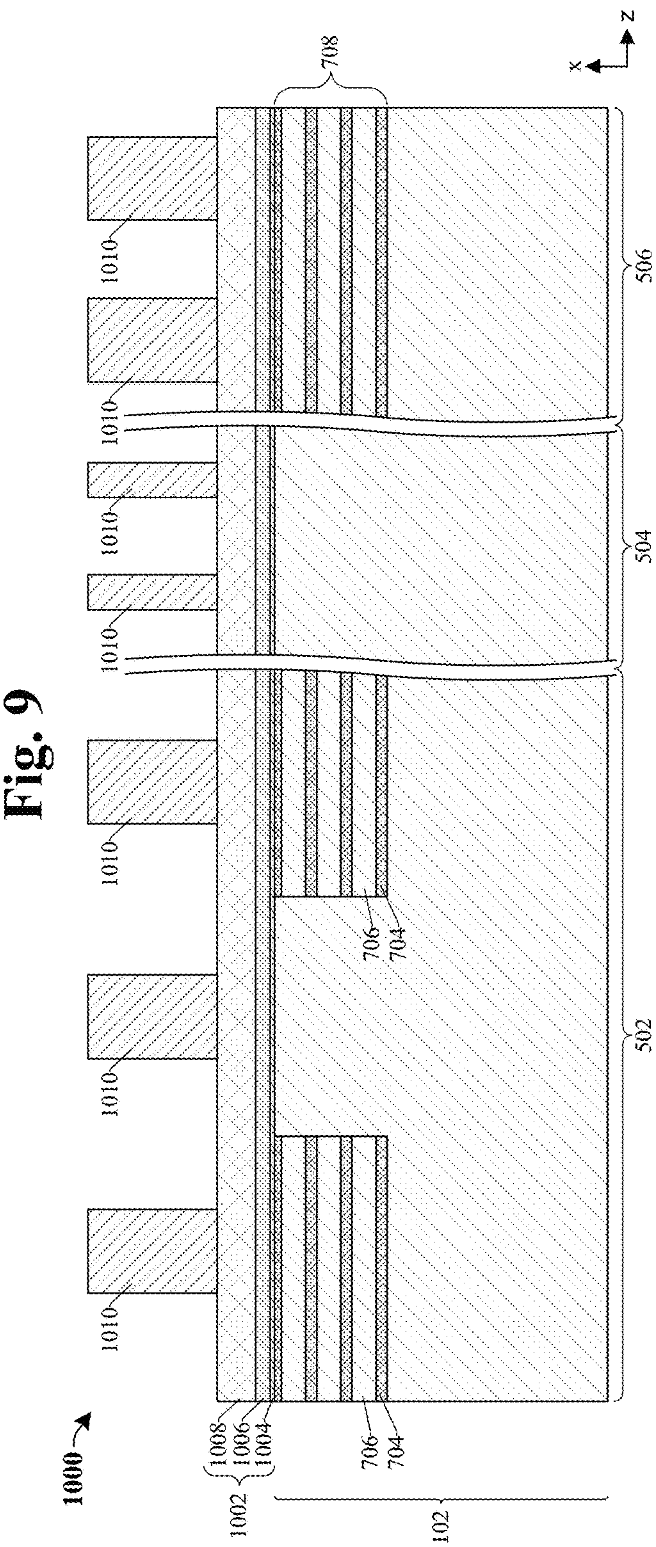

As shown in the cross-sectional view 1000 of FIG. 10, a masking structure 1002 is formed over the semiconductor substrate 102. In some embodiments, the masking structure 1002 continuously laterally extends over the first, second, and third device regions 502, 504, 506 along an unbroken path. In further embodiments, the masking structure 1002 comprises a single layer or a stack of layers, for example, the masking structure 1002 may comprise a lower masking layer 1004, a middle masking layer 1006, and/or an upper masking layer 1008. In yet further embodiments, the masking structure 1002 may be configured as a hard mask. Further, multiple mandrel structures 1010 are formed over the masking structure 1002. In some embodiments, a process for forming the mandrel structures 1010 may include: depositing (e.g., by physical vapor deposition (PVD), chemical vapor deposition (CVD), or another suitable growth or deposition process) a mandrel layer (not shown) over the masking structure 1002; patterning the mandrel layer according to a masking layer (not shown), thereby defining the multiple mandrel structures 1010; and performing a removal process to remove the masking layer. The patterning process may include performing a wet etch process and/or a dry etch process. In some embodiments, the mandrel structures 1010 may, for example, respectively be or comprise amorphous silicon, or another suitable material.

In some embodiments, the lower masking layer 1004 may, for example, be or comprise an oxide, such as silicon dioxide, or another suitable dielectric material. In further embodiments, the middle masking layer 1006 may, for example, be or comprise silicon nitride, silicon carbide, or another suitable dielectric material. In yet further embodiments, the upper masking layer 1008 may, for example, be or comprise an oxide, such as silicon dioxide, or another suitable dielectric material. In various embodiments, the lower masking layer 1004, the middle masking layer 1006, and/or the upper masking layer 1008 may, for example, respectively be formed by PVD, CVD, atomic layer deposition (ALD), an oxidation process, or another suitable deposition or growth process. In further embodiments, a thickness of the lower masking layer 1004 is less than a thickness of the middle masking layer 1006, and a thickness of the upper masking layer 1008 is greater than the thickness of the middle masking layer 1006.

Figure 11:
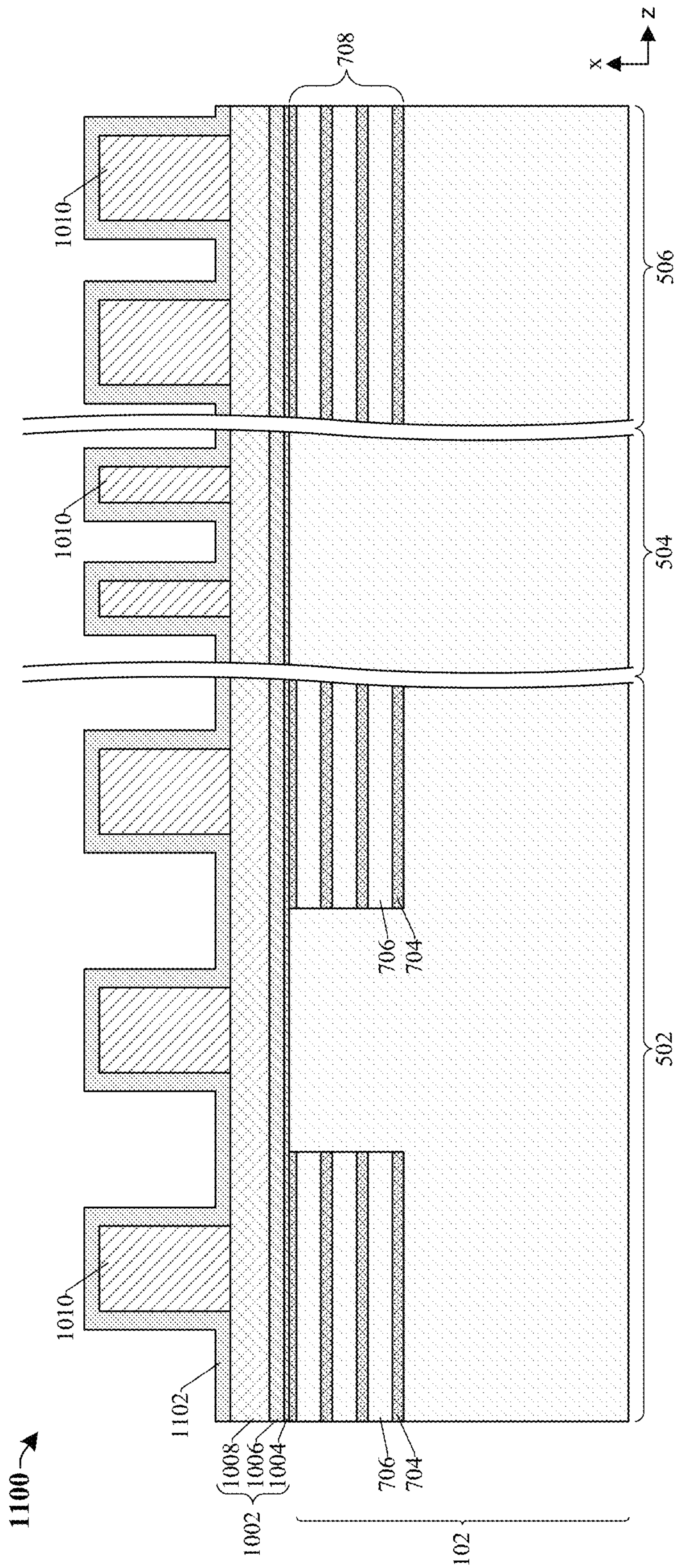

As shown in the cross-sectional view 1100 of FIG. 11, a sidewall spacer layer 1102 is deposited over the masking structure 1002 and the mandrel structures 1010. In some embodiments, the sidewall spacer layer 1102 is formed by, for example, a CVD process, a PVD process, an ALD process, and/or another suitable growth or deposition process. In further embodiments, the sidewall spacer layer 1102 may, for example, be or comprise silicon nitride, silicon carbide, or another suitable dielectric material.

Figure 12:
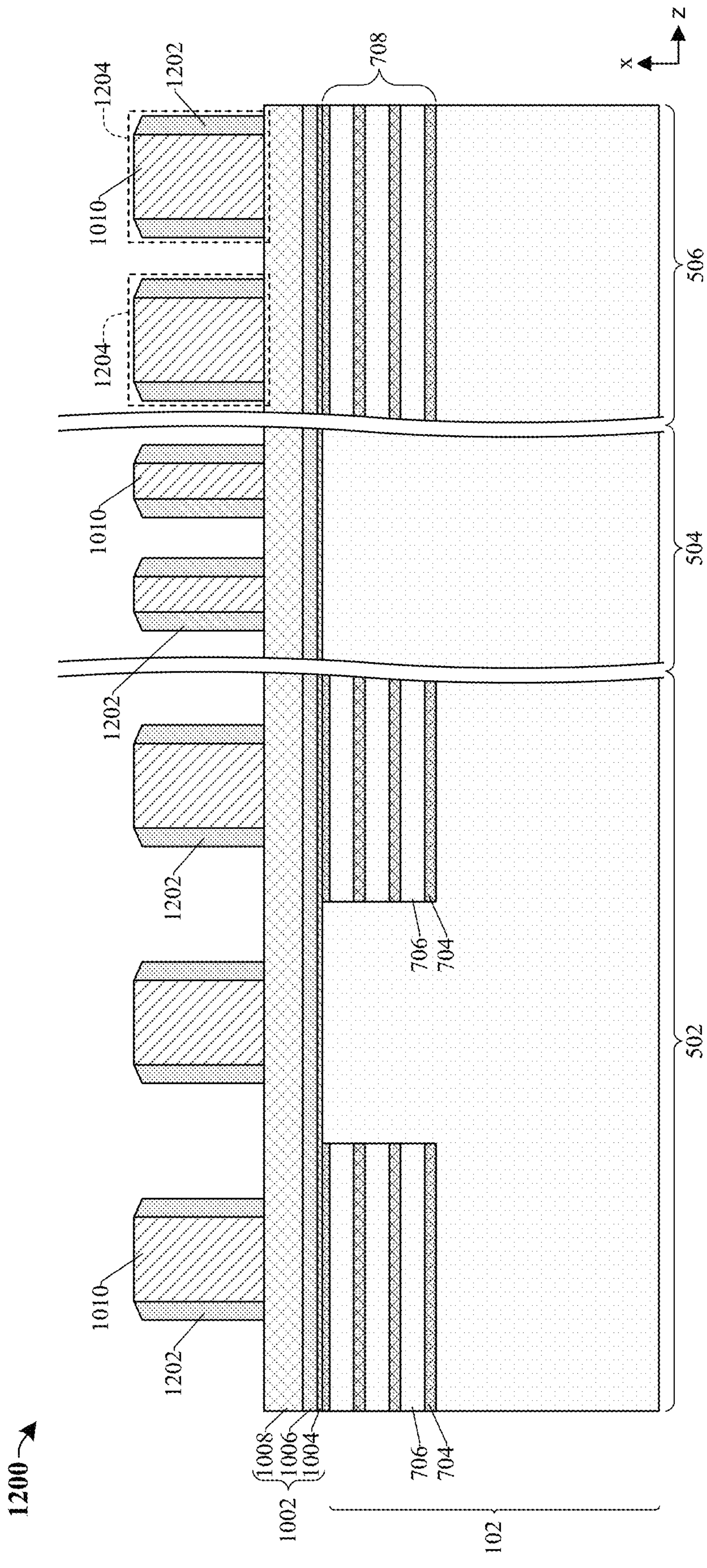

As shown in the cross-sectional view 1200 of FIG. 12, the sidewall spacer layer (1102 of FIG. 11) is patterned, thereby defining sidewall spacer structures 1202 that laterally enclose each mandrel structure 1010. This, in some embodiments, defines first upper masking structures 1204 disposed laterally within the third device region 506. The first upper masking structures 1204 may, for example, each include a mandrel structure 1010 and a sidewall spacer structure 1202 that laterally encloses the mandrel structure 1010. In some embodiments, the patterning process includes performing an anisotropic etch (e.g., a vertical etch) on the sidewall spacer layer (1102 of FIG. 11) to remove lateral stretches of the sidewall spacer layer (1102 of FIG. 11), thereby resulting in the sidewall spacer structures 1202 disposed along sidewalls of the mandrel structures 1010.

Figure 13:
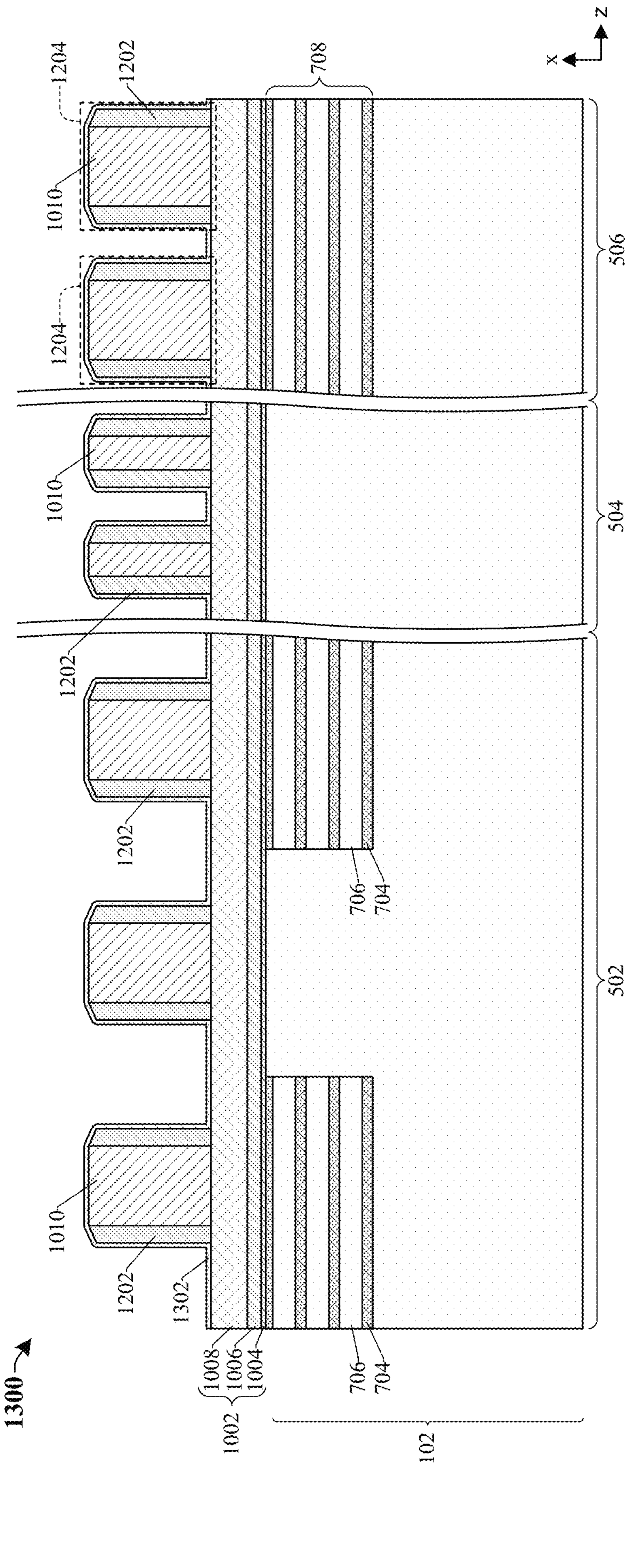

As shown in the cross-sectional view 1300 of FIG. 13, a dielectric capping layer 1302 is deposited over the masking structure 1002, the mandrel structures 1010, and the sidewall spacer structures 1202. In some embodiments, the dielectric capping layer 1302 is configured to protect underlying layers and/or may, for example, be or comprise an oxide, such as silicon dioxide, or another suitable dielectric material. In further embodiments, the dielectric capping layer 1302 may, for example, be deposited by a CVD process, a PVD process, an ALD process, or another suitable deposition or growth process. In some embodiments, the dielectric capping layer 1302 is formed solely be a PVD process. In yet further embodiments, the dielectric capping layer 1302 may continuously laterally extend along the first, second, and third device regions 502, 504, 506 along an unbroken path.

Figure 14A:
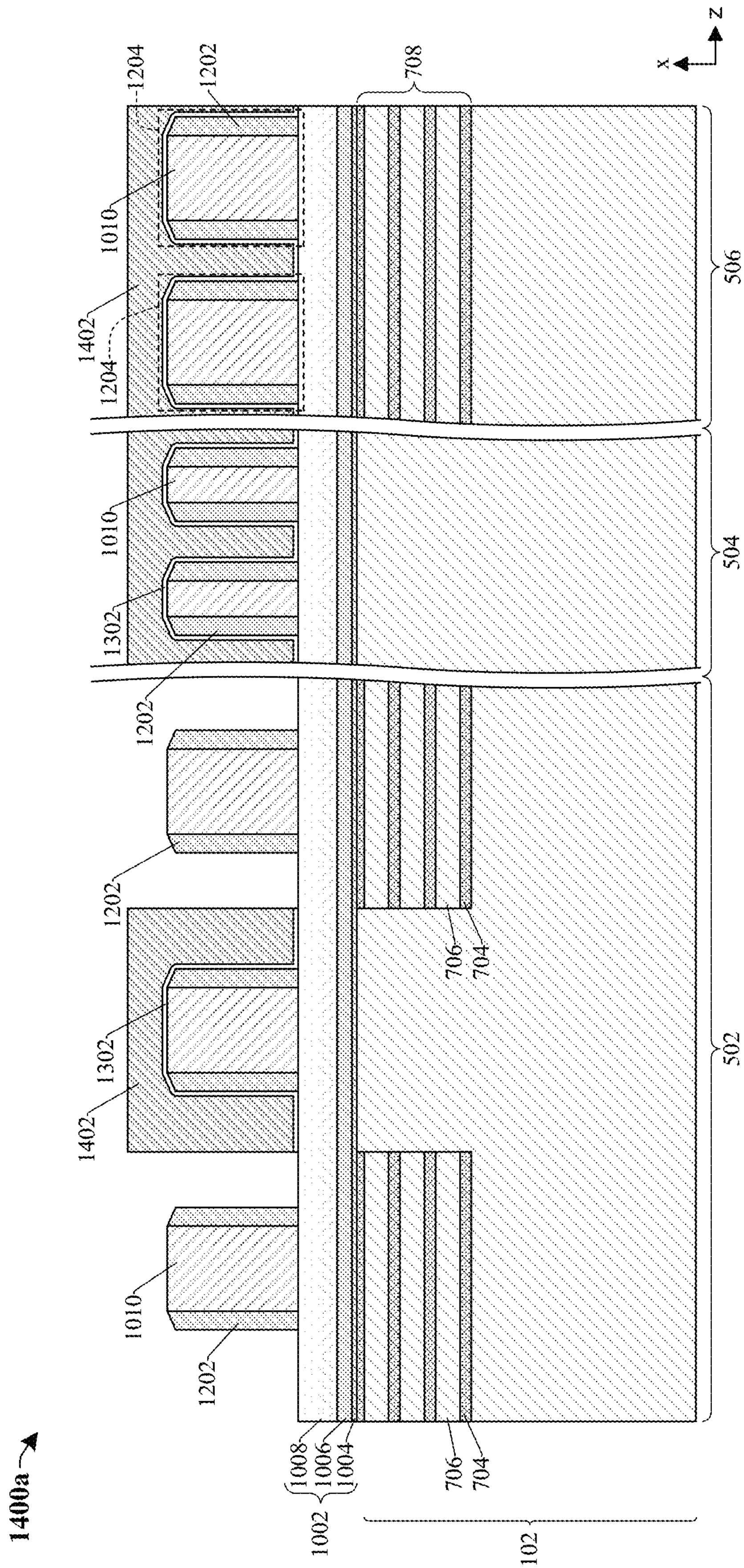

As shown in the cross-sectional view 1400*a* of FIG. 14A, a first protection layer 1402 is formed to cover a first set of the mandrel structures 1010 and corresponding sidewall spacer structures 1202 while exposing a second set of the mandrel structures 1010 and corresponding sidewall spacer structures 1202. In some embodiments, a process for forming the first protection layer 1402 includes: depositing (e.g., by CVD, PVD, ALD, spin-on or coating techniques, etc.) a first protection film; and patterning the first protection film according to a photolithographic mask (not shown), thereby defining the first protection layer 1402 and exposing the second set of mandrel structures 1010. Subsequently, the dielectric capping layer 1302 is patterned according to the first protection layer 1402 such that the dielectric capping layer 1302 is removed from over the second set of the mandrel structures 1010 while the dielectric capping layer 1302 remains over the first set of mandrel structures 1010. In various embodiments, the dielectric capping layer 1302 is remove from segments of the first device region 502. In further embodiments, the first protection layer 1402 may comprise a single layer and/or may comprise a multi-layer structure. For example, the multi-layer stack may be or comprise one or more layers such as a first layer, a second layer, and a third layer (not shown). The second layer may be disposed between the first and third layers. In yet further embodiments, the first layer may comprise an allyl monomer, the second layer may comprise diazonaphthoquinone (DNQ), and the third layer may comprise an off-stoichiometry thiol-ene polymer.

Figure 14B:
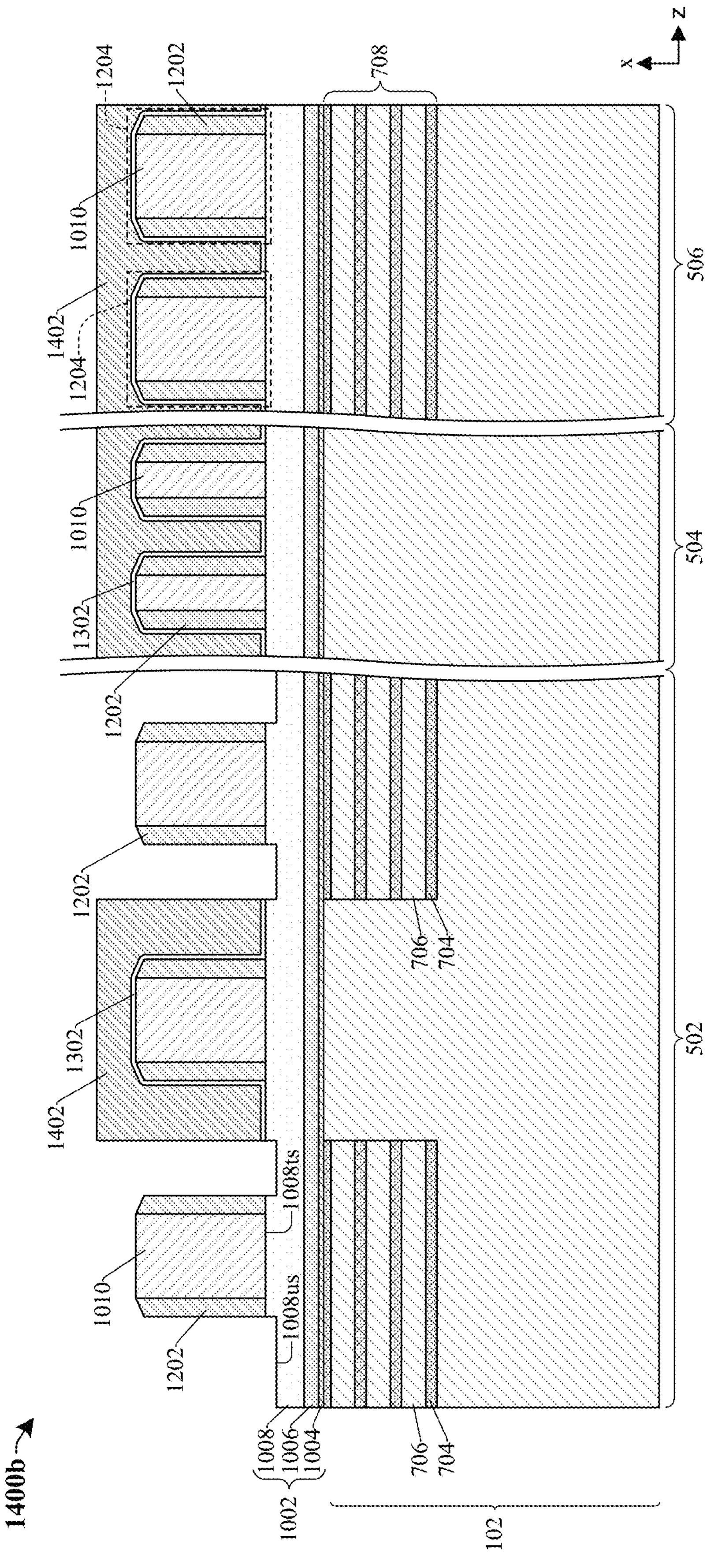
Figure 15:
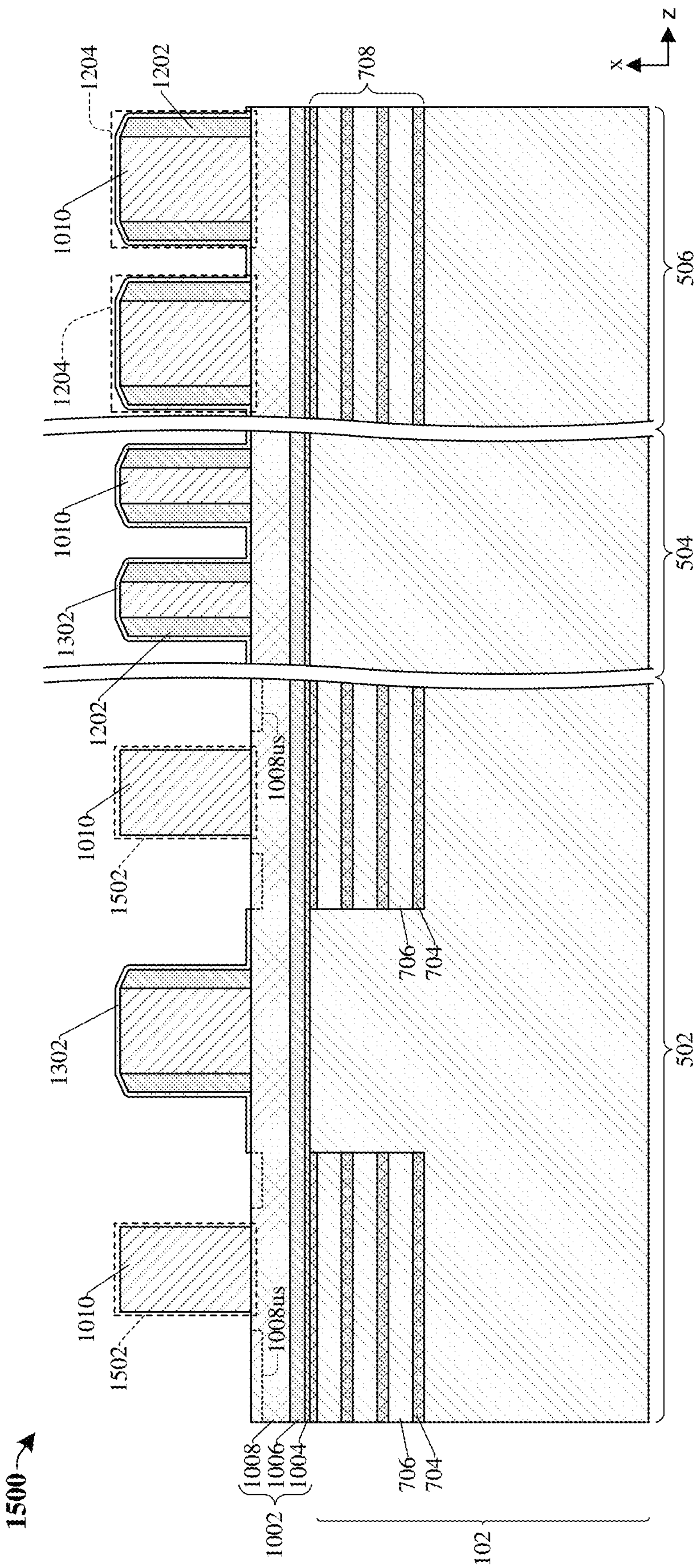

Cross-sectional view 1400*b* of FIG. 14B illustrates various alternative embodiments of the processing step of the cross-sectional view 1400*a* of FIG. 14A, in which the patterning process utilized to remove segments of the dielectric capping layer 1302 may over-etch and remove portions of the upper masking layer 1008. In some embodiments, the portions of the upper masking layer 1008 removed by the patterning process are laterally offset from the second set of mandrel structures 1010. Thus, an upper surface 1008*us* of the upper masking layer 1008 is disposed vertically below a top surface 1008*ts* of the upper masking layer 1008. As illustrated in FIG. 15, the upper surface 1008*us* of the upper masking layer 1008 may be illustrated by a dashed line in subsequent processing steps.

As shown in cross-sectional view 1500 of FIG. 15, a removal process is performed to remove the first protection layer (1402 of FIG. 14A). In some embodiments, after removing the first protection layer (1402 of FIG. 14A), the sidewall spacer structures 1202 laterally enclosing the second set of mandrel structures 1010 are stripped, thereby exposing outer sidewalls of each of the mandrel structures 1010 in the second set. This, in part, defines second upper masking structures 1502 within the first device region 502. The second upper masking structures 1502 each comprise a mandrel structure 1010. In some embodiments, stripping the sidewall spacer structures 1202 that laterally enclose the second set of mandrel structures 1010 comprises performing one or more etch processes that may include a wet etch process and/or a dry etch process. The dielectric capping layer 1302 is configured to protect the sidewall spacer structures 1202 that laterally enclose the first set of mandrel structures 1010 such that they are not removed during the one or more etch processes. In some embodiments, the one or more etch processes includes exposing layers overlying the semiconductor substrate 102 to one or more etchants, such as, for example, phosphoric acid (e.g., $H_3PO_4$). In yet further embodiments, the one or more etch processes may etch the sidewall spacer structures 1202 more quickly than the dielectric capping layer 1302, the upper masking layer 1008, and/or the mandrel structures 1010.

Figure 16:
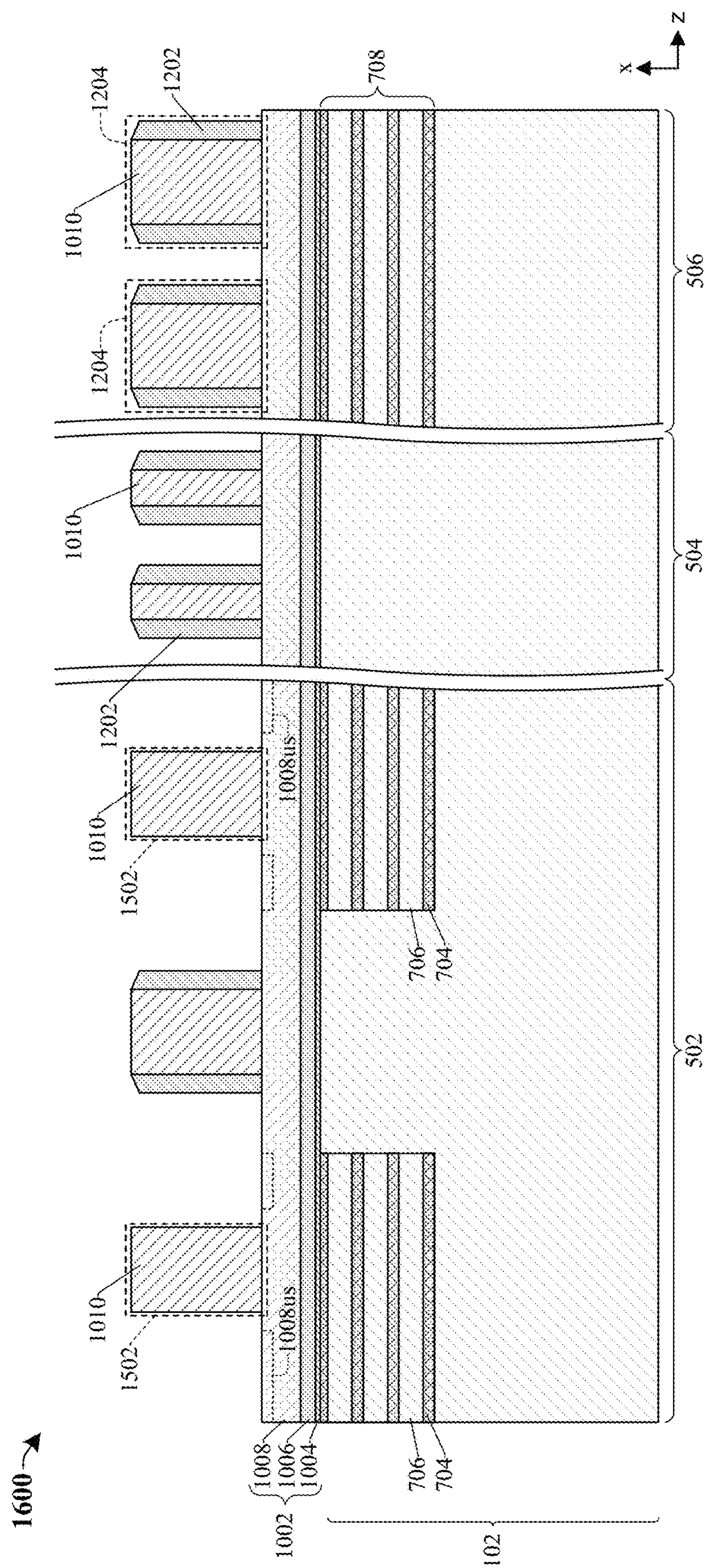

As shown in cross-sectional view 1600 of FIG. 16, a removal process is performed on the structure of FIG. 15, such that the dielectric capping layer (1302 of FIG. 15) is removed. In some embodiments, the removal process includes performing a wet etch process and/or a dry etch process.

Figure 17:
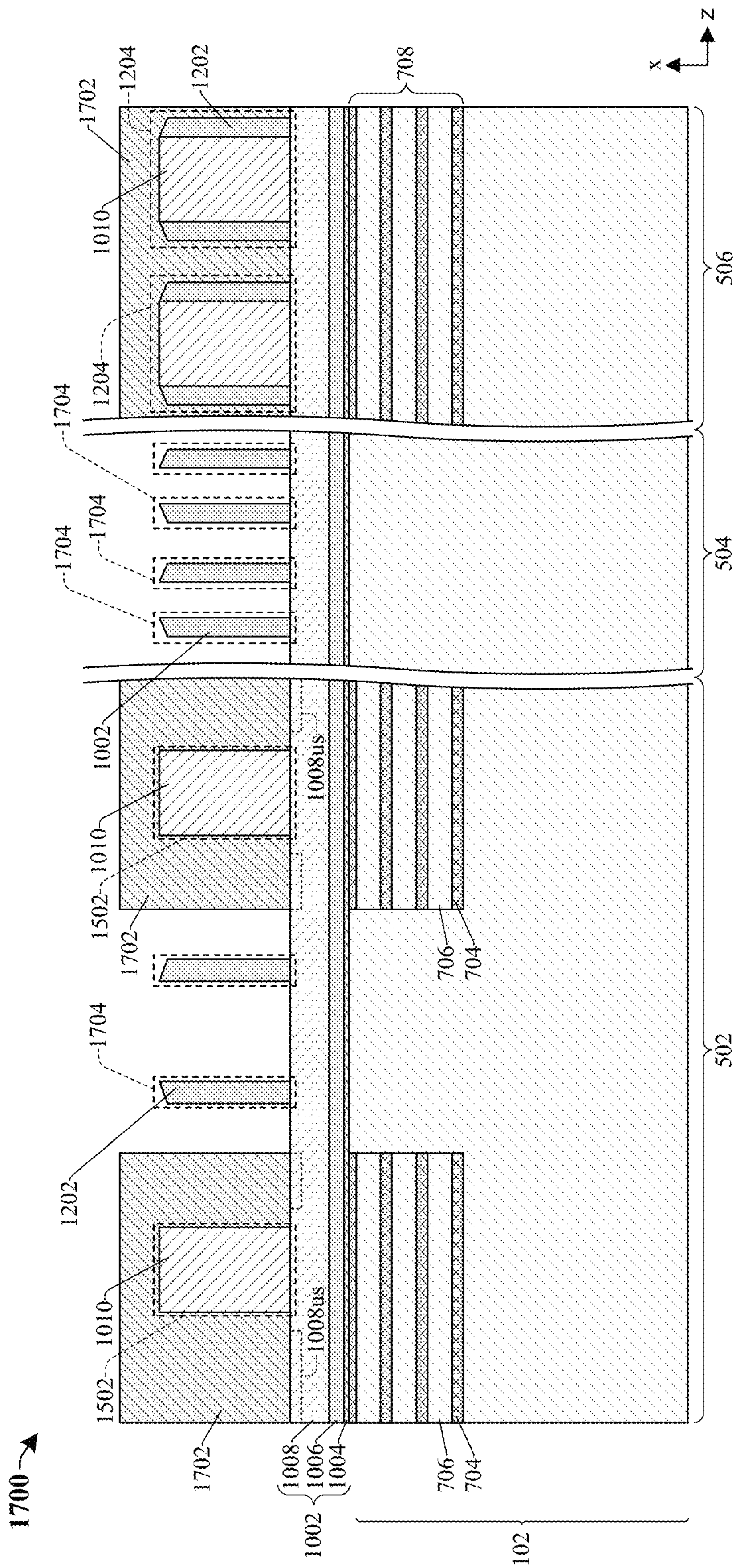

As shown in cross-sectional view 1700 of FIG. 17, a second protection layer 1702 is formed to cover the first and second upper masking structures 1204, 1502. In some embodiments, a process for forming the second protection layer 1702 includes: depositing (e.g., by CVD, PVD, ALD, spin-on or coating techniques, etc.) a second protection film; and patterning the second protection film according to a photolithographic mask (not shown), thereby defining the second protection layer 1702. Subsequently, a patterning process is performed on the mandrel structures 1010 that are laterally offset from the second protection layer 1702 to remove them from the first and second device regions 502, 504, thereby defining third upper masking structures 1704 within the first and second device regions 502, 504. In some embodiments, the patterning process includes performing a wet etch process and/or dry etch process that etches the mandrel structures 1010 more quickly than the sidewall spacer structures 1202. Thus, in various embodiments, the third upper masking structures 1704 each comprise the sidewall spacer structures 1202 disposed within the first and second device regions 502, 504. After performing the patterning process, a removal process is performed to remove the second protection layer 1702 (not shown).

In further embodiments, the second protection layer 1702 may comprise a single layer and/or may comprise a multi-layer structure. For example, the multi-layer stack may be or comprise one or more layers such as a first layer, a second layer, and a third layer (not shown). The second layer may be disposed between the first and third layers. In yet further embodiments, the first layer may comprise an allyl monomer, the second layer may comprise diazonaphthoquinone (DNQ), and the third layer may comprise an off-stoichiometry thiol-ene polymer.

Figure 18:
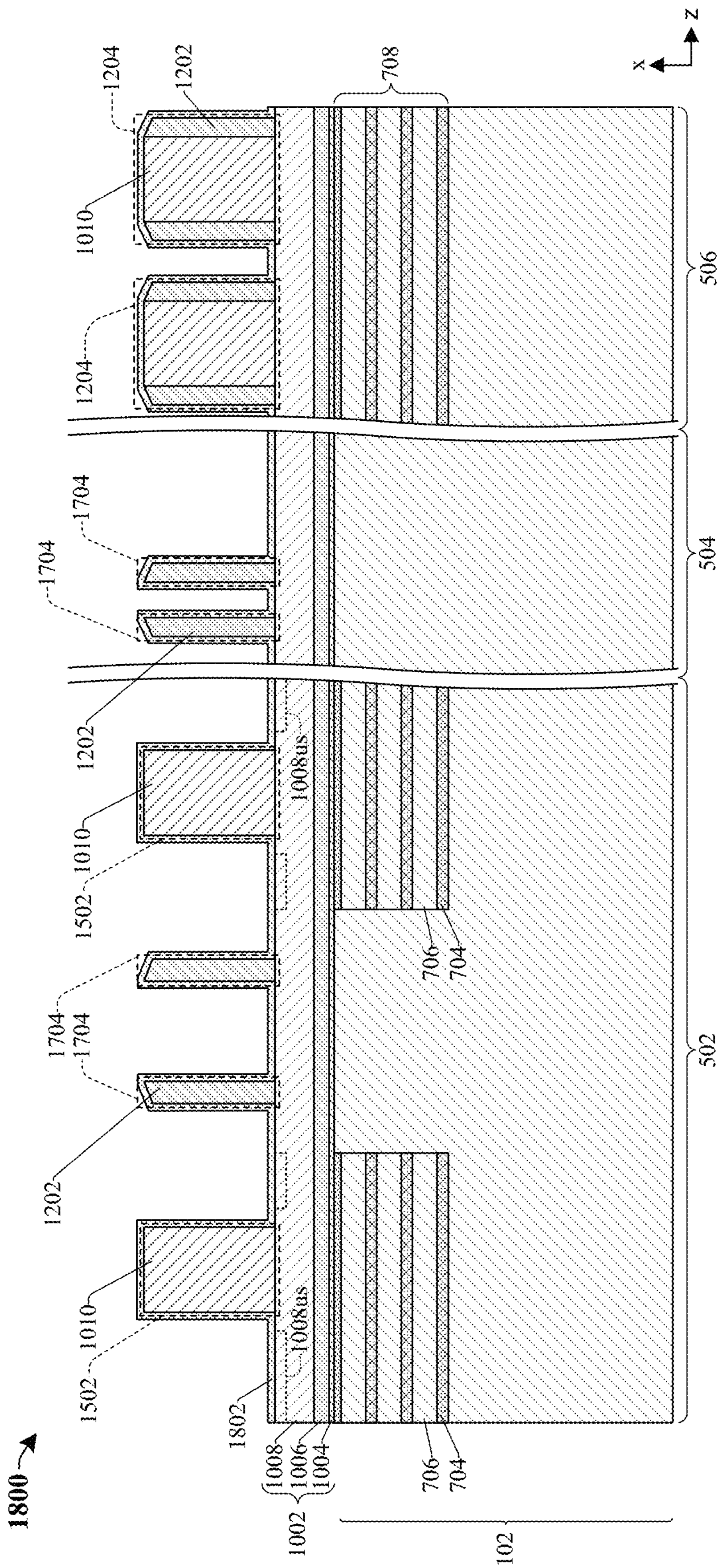

As shown in cross-sectional view 1800 of FIG. 18, a patterning process is performed on the second device region 504 to remove a first set of the third upper masking structures 1704 while leaving a second set of the third upper masking structures 1704 in place. In some embodiments, the patterning process may include performing a dry etch process according to a masking layer (not shown). Subsequently, an upper dielectric layer 1802 is formed over the masking structure 1002 and laterally across the first, second, and third device regions 502, 504, 506. In some embodiments, the upper dielectric layer 1802 may, for example, be deposited by a CVD process, a PVD process, an ALD process, or another suitable growth or deposition process. In further embodiments, the upper dielectric layer 1802 may, for example, be or comprise silicon nitride, silicon carbide, or another suitable dielectric material and/or may be formed to a thickness of about 3 nanometers, or within a range of about 2.8 to 3.2 nanometers.

Figure 19:
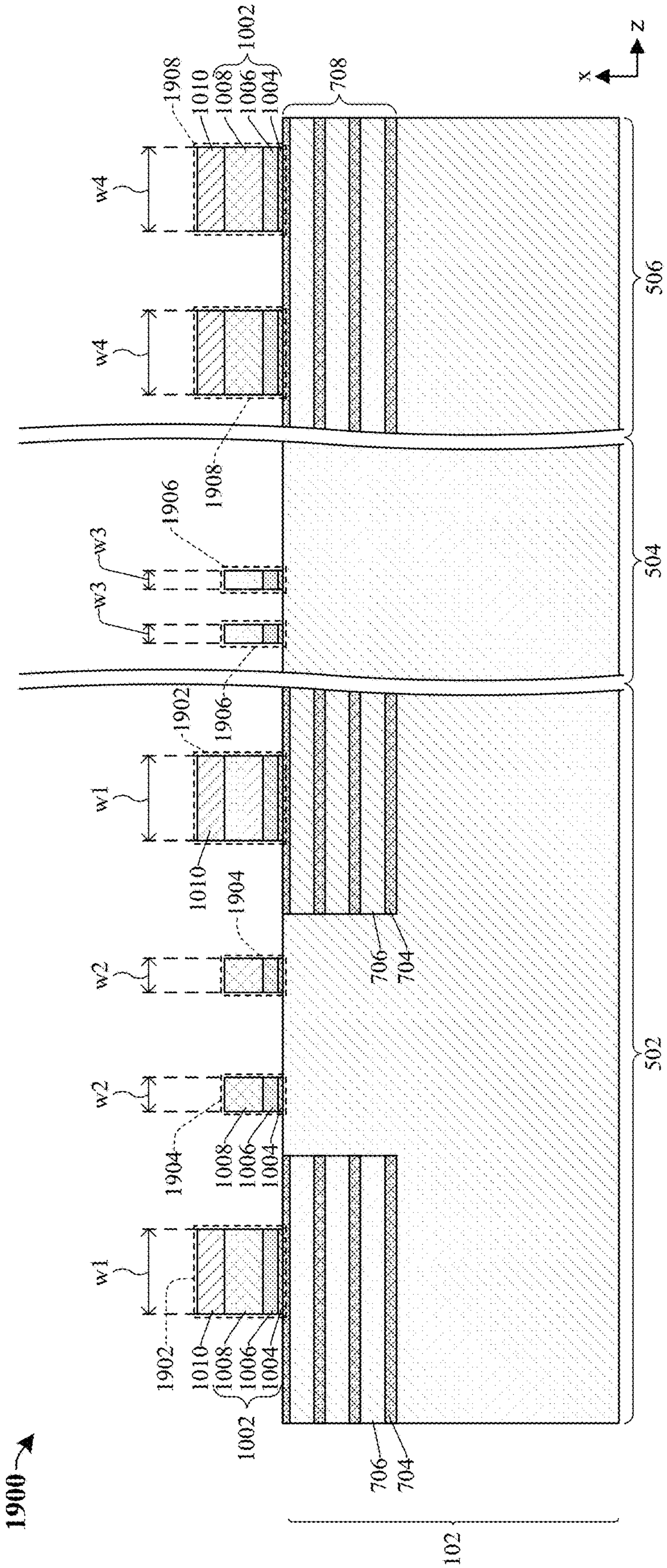

As shown in cross-sectional view 1900 of FIG. 19, a patterning process is performed on the structure of FIG. 18 according to the upper dielectric layer 1802, the first upper masking structures 1204, the second upper masking structures 1502, and the third upper masking structures 1704. This, in part, forms a first stack of masking layers 1902, a second stack of masking layers 1904, a third stack of masking layers 1906, and a fourth stack of masking layers 1908. In some embodiments, the patterning process includes performing a dry etch process, a wet etch process, another suitable etch process, or any combination of the foregoing. Further, the first and fourth stack of masking layers 1902, 1908 may respectively comprise the mandrel structure 1010 and the masking structure 1002. Furthermore, the second and third stack of masking layers 1904, 1906 may respectively comprise the masking structure 1002.

Additionally, due to a difference in layers and/or structures of the first upper masking structures 1204, the second upper masking structures 1502, and/or the third upper masking structures 1704 the first, second, third, and fourth stack of masking layers 1902-1908 may have different widths from one another. For example, the first stack of masking layers 1902 has a first width w1, the second stack of masking layers 1904 has a second width w2, the third stack of masking layers 1906 has a third width w3, and the fourth stack of masking layers has a fourth width. In further embodiments, the first width w1 is greater than the second width w2, and the second width w2 is greater than the third width w3. In yet further embodiments, the fourth width w4 is greater than or equal to the first width w1.

Figure 20:
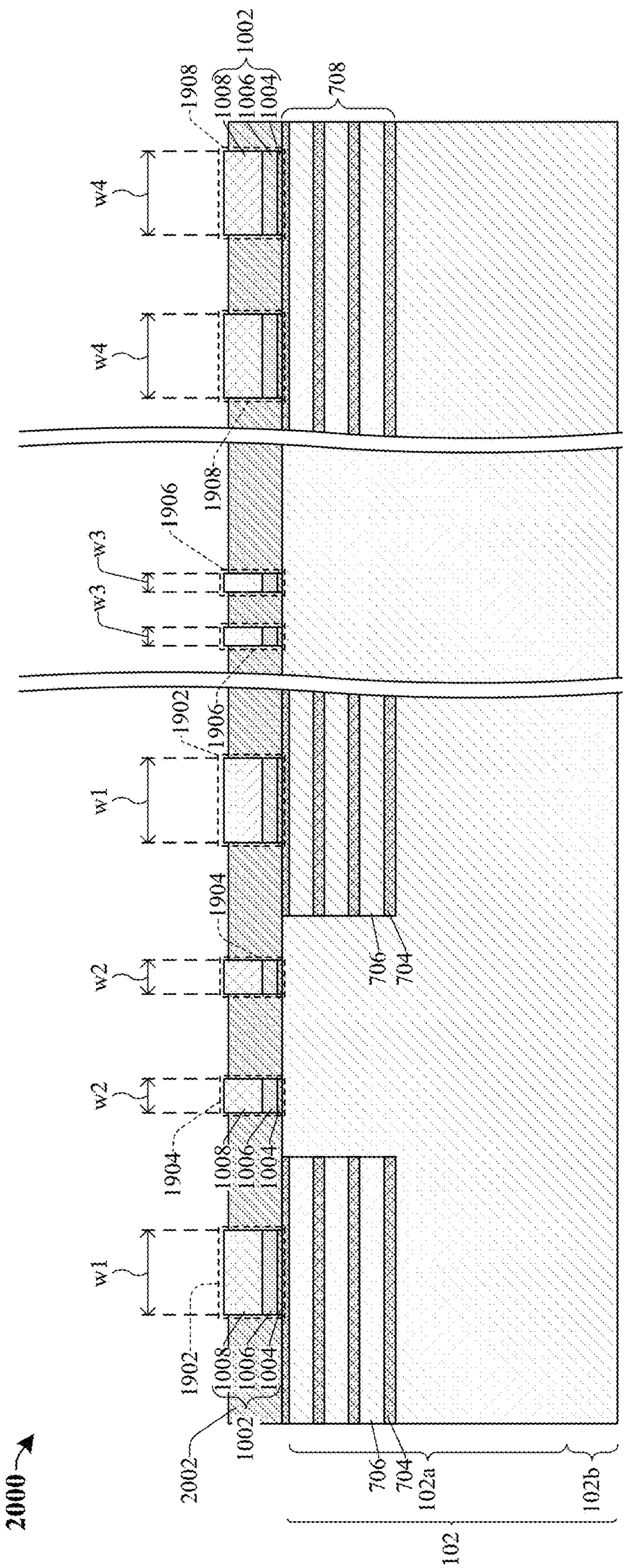

As shown in cross-sectional view 2000 of FIG. 20, a bottom anti-reflectant coating (BARC) layer 2002 is formed over the semiconductor substrate 102. In some embodiments, a process for forming the BARC layer 2002 may include: depositing a BARC film over the semiconductor substrate 102 and laterally between the stacks of masking layers 1902-1908; and performing an etch back process on the BARC film, thereby forming the BARC layer 2002. In some embodiments, the etch back process is performed in such a manner that a top surface of the upper masking layer 1008 is disposed vertically above a top surface of the BARC layer 2002. In yet further embodiments, after performing the etch back process, a removal process (e.g., a wet etch process and/or a dry etch process) may be performed to remove the mandrel structures (1010 of FIG. 19) of the first and fourth stacks of masking layers 1902, 1908. In other embodiments, at least a portion of the mandrel structures (1010 of FIG. 19) may be removed by the etch back process.

Figure 21:
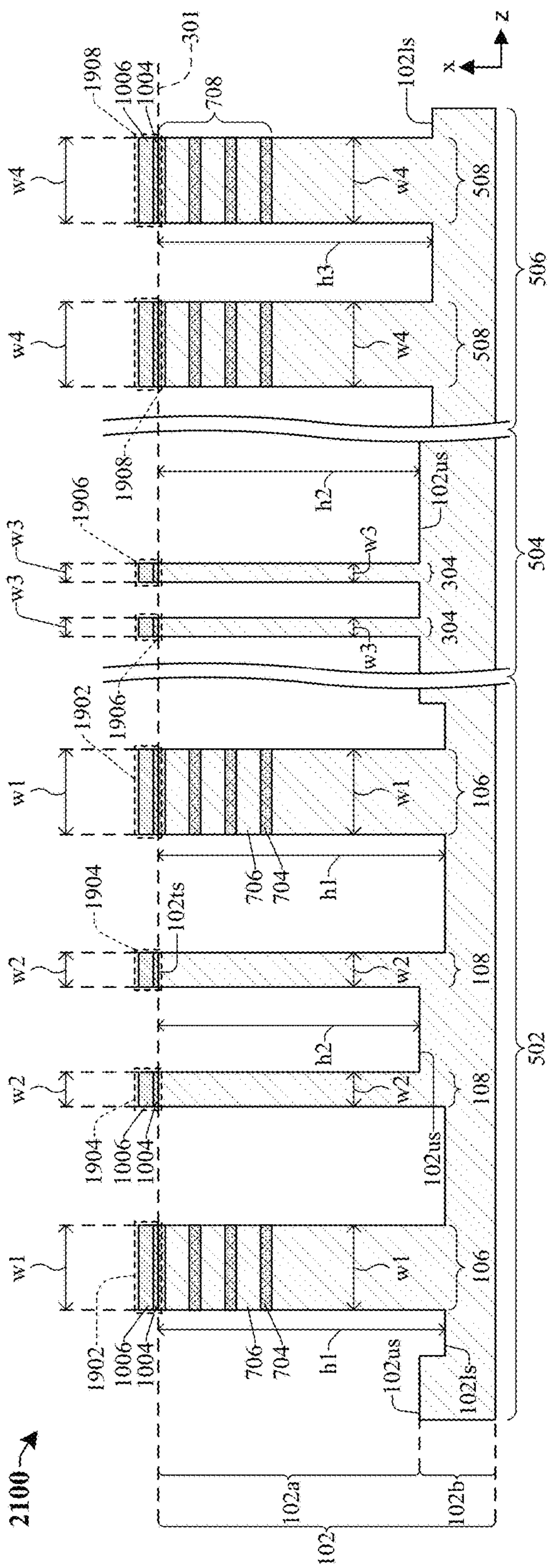

As shown in cross-sectional view 2100 of FIG. 21, a patterning process is performed on the semiconductor substrate 102 and the stack of semiconductor layers 708 according to the stacks of masking layers 1902-1908. This, in turn, forms first fin structures 106 and second fin structures 108 within the first device region 502, third fin structures 304 within the second device region 504, and fourth fin structures 508 within the third device region 506 as illustrated in FIG. 21. Further, the patterning process may remove the upper masking layer (1008 of FIG. 20). Furthermore, by virtue of the semiconductor substrate 102 being patterned according to the stacks of masking layers 1902-1908, each of the aforementioned fin structures may have a thickness corresponding to an overlying stack of masking layers. For example, the first stack of masking layers 1902 overlies the first fin structures 106 and the first fin structures 106 are formed such that they have the first width w1. Thus, the patterning process is performed in such a manner that the first fin structures 106 each have the first width w1, the second fin structures 108 each have the second width w2, the third fin structures 304 each have the third width w3, and the fourth fin structures 508 each have the fourth width w4.

After performing the patterning process, the semiconductor substrate 102 comprises a top region **102*a* that vertically extends from a bottom region 102*b*. Further, the semiconductor substrate 102 has an upper surface 102*us* that is disposed above a lower surface 1021*s*. In some embodiments, the upper surface 102*us* defines a topmost surface of the bottom region 102*b* of the semiconductor substrate 102. In some embodiments, a top surface 102*ts* of the semiconductor substrate 102 defines a topmost surface of the top region 102*a* of the semiconductor substrate 102. In some embodiments, the top surface 102*ts* of the semiconductor substrate 102 is aligned with a substantially straight line 301**.

A first height h1 of the first fin structures 106 and the stack of semiconductor layers 708 is defined between the lower surface **1021*s* and the substantially straight line 301. Further, a second height h2 of the second and third fin structures 108, 304 is defined between the upper surface 102*us* and the substantially straight line 301. A third height h3 of the fourth fin structures 508 and the stack of semiconductor layers 708 is defined between the lower surface 1021*s* within the third device region 506 and the substantially straight line 301. By virtue of the relatively large widths of the first and/or fourth fin structures 106, 508 (e.g., greater than widths of the second and/or third fin structures 108, 304), the first and third heights h1, h3 are respectively greater than the second height h2. This may be because of a removal of dielectric material (e.g., over-etching of the upper masking layer 1008 of FIG. 20) in regions laterally adjacent to the first and/or fourth fin structures 106, 508 (e.g., see FIGS. 30-34). In some embodiments, in which the fourth width w4 of the fourth fin structures 508 is less than the first width w1 of the first fin structures 106, the third height h3 is less than the first height h1. In yet further embodiments, in which the fourth width w4 of the fourth fin structures 508 is greater than the first width w1 of the first fin structures 106, the third height h3 is greater than the first height h1. In some embodiments, a difference between the first height h1 and the second height h2 (e.g., h1−h2**) may be within a range of about 5 to 30 nanometers.

Figure 22A:
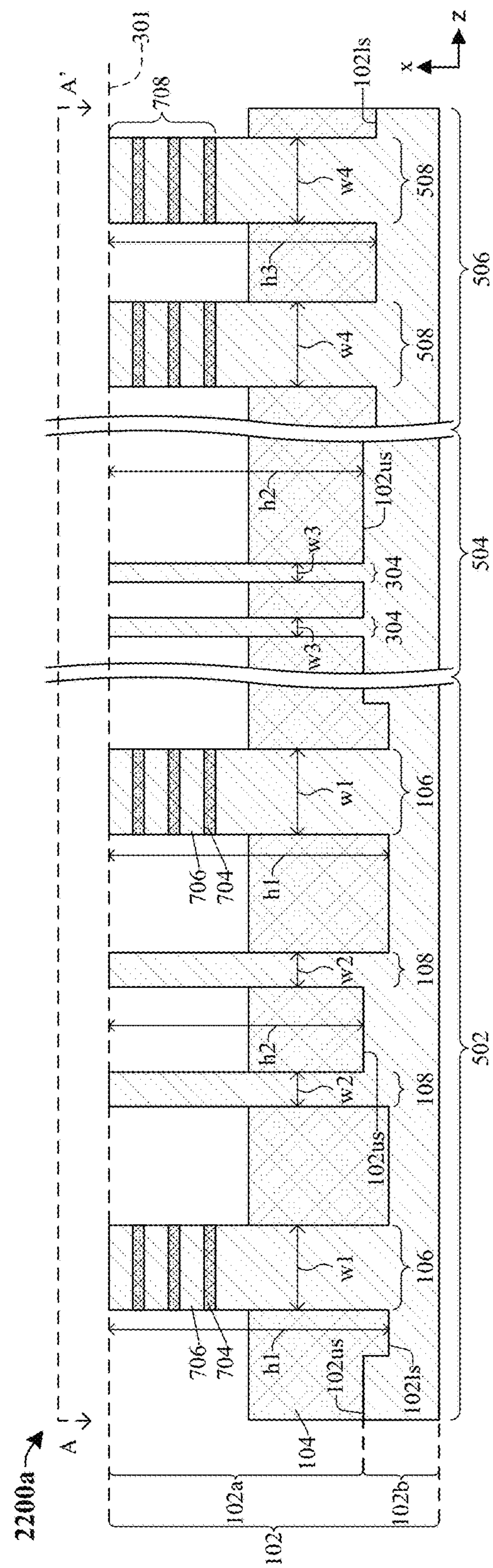
Figure 22B:
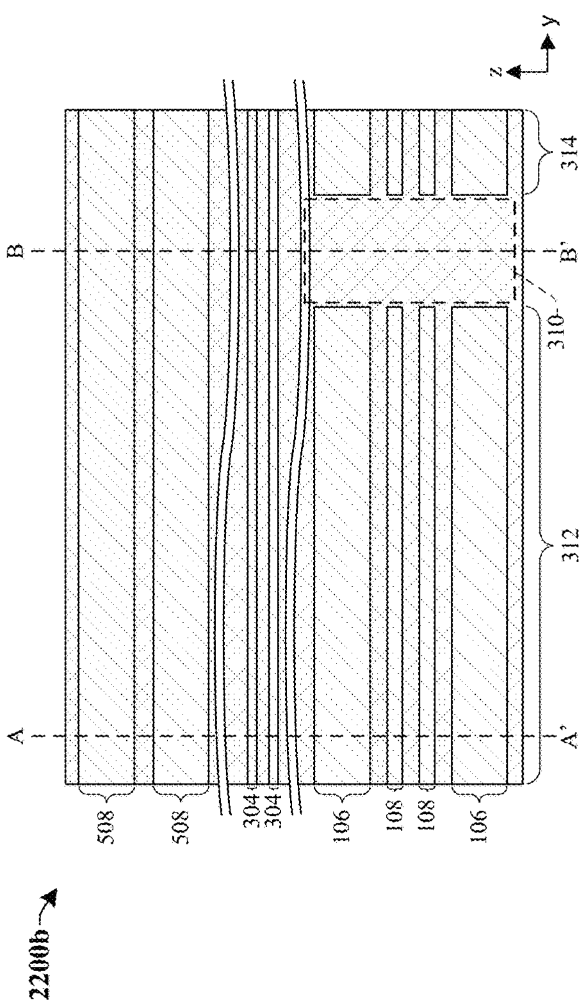
Figure 22C:
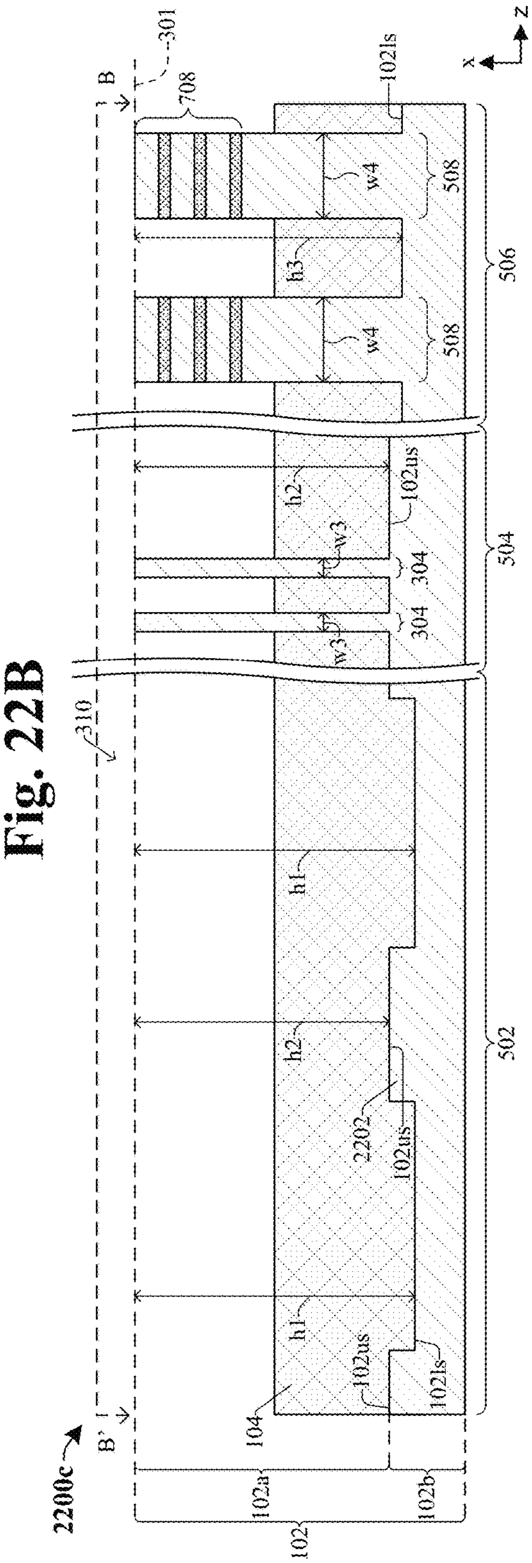

As shown in the various views of FIGS. 22A-22C, a removal process is performed to remove the lower masking layer (1004 of FIG. 21) and the middle masking layer (1006 of FIG. 21). Further, as illustrated in FIGS. 22B-22C, an isolation patterning process is performed on the structure of FIG. 21 to define an isolation region 310 laterally within the first device region 502. Thereafter, an isolation structure 104 is formed over the semiconductor substrate 102. FIG. 22A illustrates some embodiments of a cross-sectional view **2200*a* taken along the line A-A' of top view 2200*b* of FIG. 22B. Further, FIG. 22C illustrates some embodiments of a cross-sectional view 2200*c* taken along the line B-B' of the top view 2200*b* of FIG. 22**B.

In some embodiments, the removal process includes performing a wet etch process and/or a dry etch process to remove the lower masking layer (1004 of FIG. 21) and the middle masking layer (1006 of FIG. 21). Further, the removal process may include performing an etch process and/or a planarization process (e.g., a chemical mechanical polishing (CMP) process) into the semiconductor substrate 102 and/or the stack of semiconductor layers 708 to reduce a height of the second and third fin structures 108, 304 and/or to remove a topmost first semiconductor layer 704 of the stack of semiconductor layers 708.

Further, as illustrated in the top view 2200*b* of FIG. 22B and the cross-sectional view 2200*c* of FIG. 22C, the isolation patterning process defines the isolation region 310 laterally within the first device region 502. In some embodiments, the isolation patterning process may include forming a masking layer over the semiconductor substrate 102 and exposing unmasked regions of the semiconductor substrate 102 to one or more etchants (e.g., see FIGS. 35A-35B through 39A-39B). This, in part, removes the first and second fin structures 106, 108 from the isolation region 310. As illustrated by the cross-sectional view 2200*c* of FIG. 22C, a remnant 2202 of the second fin structures 108 remains within the isolation region 310 after performing the isolation patterning process. In some embodiments, the remnant 2202 of the second fin structures 108 remains due to a difference in widths and/or semiconductor materials of the first and second fin structures 106, 108.

Furthermore, as illustrated by the various views of FIGS. 22A-22C, after performing the isolation patterning process, the isolation structure 104 is formed over the semiconductor substrate 102. The isolation structure 104 may, for example, be formed by PVD, CVD, ALD, thermal oxidation, or another suitable growth or deposition process. In some embodiments, the isolation structure 104 may, for example, be a shallow trench isolation (STI) structure and/or may be or comprise silicon dioxide, silicon nitride, silicon carbide, another suitable dielectric material, or any combination of the foregoing.

Figure 23A:
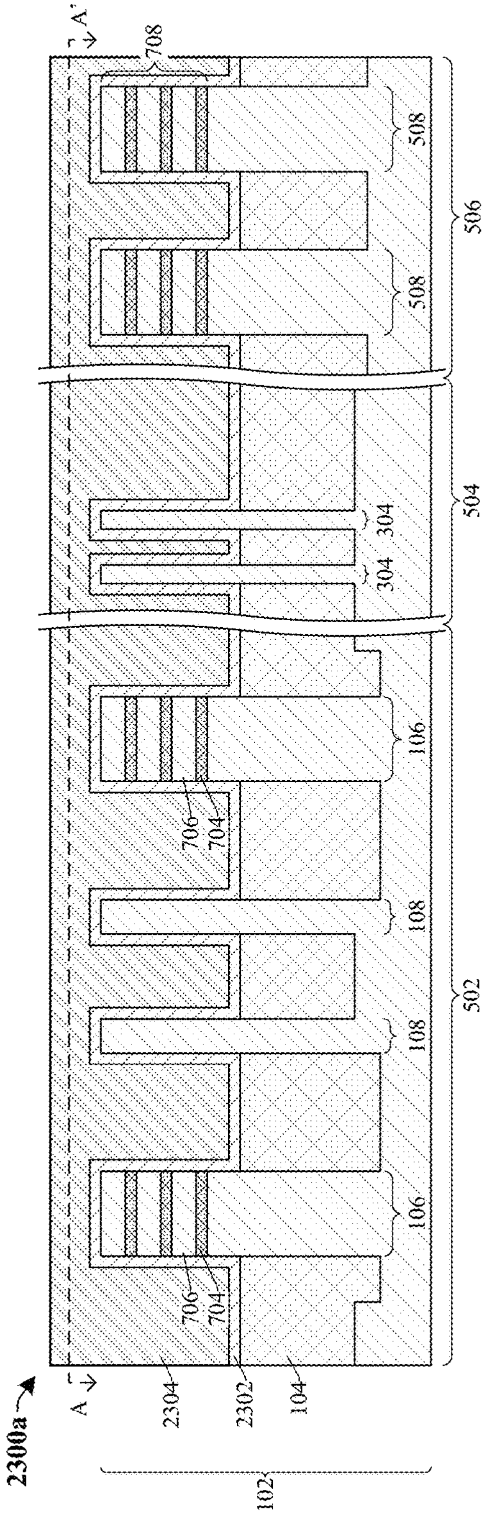
Figure 23B:
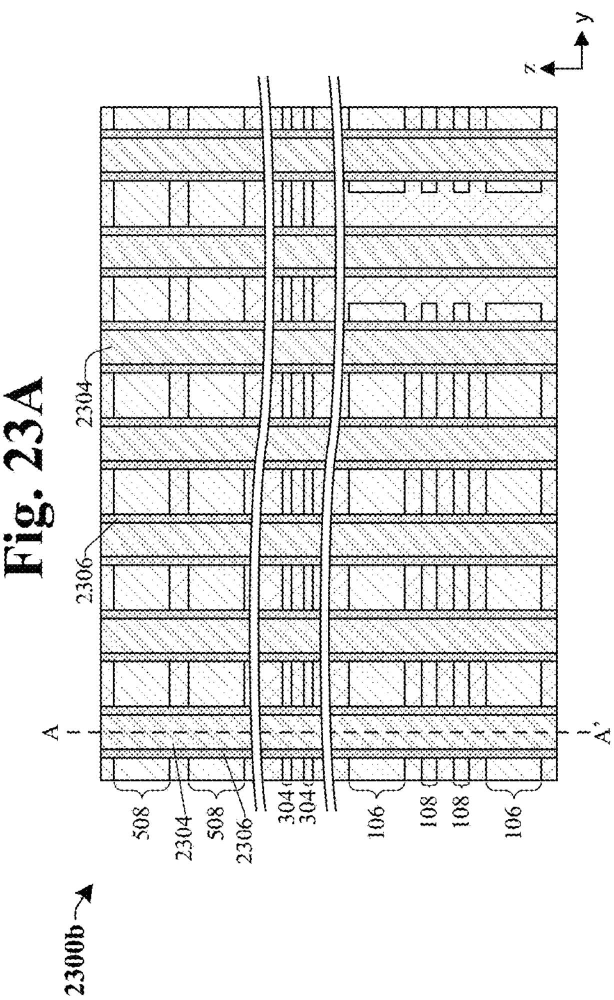

As shown in the cross-sectional view 2300*a* of FIG. 23A and the top view 2300*b* of FIG. 23B, a dummy sidewall spacer layers 2302 and dummy gate structures 2304 are formed over the isolation structure 104, the first fin structures 106, the second fin structures 108, the third fin structures 304, the fourth fin structures 508, and the stack of semiconductor layers 708. FIG. 23A illustrates some embodiments of a cross-sectional view 2300*a* taken along the line A-A' of top view 2300*b* of FIG. 23B. The dummy sidewall spacer layers 2302 separate the dummy gate structures 2304 from the isolation structure 104, the first fin structures 106, the second fin structures 108, the third fin structures 304, the fourth fin structures 508, and the stack of semiconductor layers 708, as illustrated in FIG. 23A.

In some embodiments, a process for forming the dummy sidewall spacer layers 2302 and the dummy gate structures 2304 includes depositing a dummy dielectric layer (not shown) covering the isolation structure 104, the first fin structures 106, the second fin structures 108, the third fin structures 304, the fourth fin structures 508, and the stack of semiconductor layers 708. The dummy dielectric layer may be deposited as a conformal layer. The dummy dielectric layer may, for example, be or comprise an oxide (e.g., silicon dioxide), silicon nitride, silicon carbide, a high-k dielectric material, another suitable dielectric material, or any combination of the foregoing. The dummy dielectric layer be deposited by, for example, CVD, PVD, ALD, some other deposition process, or a combination of the foregoing. A dummy gate material layer (not shown) is then deposited on the dummy dielectric layer. The dummy gate material layer may be deposited by, for example, CVD, PVD, ALD, some other deposition process, or a combination of the foregoing.

Thereafter, a patterned masking layer (not shown) is formed over the dummy gate material layer. In some embodiments, the patterned masking layer may comprise a stack of dielectric materials. For example, the patterned masking layer may comprise a first dielectric layer (e.g., silicon dioxide), a second dielectric layer (e.g., silicon nitride) disposed over the first dielectric layer, and a third dielectric layer (e.g., silicon dioxide) disposed over the second dielectric layer. An etching process is then performed to remove unmasked portions of the dummy gate material layer and the dummy dielectric layer, thereby forming the dummy sidewall spacer layers 2302 and the dummy gate structures 2304.

Further, as illustrated in the cross-sectional view 2300*a* of FIG. 23A and the top view 2300*b* of FIG. 23B, sidewall spacer structures 2306 are formed along sidewalls of the dummy gate structures 2304. In some embodiments, the sidewall spacer structures 2306 may, for example, be or comprise silicon nitride, silicon carbide, another suitable dielectric material, or the like.

Figure 24A:
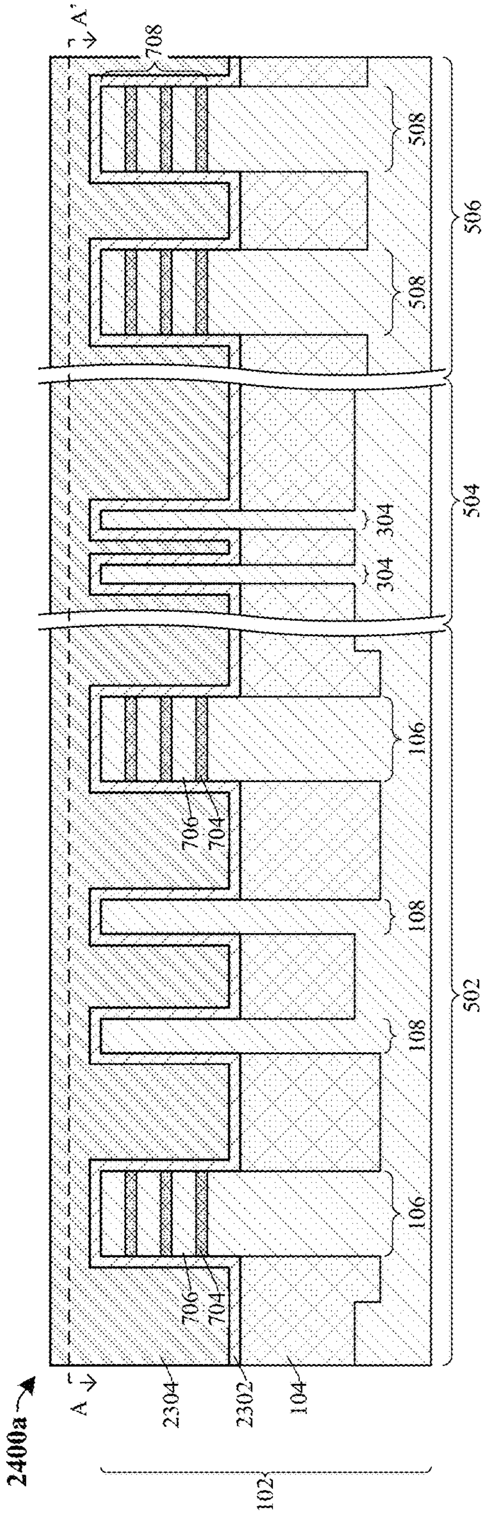
Figure 24B:
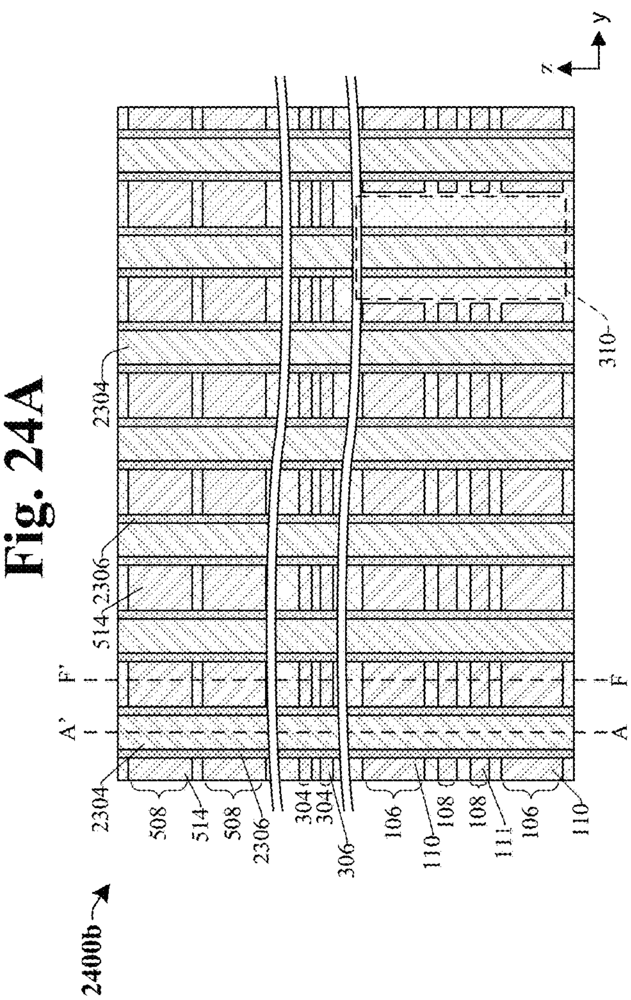
Figure 24C:
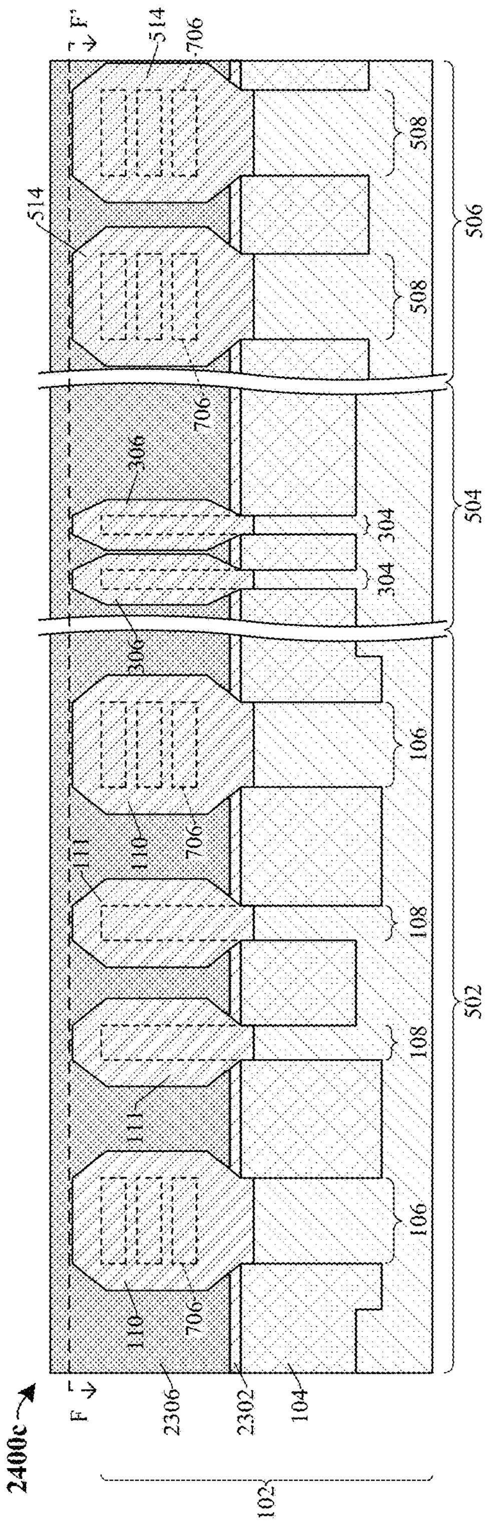

As shown in the various views of FIGS. 24A-24C, first source/drain regions 110, second source/drain regions 111, third source/drain regions 306, and fourth source/drain regions 514 are formed over the semiconductor substrate 102. FIG. 24A illustrates some embodiments of a cross-sectional view 2400*a* taken along the line A-A' of top view 2400*b* of FIG. 24B. Further, FIG. 24C illustrates some embodiments of a cross-sectional view 2400*c* taken along the line F-F' of the top view 2400*b* of FIG. 24B.

In some embodiments, a process for forming the first, second, third, and fourth source/drain regions 110, 111, 306, 514 includes first performing a removal process into the first, second, third, and fourth fin structures 106, 108, 304, 508 such that sections of the aforementioned fin structures are recessed below an upper surface of the isolation structure 104 (see, e.g., FIG. 24C). Further, the removal process removes the stack of semiconductor layers 708 from above the sections of the aforementioned fin structures. Secondly, a first epitaxial process is performed to form the first, second, third, and fourth source/drain regions 110, 111, 306, 514. In some embodiments, the first epitaxial process may include performing one or more epitaxial processes. For example, the one or more epitaxial processes may include performing an epitaxial processes for each of the first, second, third, and fourth source/drain regions 110, 111, 306, 514 (i.e., performing at least fourth epitaxial processes). In further embodiments, the one or more epitaxial processes may, for example, respectively be VPE, LPE, MBE, some other epitaxial process, or a combination of the foregoing. Further, the one or more epitaxial processes may in-situ dope the corresponding source/drain regions with first doping type dopants (e.g., p-type dopants, such as boron atoms) or second doping type dopants (e.g., n-type dopants, such as phosphorus atoms).

Figure 25A:
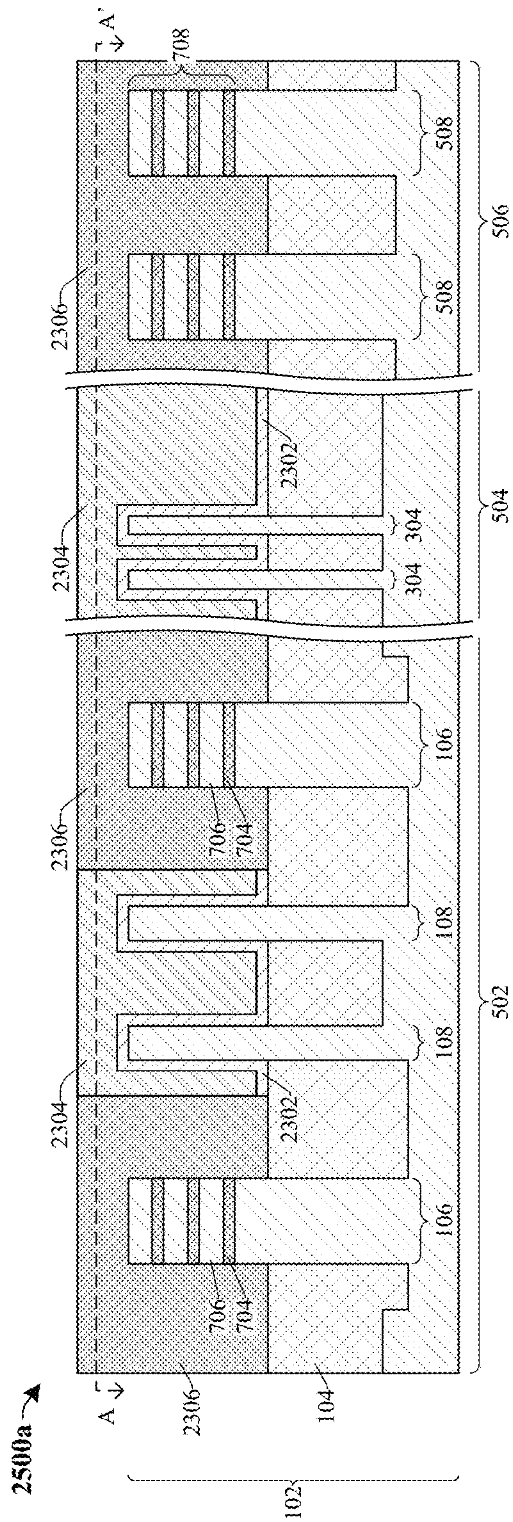
Figure 25B:
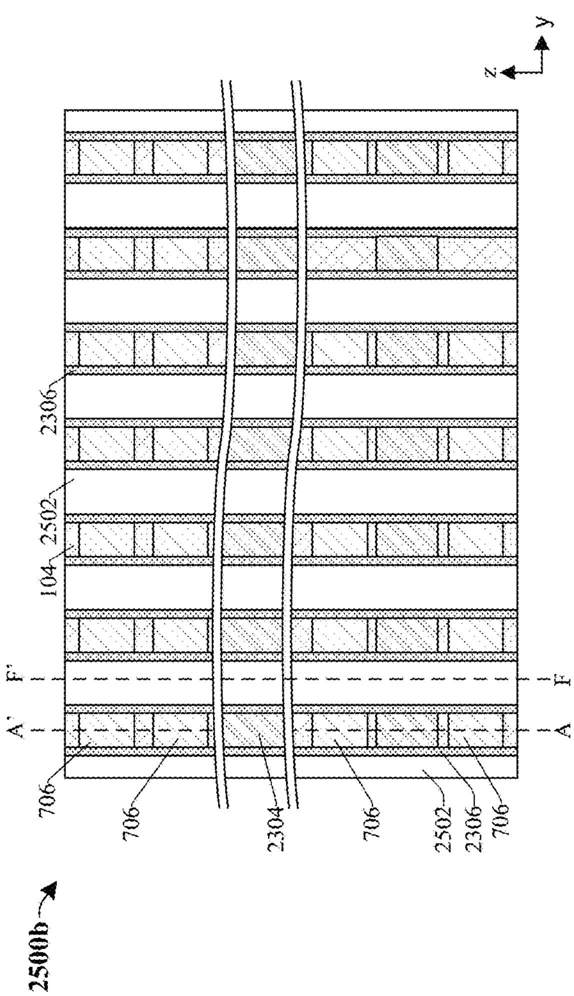
Figure 25C:
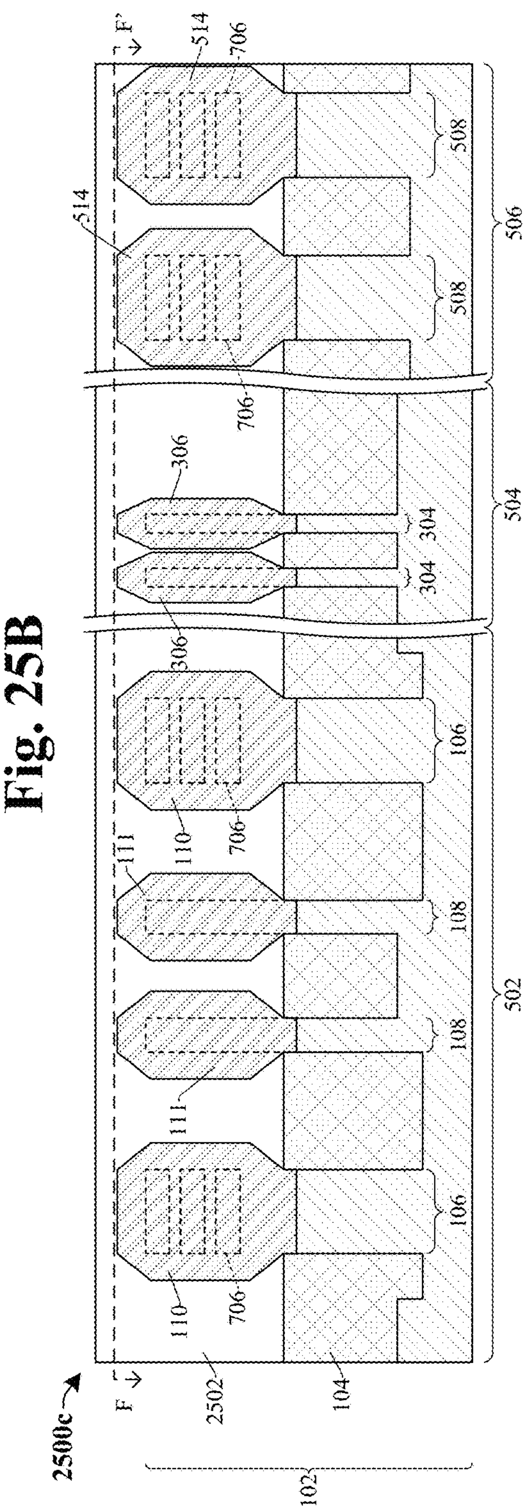

As shown in the various views of FIGS. 25A-25C, a removal process is performed on the dummy gate structures 2304 and the dummy sidewall spacer layers 2302 to expose segments of the first fin structure 106 and the fourth fin structures 508, thereby exposing the stack of semiconductor layers 708. FIG. 25A illustrates some embodiments of a cross-sectional view 2500*a* taken along the line A-A' of top view 2500*b* of FIG. 25B. Further, FIG. 25C illustrates some embodiments of a cross-sectional view 2500*c* taken along the line F-F' of the top view 2500*b* of FIG. 25B.

In various embodiments, before performing the removal process, an inter-level dielectric (ILD) layer 2502 is formed over each of the first, second, third, and fourth source/drain regions 110, 111, 306, 514. The ILD layer 2502 may be formed by PVD, CVD, ALD, or another suitable deposition or growth process. Further, the ILD layer 2502 may, for example, be or comprise silicon dioxide, a low-k dielectric material, an extreme low-k dielectric material, another suitable dielectric material, or any combination of the foregoing. Subsequently, forming the ILD layer 2502 may include performing a planarization process into the ILD layer 2502 until an upper surface of the dummy gate structures 2304 is reached. In such embodiments, an upper surface of the ILD layer 2502 may be co-planar with an upper surface of the dummy gate structures 2304.

In some embodiments, the removal process illustrated in the various views of FIGS. 25A-25C includes performing a wet etch process and/or a dry etch process. In some embodiments, the removal process includes: forming a masking layer (not shown) over the semiconductor substrate 102; exposing unmasked regions of the dummy gate structures 2304 and the dummy sidewall spacer layers 2302 to one or more etchants; and removing the masking layer. Further, the removal process is performed in such a manner that segments of the dummy gate structures 2304 and the dummy sidewall spacer layers 2302 remain over the second and third fin structures 108, 304. In yet further embodiments, the removal process may entirely remove the dummy gate structures 2304 and the dummy sidewall spacer layers 2302, such that the second and third fin structures 108, 304 are exposed after performing the removal process (not shown).

Figure 26:
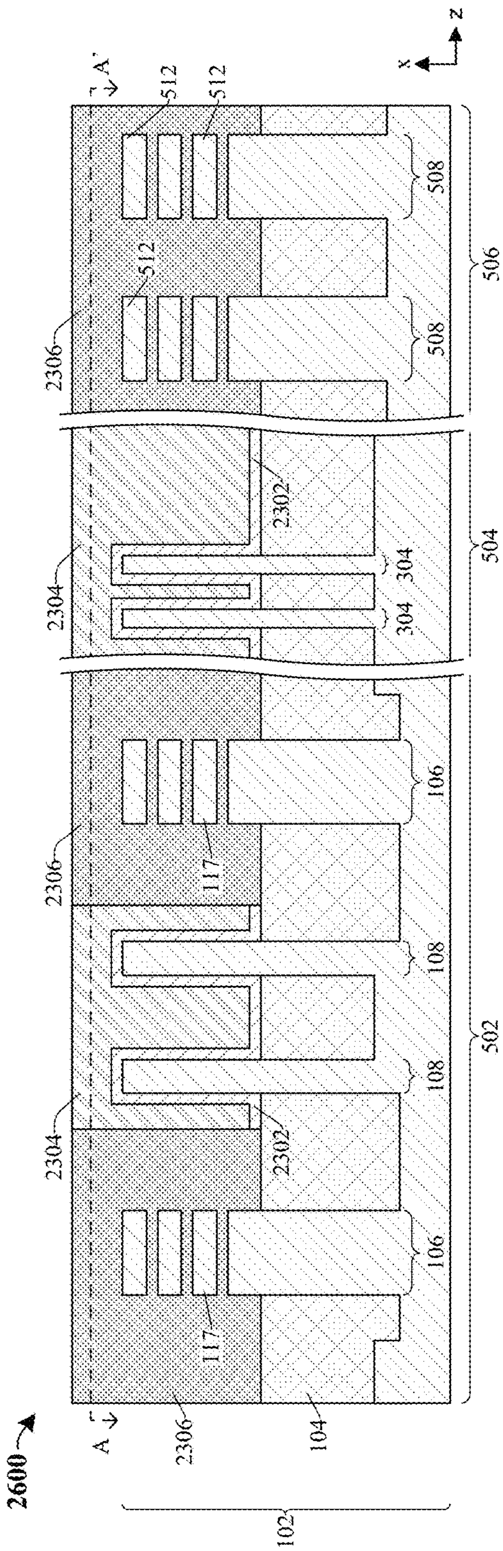

As shown in the cross-sectional view 2600 of FIG. 26, a first plurality of nanostructures 117 are formed over the first fin structures 106 and a second plurality of nanostructures 512 are formed over the fourth fin structures 508. The first plurality of nanostructures 117 are vertically stacked over one another and the second plurality of nanostructures 512 are vertically stacked over one another. In some embodiments, the first plurality of nanostructures 117 is formed in such a manner that each nanostructure 117 comprises a same width as an underlying first fin structure 106. In further embodiments, the second plurality of nanostructures 512 is formed in such a manner that each nanostructure 512 comprises a same width as an underlying fourth fin structure 508.

In some embodiments, a process for forming the first and second plurality of nanostructures 117, 512 comprises selectively removing the first semiconductor layer (704 of FIGS. 25A-25C) of the stack of semiconductor layers (708 of FIGS. 25A-25C), thereby forming the first and second plurality of nanostructures 117, 512. The first semiconductor layer (704 of FIGS. 25A-25C) may be removed by performing an etching process (e.g., a wet etch) that selectively etches the first semiconductor layer (704 of FIGS. 25A-25C) against the second semiconductor layer (706 of FIGS. 25A-25C). In some embodiments, the first semiconductor layer (704 of FIGS. 25A-25C) may be selectively removed by using a wet etchant, such as, ammonium hydroxide ($NH_4OH$), tetramethylammonium hydroxide (TMAH) solution, ethylenediamine pyrocatechol (EDP), potassium hydroxide (KOH) solution, or the like. In some embodiments, after forming the first and second plurality of nanostructures 117, 512, a removal process is performed to remove the dummy gate structures 2304 and the dummy sidewall spacer layers 2302 from over the second fin structures 108 and the third fin structures 304 (not shown).

Figure 27A:
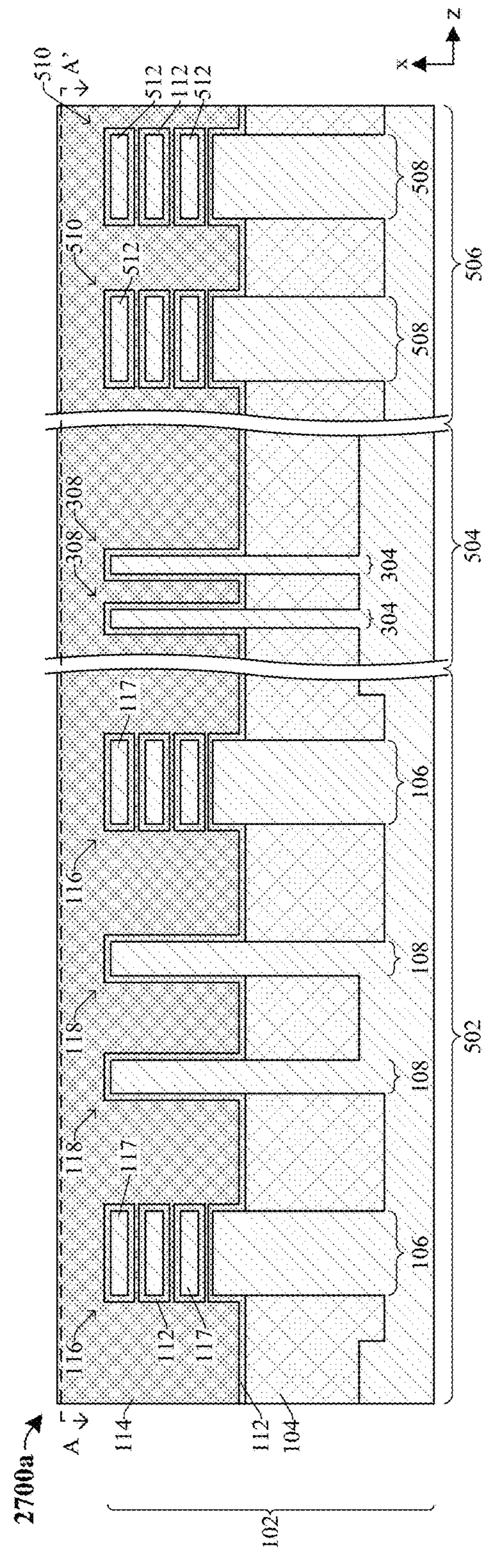
Figure 27B:
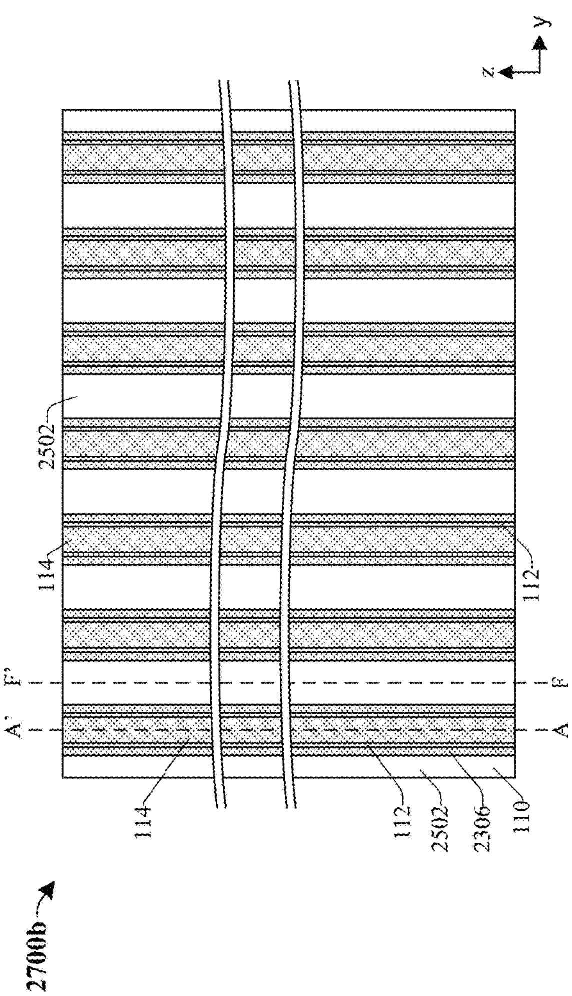
Figure 27C:
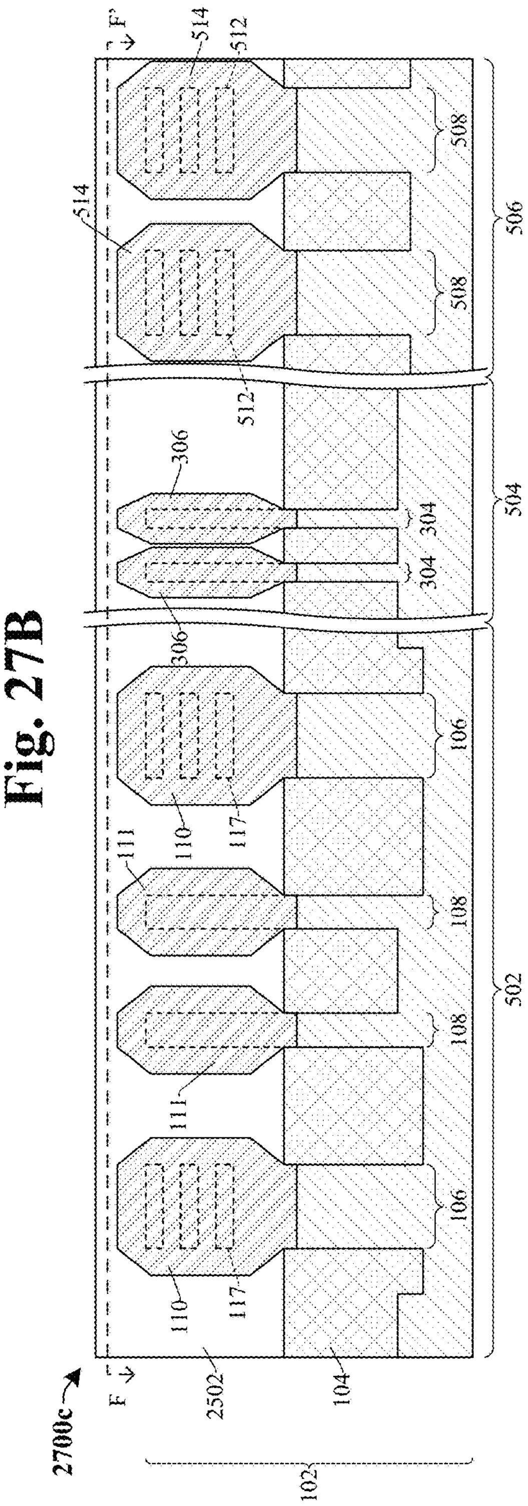

As shown in the various views of FIGS. 27A-27C, a gate dielectric layer 112 and gate electrodes 114 are formed over the semiconductor substrate 102, thereby forming a first plurality of NSFETs 116, a first plurality of finFETs 118, a second plurality of finFETs 308, and a second plurality of NSFETs 510. FIG. 27A illustrates some embodiments of a cross-sectional view 2700*a* taken along the line A-A' of top view 2700*b* of FIG. 27B. Further, FIG. 27C illustrates some embodiments of a cross-sectional view 2700*c* taken along the line F-F' of the top view 2700*b* of FIG. 27B. The gate dielectric layer 112 separates the gate electrodes 114 from the first, second, third, and fourth fin structures 106, 108, 304, 508 and the first and second plurality of nanostructures 117, 512.

Further, it will be appreciated that in some instances, each NSFETs 116 may be also known as and/or referred to as, for example, a gate-all-around FET (GAAFET), a gate-surrounding FET, a multi-bridge channel FET (MBCFET), a nanowire FET, a nanoring FET, or the like.

In some embodiments, a process for forming the gate dielectric layer 112 and the gate electrodes 114 includes depositing (e.g., CVD, PVD, ALD, another suitable deposition process, etc.) a gate dielectric material (not shown) around each of the nanostructures 117, 512, and on exposed portions of the first, second, third, and fourth fin structures 106, 108, 304, 508 and the isolation structure 104. The gate dielectric material may be deposited as a conformal layer. The gate dielectric material may, for example, be or comprise an oxide (e.g., silicon dioxide), a high-k dielectric material, some other dielectric material, or any combination of the foregoing. The gate dielectric material may be multi-layered, for example, comprising one or more interfacial layers.

Thereafter, a gate electrode material (not shown) is deposited on the gate dielectric material and around each of the nanostructures 117, 512. The gate electrode material may be or comprise, for example, polysilicon (e.g., doped polysilicon), a metal (e.g., Al, W, etc.), some other conductive material, or a combination of the foregoing. The gate electrode material may be multi-layered, for example, comprising a work function metal layer (e.g., TiN, TaN, or the like), a metal fill layer (e.g., W), etc. In some embodiments, the gate electrode material may be deposited by, for example, CVD, PVD, ALD, electrochemical plating, electroless plating, some other deposition process, or a combination of the foregoing. A planarization process (e.g., CMP) is then performed on the gate electrode material and the gate dielectric material to remove upper portions of the gate electrode material and the gate dielectric material, thereby forming the gate electrodes 114 and the gate dielectric layer 112. The planarization process may co-planarize upper surfaces of the ILD layer 2502, the gate electrodes 114, the gate dielectric layer 112, and the sidewall spacer structures 2306.

Figure 28A:
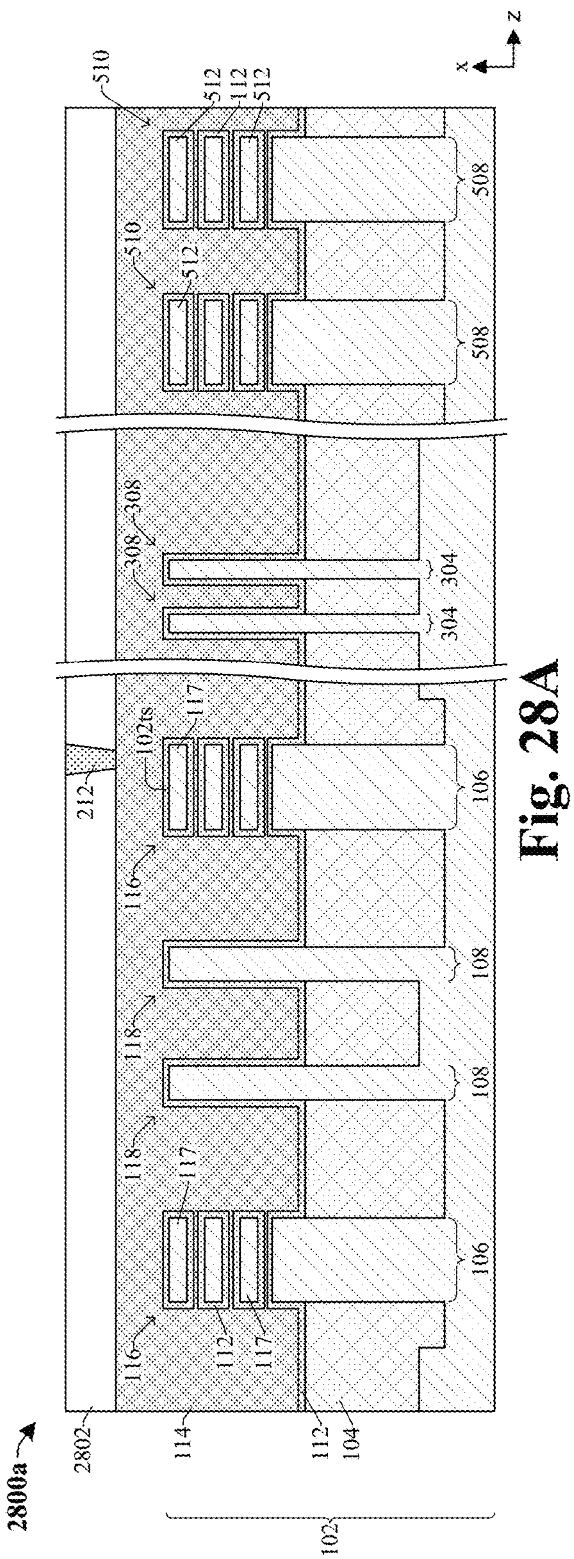
Figure 28B:
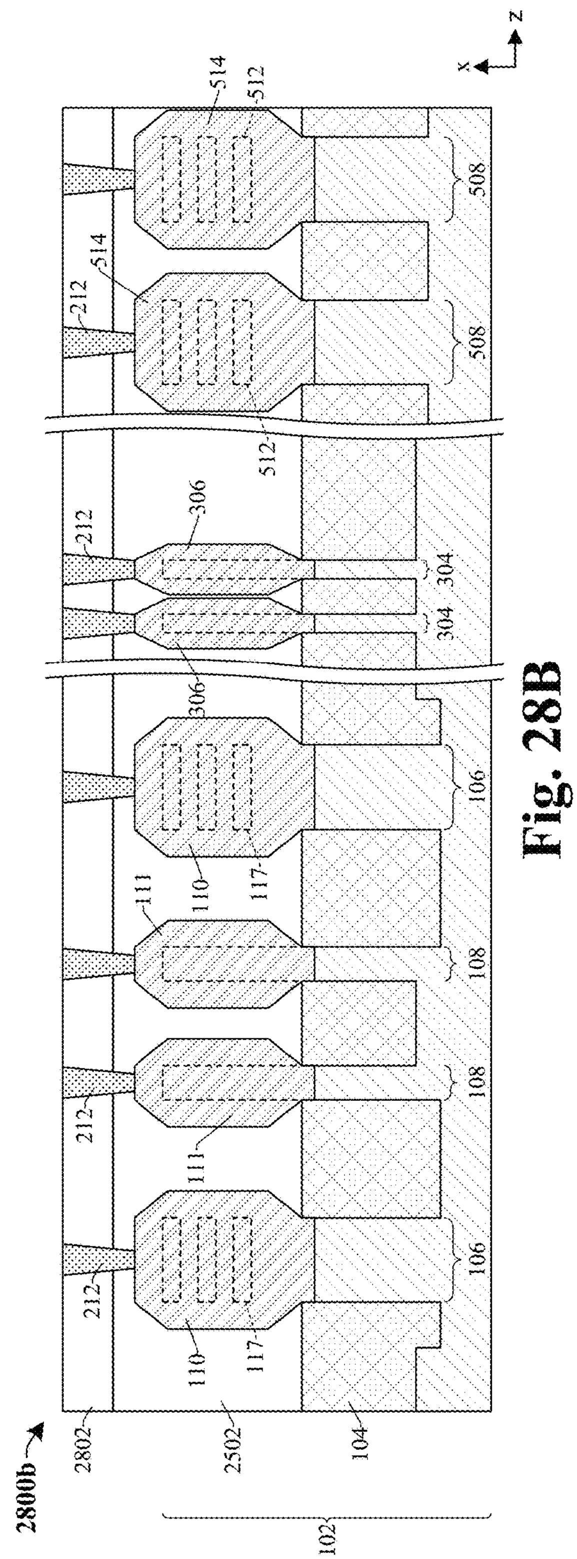

As shown in the cross-sectional views 2800*a* and 2800*b* of FIGS. 28A and 28B, an upper ILD layer 2802 is formed over the gate electrodes 114 and the ILD layer 2502. Subsequently, a plurality of conductive vias 212 are formed in the ILD layer 2502 over the gate electrodes 114 and over each of the first, second, third, and fourth source/drain regions 110, 111, 306, 514. In some embodiments, the conductive vias 212 may, for example, be or comprise aluminum, copper, tungsten, titanium nitride, tantalum nitride, another suitable conductive material, or any combination of the foregoing. In yet further embodiments, the conductive vias 212 may be formed, for example, be a single damascene process or another suitable process. The upper ILD layer 2802 may be deposited by, for example, PVD, CVD, ALD, or another suitable deposition or growth process. In yet further embodiments, the upper ILD layer 2802 may, for example, be or comprise silicon dioxide, a low-k dielectric material, an extreme low-k dielectric material, another suitable dielectric material, or any combination of the foregoing.

Figure 29:
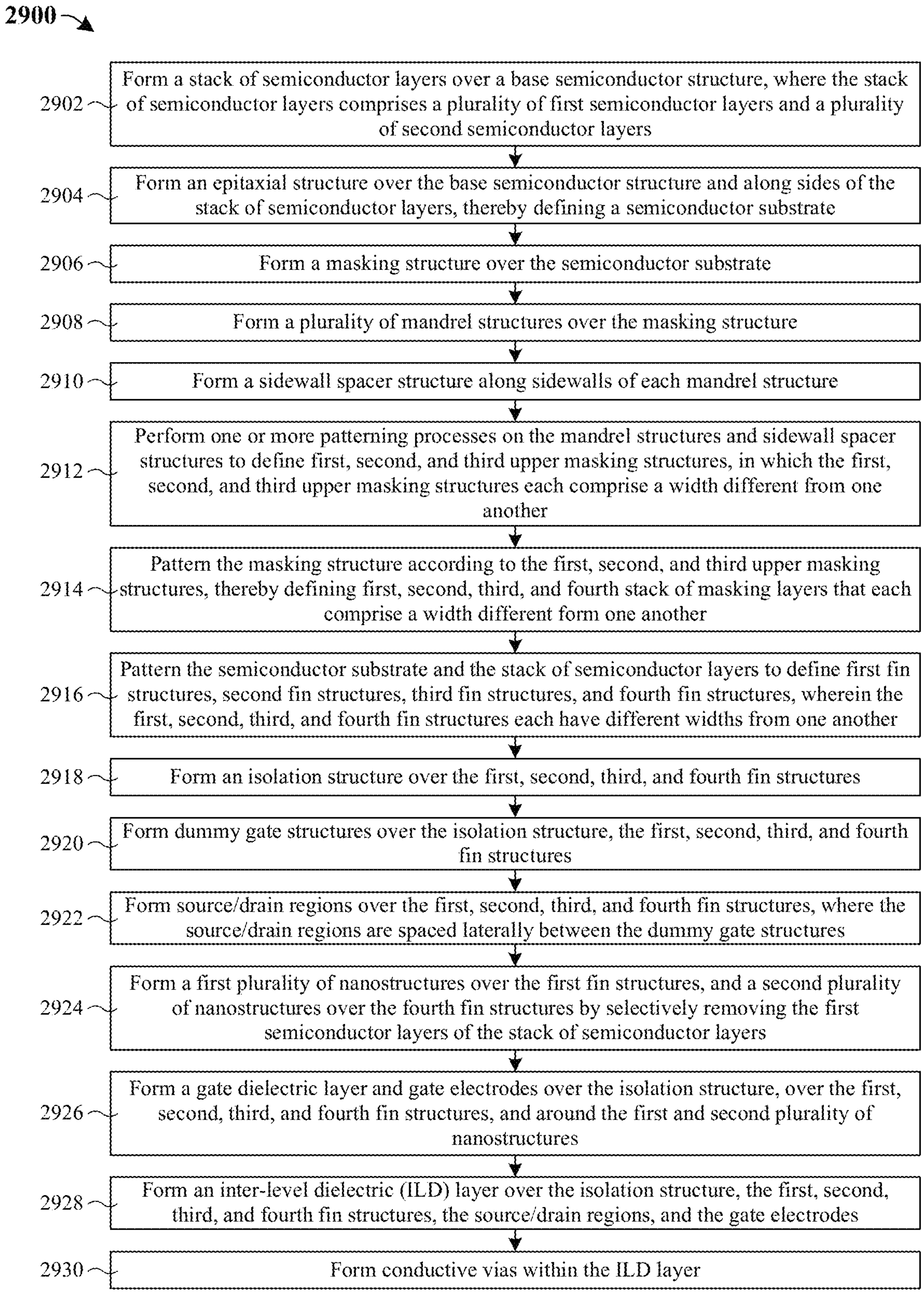
FIG. 29 illustrates a flowchart of some embodiments of a method for forming an IC comprising a plurality of fin structures having different widths, where the fin structures are disposed laterally adjacent to one another on a same substrate.

FIG. 29 illustrates a flowchart 2900 of some embodiments of a method for forming an IC comprising a plurality of fin structures having different widths that are laterally adjacent to one another on a same substrate according to the present disclosure. While the flowchart 2900 of FIG. 29 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2902, a stack of semiconductor layers is formed over a base semiconductor substrate, where the stack of semiconductor layers comprises a plurality of first semiconductor layers and a plurality of second semiconductor layers. FIG. 7 illustrates a cross-sectional view 700 of some embodiments corresponding to act 2904.

At act 2904, an epitaxial structure is formed over the base semiconductor structure and along sides of the stack of semiconductor layers, thereby defining a semiconductor substrate. FIGS. 8 and 9 illustrate cross-sectional views 800 and 900 of some embodiments corresponding to act 2904.

At act 2906, a masking structure is formed over the semiconductor substrate. FIG. 10 illustrates a cross-sectional view 1000 of some embodiments corresponding to act 2906.

At act 2908, a plurality of mandrel structures is formed over the masking structure. FIG. 10 illustrates a cross-sectional view 1000 of some embodiments corresponding to act 2908.

At act 2910, a sidewall spacer structure is formed along sidewalls of each mandrel structure. FIGS. 11 and 12 illustrate cross-sectional views 1100 and 1200 of some embodiments corresponding to act 2910.

At act 2912, one or more patterning processes are performed on the mandrel structures and sidewall spacer structures to define first, second, and third upper masking structures. The first, second, and third upper masking structures each comprise a width different from one another. FIGS. 13-18 illustrate cross-sectional views 1300-1800 of some embodiments corresponding to act 1912.

At act 2914, the masking structure is patterned according to the first, second, and third upper masking structures, thereby defining first, second, third, and fourth stack of masking layers that each comprise a width different from one another. FIG. 19 illustrates a cross-sectional view 1900 of some embodiments corresponding to act 2914.

At act 2916, the semiconductor substrate and the stack of semiconductor layers are patterned to define first fin structures, second fin structures, third fin structures, and fourth fin structures. The first, second, third, and fourth fin structures each have different widths from one another. FIG. 21 illustrates a cross-sectional view 2100 of some embodiments corresponding to act 2916.

At act 2918, an isolation structure is formed over the first, second, third, and fourth fin structures. FIGS. 22A-22C illustrate various views of some embodiments corresponding to act 2918.

At act 2920, dummy gate structures are formed over the isolation structure, the first, second, third, and fourth fin structures. FIGS. 23A and 23B illustrate various views of some embodiments corresponding to act 2920.

At act 2922, source/drain regions are formed over the first, second, third, and fourth fin structures. The source/drain regions are spaced laterally between the dummy gate structures. FIGS. 24A-24C illustrate various views of some embodiments corresponding to act 2922.

At act 2924, a first plurality of nanostructures is formed over the first fin structures, and a second plurality of nanostructures is formed over the fourth fin structures by selectively removing the first semiconductor layers of the stack of semiconductor layers. FIGS. 25A-25C and 26 illustrate various views of some embodiments corresponding to act 2924.

At act 2926, a gate dielectric layer and gate electrodes are formed over the isolation structure, the first, second, third, and fourth fin structures, and around the first and second plurality of nanostructures. FIGS. 27A-27C illustrate various views of some embodiments corresponding to act 2926.

At act 2928, an inter-level dielectric (ILD) layer is formed over the isolation structure, the first, second, third, and fourth fin structures, the source/drain regions, and the gate electrodes. FIGS. 28A-28B illustrate cross-sectional views 2800*a* and 2800*b* of some embodiments corresponding to act 2928.

At act 2930, conductive vias are formed within the ILD layer. FIGS. 28A-28B illustrate cross-sectional views 2800*a* and 2800*b* of some embodiments corresponding to act 2930.

FIGS. 30-34 illustrate cross-sectional views 3000-3400 of some embodiments of a second method for forming an IC comprising a plurality of fin structures having different widths that are laterally adjacent to one another on a same substrate according to the present disclosure. For example, FIGS. 30-34 illustrate alternative embodiments of acts that may be performed on the first device region 502 in the place of the acts at FIGS. 14A-21. Thus, in some embodiments, the second method includes a method that alternatingly proceeds from FIGS. 7-13 to FIG. 30, and then from FIG. 34 to FIGS. 22A-22C to 28A-28B (skipping FIGS. 14A-21).

Figure 30:
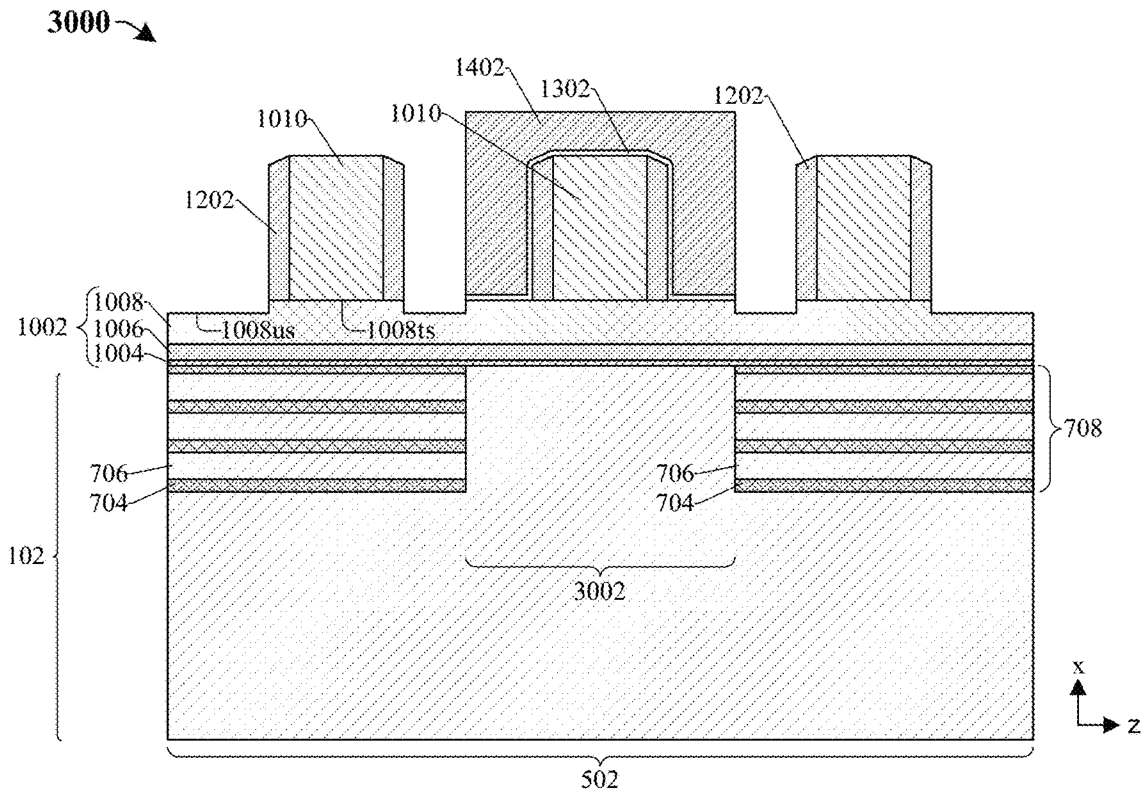
FIGS. 30-34 illustrate a series of cross-sectional views of some alternative embodiments of the method of FIGS. 7 through 28A-28B.

As illustrated by the cross-sectional view 3000 of FIG. 30, a first protection layer 1402 is formed over a middle mandrel structure 1010. In some embodiments, the middle mandrel structure 1010 is spaced laterally within a middle region 3002 of the first device region 502 and is laterally offset from the stack of semiconductor layers 708. After forming the first protection layer 1402, a removal process is performed to remove segments of the dielectric capping layer 1302 from regions laterally offset from the first protection layer 1402. In some embodiments, the removal process includes performing a wet etch process and/or a dry etch process. As illustrated in FIG. 30, the removal process may over-etch and remove portions of the upper masking layer 1008. The portions of the upper masking layer 1008 removed by the patterning process are laterally offset from the first protection layer 1402, such that an upper surface 1008*us* of the upper masking layer 1008 is disposed vertically below a top surface 1008*ts* of the upper masking layer 1008. After performing the removal process, an etching process (e.g., a wet etch and/or a dry etch) may be performed to remove the first protection layer 1402 (not shown).

Figure 31:
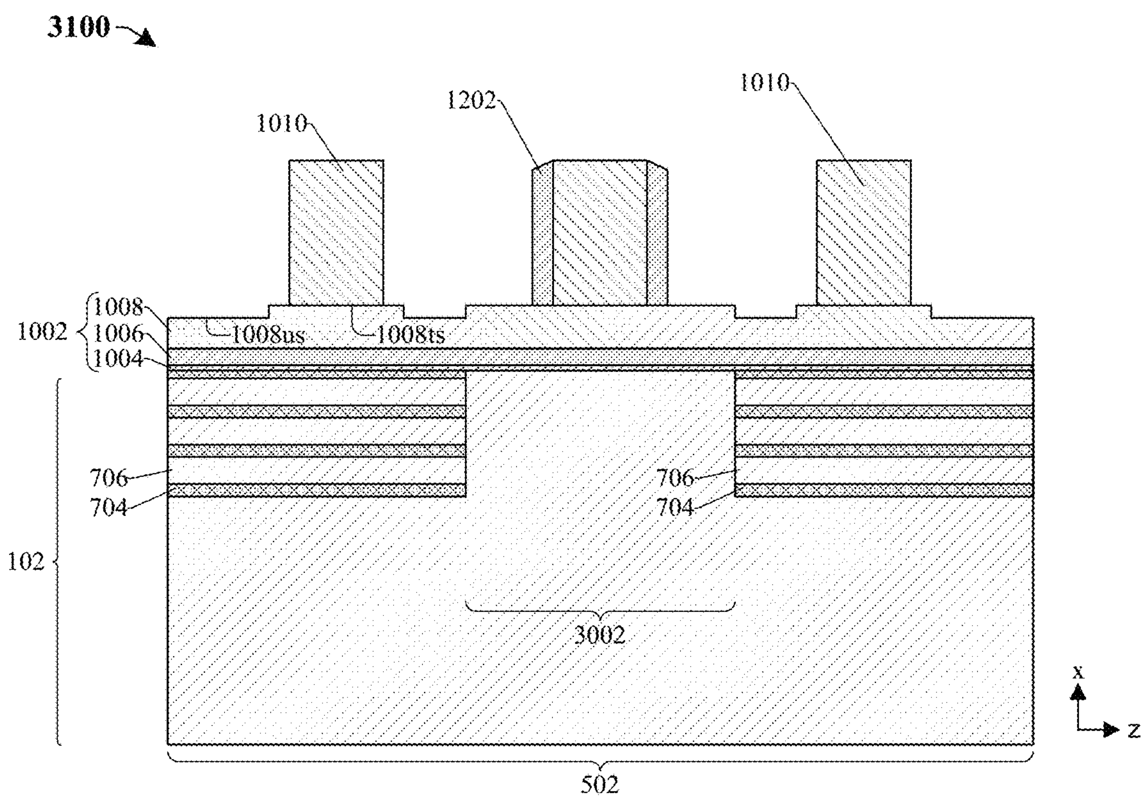

As illustrated by the cross-sectional view 3100 of FIG. 31, a first patterning process is performed to remove the sidewall spacer structures 1202 from around the mandrel structures 1010 in areas laterally offset from the middle region 3002. In some embodiments, the dielectric capping layer (1302 of FIG. 30) acts as masking layer during the first patterning process and is configured to prevent damage to and/or removal of the sidewall spacer structure 1202 in the middle region 3002. Further, after performing the first patterning process, a second patterning process is performed to remove the dielectric capping layer 1302 from the middle region 3002. In further embodiments, the second patterning process may include performing a dry etching process and/or a wet etching process.

Figure 32:
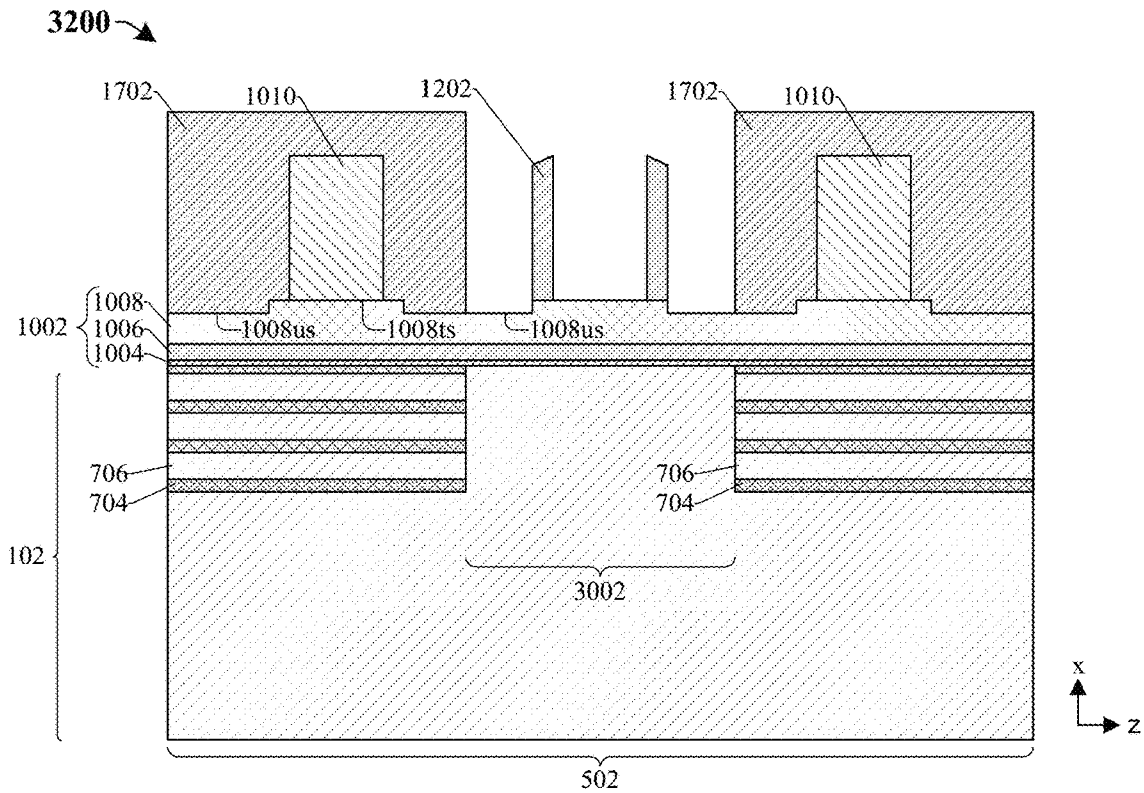

As illustrated by the cross-sectional view 3200 of FIG. 32, second protection layers 1702 are formed over the mandrel structures 1010 that are laterally offset from the middle region 3002. Subsequently, a patterning process is performed to remove the mandrel structure 1010 that is laterally spaced within the middle region 3002, thereby leaving the sidewall spacer structure 1202 in the middle region 3002. The patterning process may include performing a wet etch process and/or a dry etch process. Further, the patterning process may over-etch and remove portions of the upper masking layer 1008 laterally within the middle region 3002, such that an upper surface **1008*us* of the upper masking layer 1008 is disposed vertically below a top surface 1008*ts* of the upper masking layer 1008. After performing the patterning process, an etching process (e.g., a wet etch and/or a dry etch) may be performed to remove the second protection layer 1702** (not shown).

Figure 33:
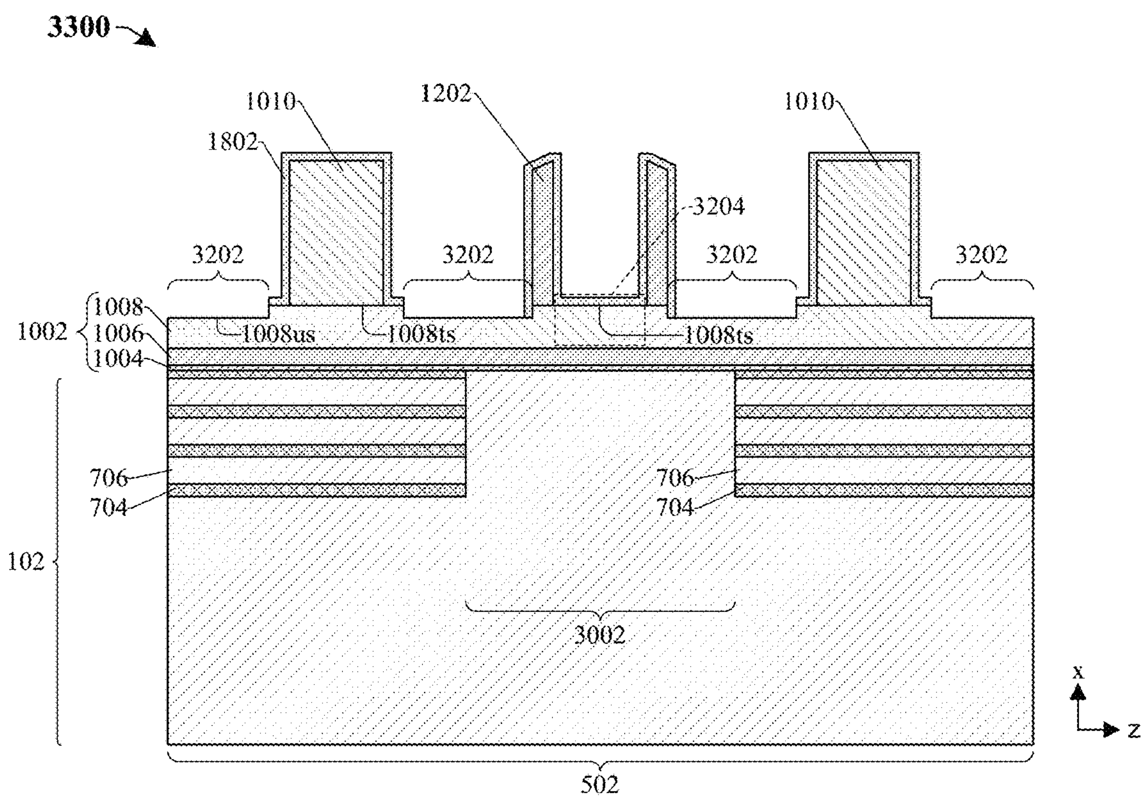

As illustrated by the cross-sectional view 3300 of FIG. 33, an upper dielectric layer 1802 is formed over the mandrel structures 1010 and the sidewall spacer structure 1202. The upper dielectric layer 1802 may, for example, be or comprise silicon nitride, silicon carbide, or another suitable dielectric material. The upper dielectric layer 1802 may, for example, be formed by CVD, PVD, ALD, or another suitable deposition or growth process. In further embodiments, after depositing the upper dielectric layer 1802, an etch process (e.g., a wet etch process and/or a dry etch process) may be performed on the upper dielectric layer 1802 to remove the upper dielectric layer 1802 from regions laterally offset from the mandrel structures 1010 and/or the sidewall spacer structure 1202.

Further, as illustrated in FIG. 33, due to the patterning and/or removal processes of FIGS. 30-32, dielectric material (e.g., silicon dioxide) from the upper masking layer 1008 is removed from the regions 3202, such that the upper surface **1008*us* of the upper masking layer 1008 is disposed below the top surface 1008*ts* of the upper masking layer 1008. Further, dielectric material from the upper masking layer 1008 may not be removed from a center region 3204 between opposing sidewalls of the sidewall spacer structure 1202. In addition, the upper dielectric layer 1802 extends continuously across the center region 3204 between the opposing sidewalls of the sidewall spacer structure 1202**.

Figure 34:
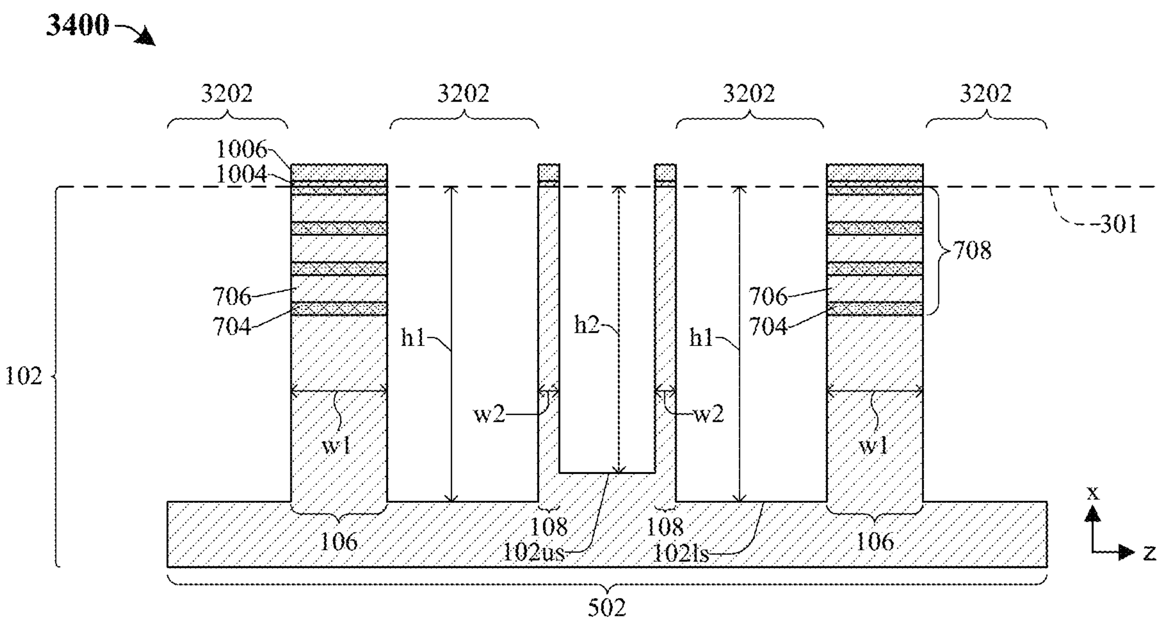

As illustrated by the cross-sectional view 3400 of FIG. 34, a patterning process is performed on the semiconductor substrate 102, thereby defining the first fin structures 106 and the second fin structures 108. The patterning process is performed in such a manner that the first fin structures 106 have a first width w1 and the second fin structures 108 have a second width w2 different from the first width w1. In some embodiments, due to the removal of dielectric material (e.g., silicon dioxide) from the upper masking layer (1008 of FIG. 33) from the regions 3202, the patterning process may over-etch the semiconductor substrate 102 within the regions 3202, such that the semiconductor substrate 102 comprises a lower surface **1021*s* disposed below an upper surface 102*us*. A substantially straight line 301 is disposed along a top surface of the semiconductor substrate 102. Further, a first height h1 of the semiconductor substrate 102 is defined between the substantially straight line 301 and the lower surface 1021*s* of the semiconductor substrate 102. A second height h2 of the semiconductor substrate 102 is defined between the substantially straight line 301 and the upper surface 102*us* of the semiconductor substrate 102. In some embodiments, due to the over-etching, the second height h2 is less than the first height h1. In further embodiments, a difference between the first height h1 and the second height h2 (e.g., h1−h2) may be within a range of about 5 to 30 nanometers. In some embodiments, if the difference between the first height h1 and the second height h2 is relatively high (e.g., greater than about 30 nanometers), then a height of the second fin structures 108 may too small, thereby impeding formation of a selectively-conductive channel in the second fin structures 108**.

FIGS. 35A-35B through 39A-39B illustrated various views of alternative embodiments of acts that may be performed on the first device region 502 to carry out the isolation patterning process illustrated and/or described in FIGS. 22A-22C.

Figure 35A:
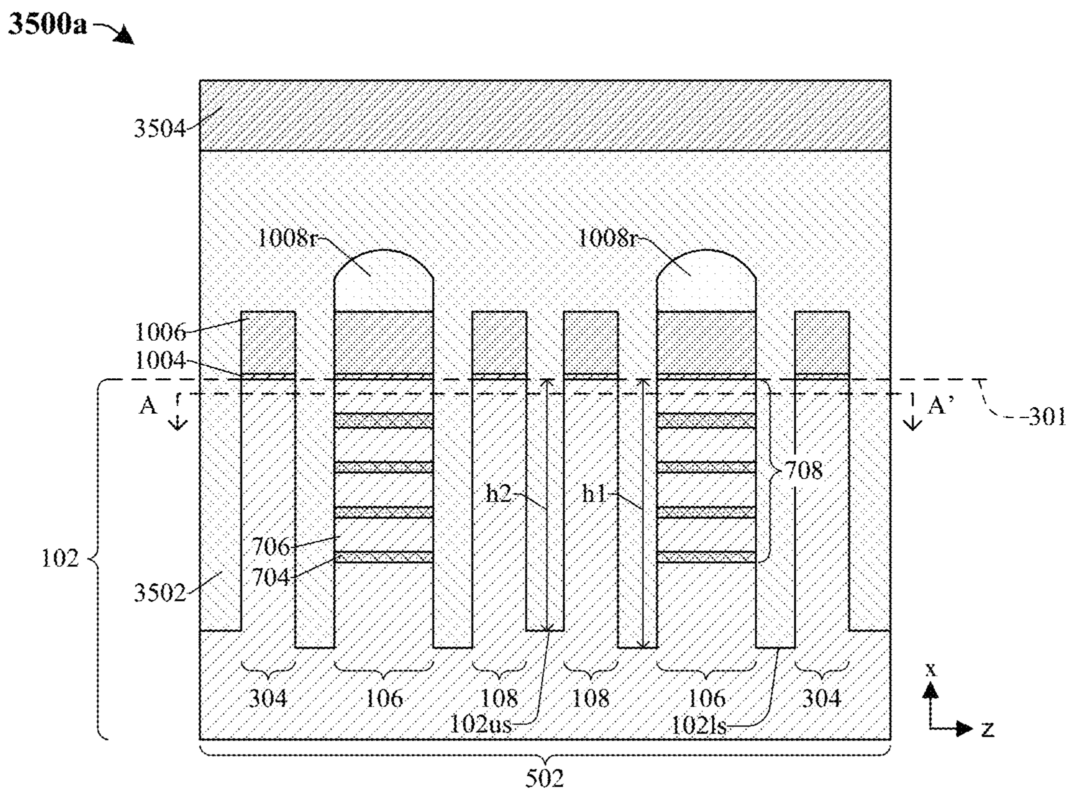
FIGS. 35A-35B through 39A-39B illustrate a series of various views of some alternative embodiments of the method of FIGS. 7 through 28A-28B.
Figure 35B:
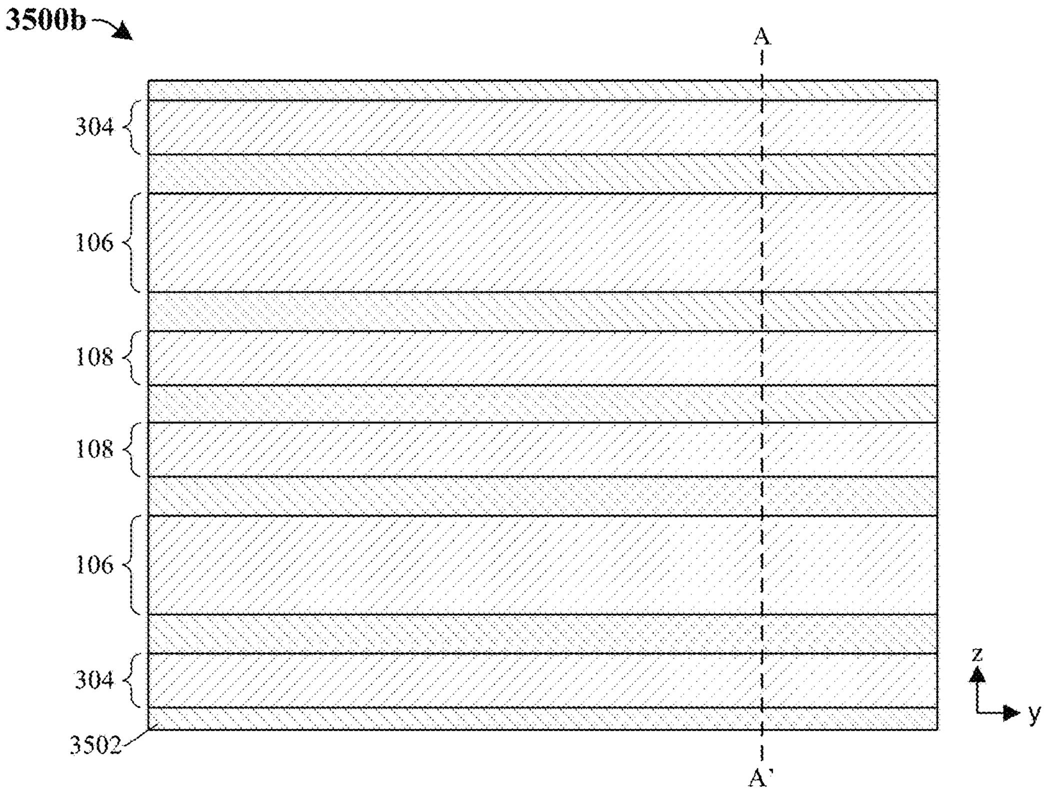

As illustrated in the cross-sectional view **3500*a* of FIG. 35A and the top view 3500*b* of FIG. 35B, the semiconductor substrate 102 comprises the first plurality of fin structures 106, the second plurality of fin structures 108, and the third plurality of fin structures 304. In such embodiments, the third plurality of fin structures 304 are formed in such a manner that they are on opposing sides of the first fin structures 106. In some embodiments, FIG. 35A illustrates the cross-sectional view 3500*a* taken along the line A-A' of the top view 3500*b* of FIG. 35B. In some embodiments, the structure of FIGS. 35A-35B may be formed by the steps illustrated and/or described in FIGS. 7-21, FIGS. 30-34, another suitable method, or any combination of the aforementioned methods. Thus, in some embodiments, one or more patterning processes may be performed on the semiconductor substrate 102 to form the first, second, and third fin structures 106, 108, 304 (e.g., see FIG. 21 and/or FIG. 34). By virtue of the width and/or material composition of the first fin structures 106, remnants 1008*r* of the upper masking layer (1008 of FIG. 33 and/or FIG. 20) may remain over a corresponding first fin structure 106 after performing the one or more patterning processes. In some embodiments, the remnants 1008*r* may result in the semiconductor substrate 102 having the upper surface 102*us* and the lower surface 1021*s* (not shown), such that there is a difference in height between the first height h1 and the second height h2**.

As illustrated in FIGS. 35A-35B, a bottom anti-reflectant coating (BARC) layer 3502 is formed over the semiconductor substrate 102. Further, a masking layer 3504 is formed over the BARC layer 3502. The BARC layer 3502 and/or the masking layer 3504 may be formed, for example, by CVD, PVD, ALD, or another suitable deposition or growth process.

Figure 36:
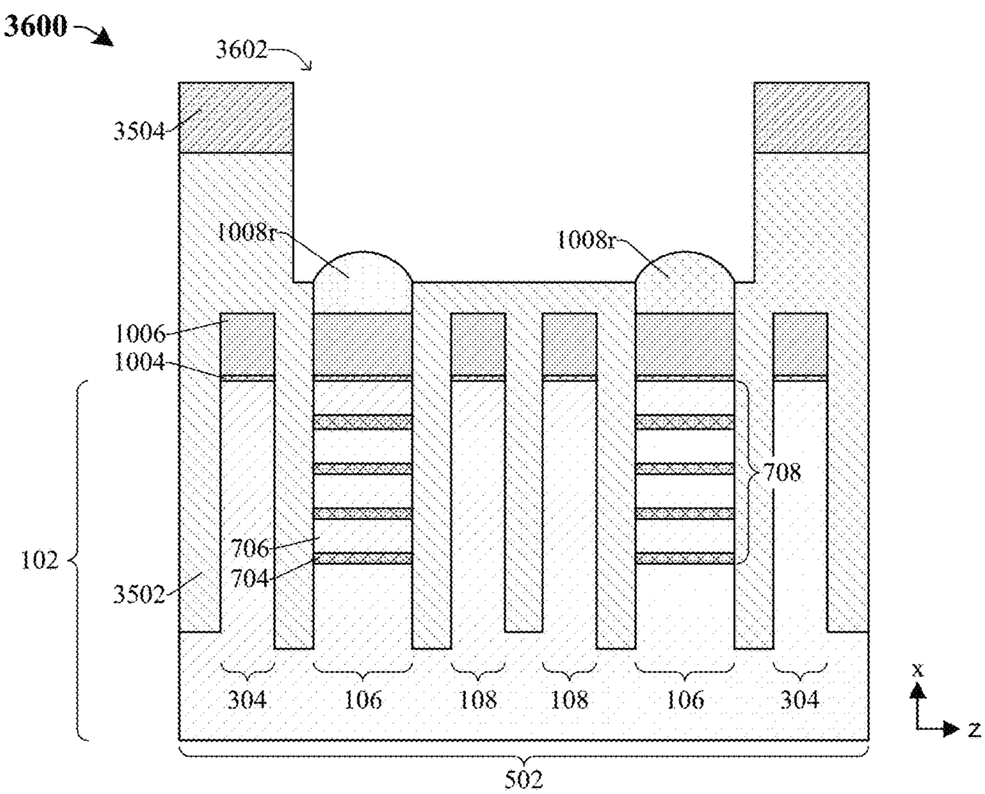

As illustrated in the cross-sectional view 3600 of FIG. 36, a patterning process is performed on the masking layer 3504 and the BARC layer 3502, thereby defining an opening 3602 that exposes the remnants **1008*r***.

Figure 37:
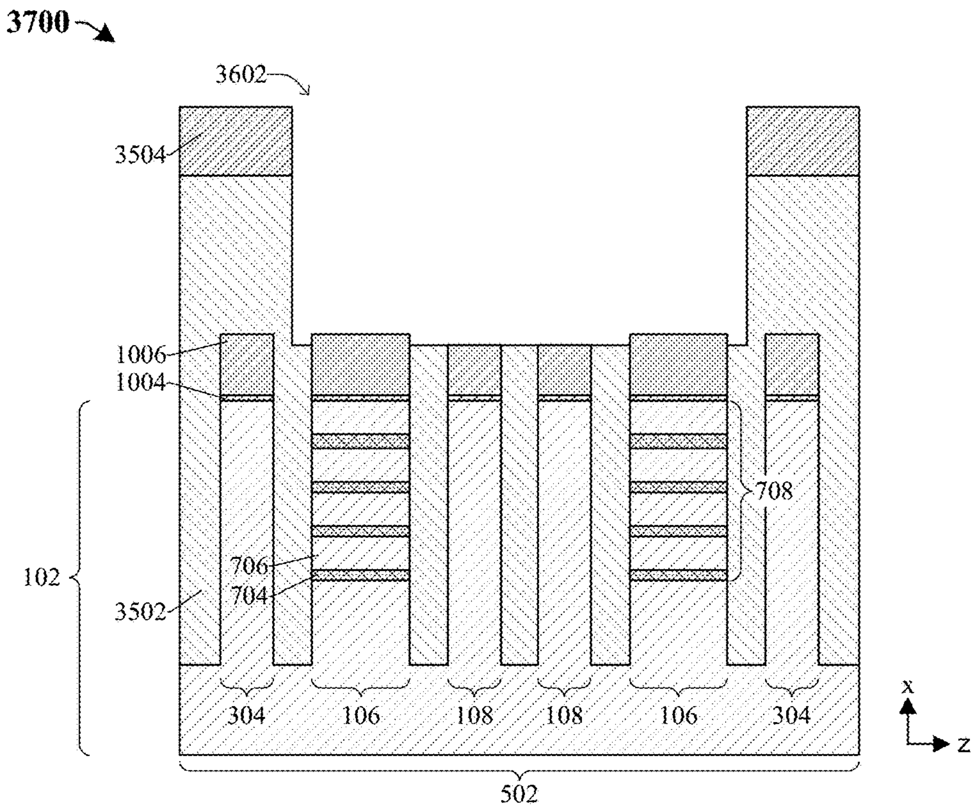

As illustrated in the cross-sectional view 3700 of FIG. 37, a patterning process is performed on the structure of FIG. 36 to remove the remnants (**1008*r* of FIG. 36). In some embodiments, the patterning process may include performing a wet etch process and/or a dry etch process. In further embodiments, the patterning process may expand the opening 3602**.

Figure 38:
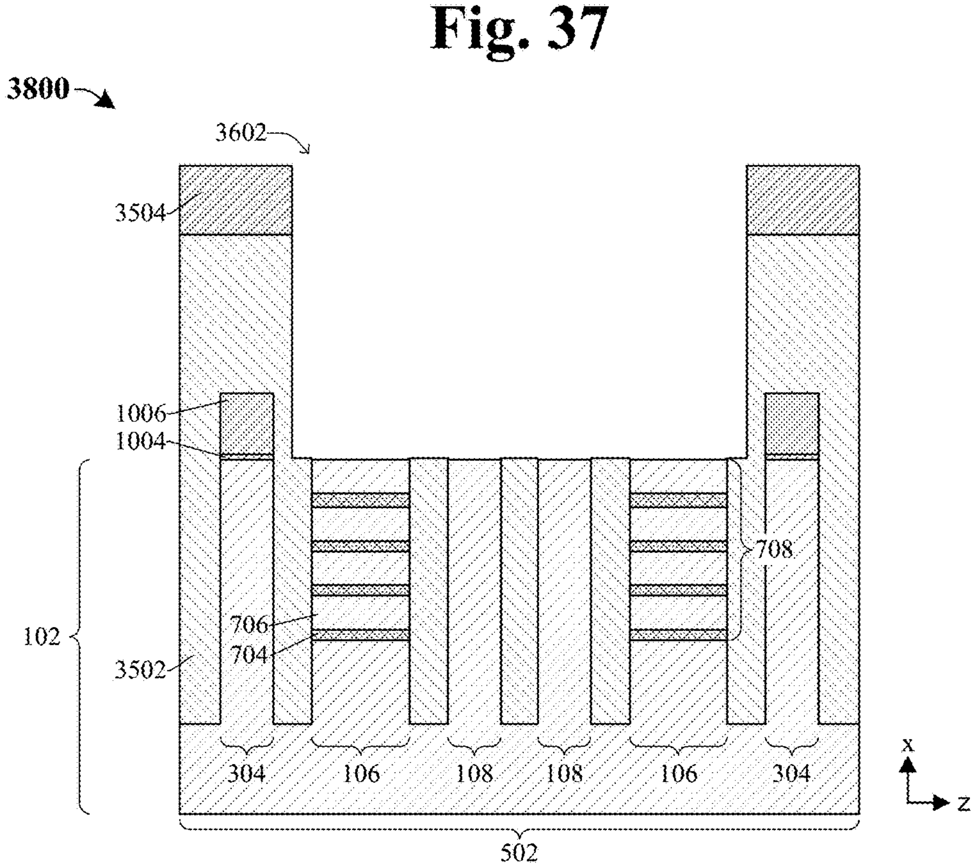

As illustrated in the cross-sectional view 3800 of FIG. 38, a patterning process is performed on the structure of FIG. 37 to remove portions of the middle masking layer 1006 and the lower masking layer from over the first and second fin structures 106, 108. The patterning process may include, for example, performing a wet etch process, a dry etch process, or another suitable etch process.

Figure 39A:
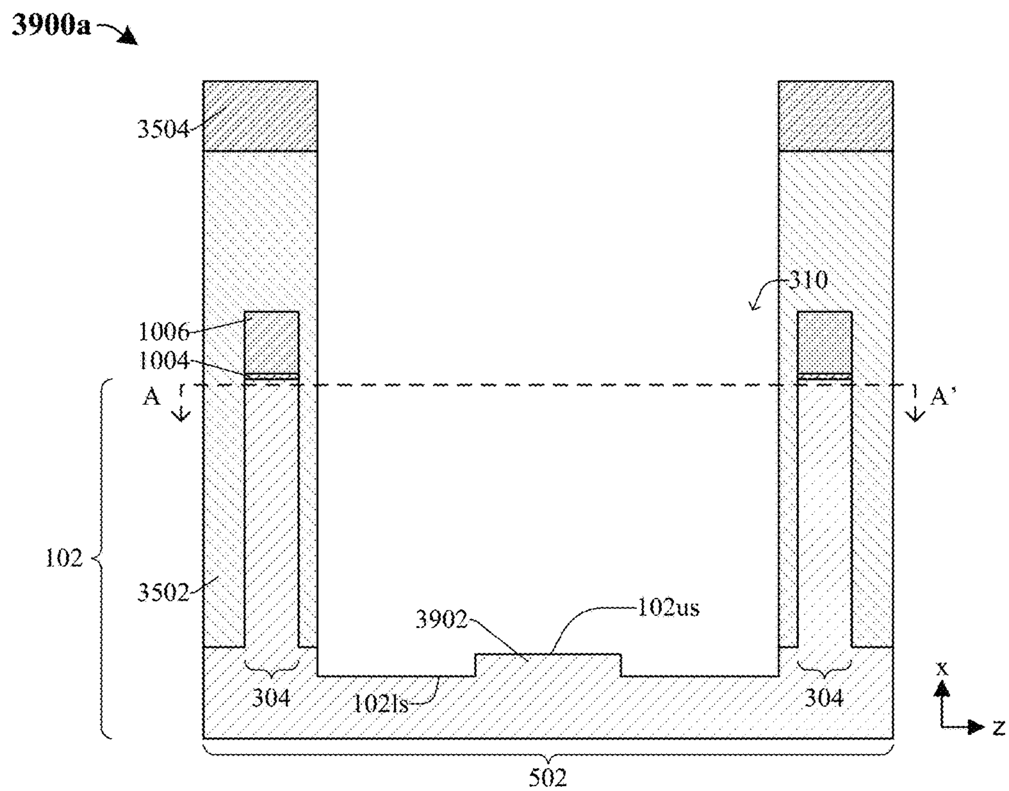
Figure 39B:
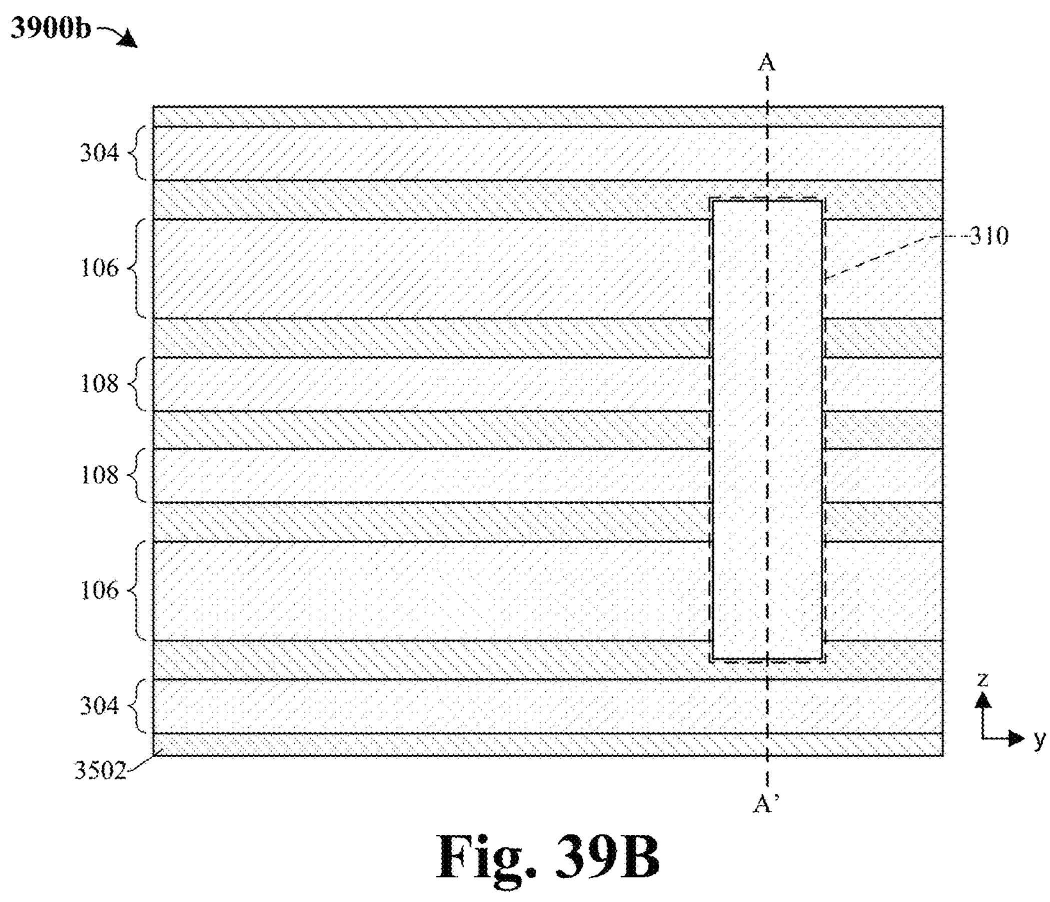

As illustrated in the cross-sectional view 3900*a* of FIG. 39A and the top view 3900*b* of FIG. 39B, an isolation patterning process is performed on the structure of FIG. 38, thereby defining an isolation region 310 (e.g., as illustrated in FIGS. 22A-22C). In some embodiments, FIG. 39A illustrates the cross-sectional view 3900*a* taken along the line A-A' of the top view 3900*b* of FIG. 39B.

In some embodiments, the isolation patterning process may include exposing unmasked regions of the semiconductor substrate 102 to one or more etchants. This, in part, removes the first and second fin structures 106, 108 from the isolation region 310. As illustrated by the cross-sectional view 3900*a* of FIG. 39A, a remnant 3902 of the second fin structures 108 remains within the isolation region 310 after performing the isolation patterning process. In some embodiments, the remnant 3902 remains due to a difference in widths and/or semiconductor materials of the first and second fin structures 106, 108. Further, the isolation patterning process results in the semiconductor substrate 102 having an upper surface 102*us* and a lower surface 1021*s* laterally within the isolation region 310, such that the upper surface 102*us* is vertically offset from the lower surface 1021*s*.

Accordingly, in some embodiments, the present disclosure provides an integrated chip (IC) having a first fin structure with a first width laterally adjacent to a second fin structure with a second width that is less than the first width.

In some embodiments, the present application provides an integrated chip (IC) including: a first fin structure vertically extending from a semiconductor substrate, wherein the first fin structure laterally extends along a first direction and has a first width; a second fin structure vertically extending from the semiconductor substrate, wherein the second fin structure laterally extends along the first direction and has a second width that is less than the first width; a first plurality of nanostructures directly overlying the first fin structure and vertically spaced from the first fin structure by a non-zero distance; and a gate electrode continuously laterally extending along a second direction that is substantially perpendicular to the first direction, wherein the gate electrode directly overlies the first and second fin structures, and wraps around the nanostructures.

In some embodiments, the present application provides an integrated chip (IC) an integrated chip (IC) including: an isolation structure overlying a semiconductor substrate; a plurality of first fin structures extending vertically from the semiconductor substrate through the isolation structure; wherein the first fin structures respectively have a first width; a plurality of second fin structures extending vertically from the semiconductor substrate through the isolation structure, wherein the second fin structures respectively have a second width and are spaced laterally between the plurality of first fin structures, wherein the second width is less than the first width; a first plurality of nanosheet field-effect transistors (NSFETs) overlying the semiconductor substrate, wherein NSFETs in the first plurality of NSFETs respectively include: a pair of first source/drain regions disposed over a corresponding first fin structure; a first plurality of nanostructures directly overlying the corresponding first fin structure, wherein the first plurality of nanostructures extend laterally between the pair of first source/drain regions, wherein the first plurality of nanostructures have the first width; and a first plurality of fin field-effect transistors (finFETs) overlying the semiconductor substrate, wherein finFETs in the first plurality of finFETs respectively include: a pair of second source/drain regions disposed over a corresponding second fin structure; and an upper portion of the corresponding second fin structure that extends laterally between the pair of second source/drain regions.

In some embodiments, the present application provides a method for forming an integrated chip (IC), the method including: forming a stack of semiconductor layers over a semiconductor substrate, wherein the stack of semiconductor layers comprise a plurality of first semiconductor layers and a plurality of second semiconductor layers; forming a masking structure over the stack of semiconductor layers and the semiconductor substrate, wherein the masking structure comprises a plurality of masking layers; forming a plurality of mandrel structures over the masking structure, wherein the plurality of mandrel structures includes a first mandrel structure that overlies the stack of semiconductor layers and a second mandrel structure that is laterally offset from the stack of semiconductor layers by a non-zero distance; forming a first sidewall spacer structure along opposing sidewalls of the first mandrel structure and a second sidewall spacer structure along opposing sidewalls of the second mandrel structure; forming a first protection layer over the second mandrel structure; performing a first patterning process according to the first protection layer to remove the first sidewall spacer; forming a second protection layer over the first mandrel structure; performing a second patterning process according to the second protection layer to remove the second mandrel structure; performing a third patterning process according to the first mandrel structure and the second sidewall spacer to remove portions of the masking structure, thereby defining a first stack of masking layers over the stack of semiconductor layers with a first width and a second stack of masking layers laterally offset from the stack of semiconductor layers with a second width less than the first width; and performing a third patterning process on the semiconductor substrate and the stack of semiconductor layers according to the first and second stack of masking layers, thereby defining a first fin structure laterally adjacent to a second fin structure, wherein the first fin structure has the first width and the second fin structure has the second width, and wherein the stack of semiconductor layers directly overlie the first fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip (IC) comprising:

a first fin structure vertically extending from a semiconductor substrate, wherein the first fin structure laterally extends along a first direction and has a first width;

a second fin structure vertically extending from the semiconductor substrate, wherein the second fin structure laterally extends along the first direction and has a second width that is less than the first width;

a first plurality of nanostructures directly overlying the first fin structure and vertically spaced from the first fin structure by a non-zero distance;

a gate electrode continuously laterally extending along a second direction that is substantially perpendicular to the first direction, wherein the gate electrode directly overlies the first and second fin structures, and wraps around the nanostructures; and wherein the semiconductor substrate comprises an upper surface and a lower surface vertically below the upper surface, wherein the lower surface contacts opposing sidewalls of the first fin structure, and wherein the lower surface contacts a first sidewall of the second fin structure and the upper surface contacts a second sidewall of the second fin structure.

2. The IC of claim 1, wherein a top surface of the second fin structure is aligned with a top surface of the first plurality of nanostructures.

3. The IC of claim 1, wherein the nanostructures respectively have the first width.

4. The IC of claim 1, wherein a top surface of the first fin structure is disposed below a top surface of the second fin structure.

5. The IC of claim 1, further comprising:

a third fin structure vertically extending from the semiconductor substrate and laterally adjacent to the first and second fin structures, wherein the third fin structure laterally extends along the first direction and has a third width that is less than the second width.

6. The IC of claim 5, wherein the first and second fin structures are respectively discontinuous along an isolation region such that the first and second fin structures are laterally offset from the isolation region, wherein the third fin structure continuously laterally extends across the isolation region.

7. The IC of claim 5, wherein a first height of the nanostructures and the first fin structure is defined between the lower surface of the semiconductor substrate and a substantially straight line, wherein the second and third fin structures respectively comprise a second height that is defined between the upper surface of the semiconductor substrate and the substantially straight line, wherein a top surface of the nanostructures, a top surface of the second fin structure, and a top surface of the third fin structure are respectively aligned with the substantially straight line, wherein the second height is less than the first height.

8. The IC of claim 5, further comprising:

a fourth fin structure vertically extending from the semiconductor substrate and laterally extending along the first direction, wherein the fourth fin structure comprises a fourth width that is greater than the first width; and a second plurality of nanostructures directly overlying the fourth fin structure, wherein the second plurality of nanostructures have the fourth width.

9. The IC of claim 8, wherein the first width of the first fin structure may discretely decrease along the first direction.

10. The IC of claim 1, wherein a height of the first sidewall is greater than a height of the second sidewall.

11. An integrated chip (IC) comprising:

a first fin structure vertically extending from a semiconductor substrate;

a second fin structure vertically extending from the semiconductor substrate, wherein the first fin structure and the second fin structure extend laterally in a first direction and are parallel to one another;

a plurality of nanostructures overlying the first fin structure, wherein a width of the plurality of nanostructures is greater than a width of the second fin structure;

a gate electrode continuously extending from the first fin structure to the second fin structure; and a gate dielectric layer disposed between the gate electrode and the first and second fin structures, wherein the gate dielectric layer extends from a top surface of the first fin structure to a top surface of the second fin structure, wherein the gate dielectric layer wraps around the plurality of nanostructures.

12. The IC of claim 11, wherein the gate dielectric layer continuously extends from opposing sidewalls of the first fin structure to opposing sidewalls of the second fin structure.

13. The IC of claim 11, wherein the gate dielectric layer is disposed directly between the top surface of the first fin structure and a bottom surface of the plurality of nanostructures.

14. The IC of claim 11, wherein a height of the first fin structure is less than a height of the second fin structure.

15. The IC of claim 11, wherein outer sidewalls of the first fin structure are aligned with outer sidewalls of the plurality of nanostructures.

16. The IC of claim 11, wherein the semiconductor substrate comprises an upper surface and a lower surface vertically below the upper surface, wherein the lower surface is adjacent to the first fin structure and the upper surface is adjacent to the second fin structure.

17. An integrated chip (IC) comprising:

an isolation structure overlying a semiconductor substrate;

a first fin structure vertically extending from the semiconductor substrate through the isolation structure;

a second fin structure vertically extending from the semiconductor substrate through the isolation structure;

a third fin structure vertically extending from the semiconductor substrate through the isolation structure, wherein the second fin structure is spaced laterally between the first fin structure and the third fin structure;

a first plurality of nanostructures overlying the first fin structure;

a second plurality of nanostructures overlying the third fin structure, wherein a top surface of the second fin structure is vertically above a bottom surface of the second plurality of nanostructures; and a gate electrode continuously extending from the first fin structure to the third fin structure, wherein the gate electrode is disposed between adjacent nanostructures in the first and second plurality of nanostructures.

18. The IC of claim 17, wherein the gate electrode continuously extends along outer sidewalls of the second fin structure and directly overlies the top surface of the second fin structure.

19. The IC of claim 17, further comprising:

a gate dielectric layer disposed between the gate electrode and the semiconductor substrate, wherein the gate dielectric layer extends from a sidewall of the first fin structure, across a top surface of the isolation structure, to a sidewall of the second fin structure.

20. The IC of claim 17, wherein the first fin structure and the third fin structure have a first width that is greater than a second width of the second fin structure.

* * * * *